US012677523B2

(12) United States Patent
Kubota et al.

(10) Patent No.: US 12,677,523 B2
(45) Date of Patent: Jul. 7, 2026

(54) METHOD FOR MANUFACTURING DISPLAY APPARATUS

(71) Applicant: SEMICONDUCTOR ENERGY LABORATORY CO., LTD., Atsugi (JP)

(72) Inventors: Daisuke Kubota, Atsugi (JP); Ryo Hatsumi, Hadano (JP); Yasuhiro Niikura, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 390 days.

(21) Appl. No.: 18/263,908

(22) PCT Filed: Jan. 25, 2022

(86) PCT No.: PCT/IB2022/050610
§ 371 (c)(1),
(2) Date: Aug. 2, 2023

(87) PCT Pub. No.: WO2022/167892
PCT Pub. Date: Aug. 11, 2022

(65) Prior Publication Data
US 2024/0114720 A1 Apr. 4, 2024

(30) Foreign Application Priority Data
Feb. 5, 2021 (JP) ................................. 2021-017133

(51) Int. Cl.
*H10K 39/34* (2026.01)
*H10K 50/10* (2023.01)
(Continued)

(52) U.S. Cl.
CPC ......... *H10K 39/34* (2023.02); *H10K 59/1201* (2023.02); *H10K 71/231* (2023.02);
(Continued)

(58) Field of Classification Search
CPC .. H10K 39/34; H10K 59/1201; H10K 71/231; H10K 50/10; H10K 59/65;
(Continued)

(56) References Cited

U.S. PATENT DOCUMENTS

| | | | |
|---|---|---|---|
| 5,953,985 | A | 9/1999 | Kobayashi |
| 6,120,338 | A | 9/2000 | Hirano. et al. |

(Continued)

FOREIGN PATENT DOCUMENTS

| | | |
|---|---|---|
| CN | 001653855 A | 8/2005 |
| CN | 102760698 A | 10/2012 |

(Continued)

OTHER PUBLICATIONS

Zakhidov.A et al., "Orthogonal processing: A new strategy for organic electronics", Chem. Sci. (Chemical Science), Apr. 7, 2011, vol. 2, No. 6, pp. 1178-1182.

(Continued)

*Primary Examiner* — Joe E. Schoenholtz
(74) *Attorney, Agent, or Firm* — Fish & Richardson P.C.

(57) ABSTRACT

A method of manufacturing a high-resolution display apparatus having a light sensing function is provided. The method for manufacturing a display apparatus includes: a first step of forming a first pixel electrode and a second pixel electrode; a second step of depositing a light-emitting and light-receiving film over the first pixel electrode and the second pixel electrode; a third step of depositing a first sacrificial film covering the light-emitting and light-receiving film; a fourth step of etching the first sacrificial film and the light-emitting and light-receiving film to form a light-emitting and light-receiving layer and a first sacrificial layer over the light-emitting and light-receiving layer and to expose the second pixel electrode; a fifth step of depositing an EL film over the first sacrificial layer and over the second (Continued)

pixel electrode; a sixth step of depositing a second sacrificial film covering the EL film; a seventh step of etching the second sacrificial film and the EL film to form an EL layer and a second sacrificial layer over the EL layer; an eighth step of removing the first sacrificial layer and the second sacrificial layer and exposing the light-emitting and light-receiving layer and the EL layer; and a ninth step of forming a common electrode covering the light-emitting and light-receiving layer and the EL layer.

10 Claims, 39 Drawing Sheets

(51) Int. Cl.

| | | |
|---|---|---|
| *H10K 59/12* | (2023.01) | |
| *H10K 59/65* | (2023.01) | |
| *H10K 59/80* | (2023.01) | |
| *H10K 71/20* | (2023.01) | |

(52) U.S. Cl.
CPC .............. *H10K 50/10* (2023.02); *H10K 59/65* (2023.02); *H10K 59/871* (2023.02); *H10K 59/8722* (2023.02); *H10K 59/873* (2023.02)

(58) Field of Classification Search
CPC .............. H10K 59/871; H10K 59/8722; H10K 59/873; H10K 59/351; H10K 59/35; H10K 71/10; H10K 71/60; H10K 50/15; H10K 50/16; H10K 50/17; H10K 59/8051; H10K 59/8052; H10K 65/00; H05B 33/12; H05B 33/10; G09F 9/30
See application file for complete search history.

(56) References Cited

U.S. PATENT DOCUMENTS

| | | | |
|---|---|---|---|
| 7,399,991 B2 | 7/2008 | Seo et al. | |
| 7,534,557 B2 | 5/2009 | Tachikawa et al. | |
| 7,914,976 B2 | 3/2011 | Tachikawa et al. | |
| 9,088,006 B2 | 7/2015 | Yamazaki et al. | |
| 9,219,253 B2 | 12/2015 | Izumi et al. | |
| 9,627,648 B2 | 4/2017 | Yamazaki et al. | |
| 10,003,047 B2 | 6/2018 | Yamazaki et al. | |
| 10,096,776 B2* | 10/2018 | Malinowski ......... | H10K 71/233 |
| 10,381,599 B2 | 8/2019 | Yamazaki et al. | |
| 10,903,453 B2 | 1/2021 | Yamazaki et al. | |
| 11,621,407 B2 | 4/2023 | Yamazaki et al. | |
| 2002/0072139 A1 | 6/2002 | Kashiwabara | |
| 2005/0153058 A1 | 7/2005 | Tachikawa et al. | |
| 2009/0191486 A1* | 7/2009 | Tachikawa ........... | H10K 71/233 |
| | | | 430/313 |
| 2011/0148290 A1 | 6/2011 | Oota | |
| 2012/0105341 A1 | 5/2012 | Park et al. | |
| 2012/0256204 A1 | 10/2012 | Yoshizumi et al. | |
| 2012/0273804 A1 | 11/2012 | Hatano | |
| 2012/0276484 A1 | 11/2012 | Izumi et al. | |
| 2013/0084531 A1* | 4/2013 | Hamaguchi .......... | H10K 71/233 |
| | | | 430/319 |
| 2013/0084664 A1* | 4/2013 | Yoshitoku .............. | H10K 59/35 |
| | | | 257/E51.026 |
| 2013/0084666 A1 | 4/2013 | Oshige | |
| 2013/0280839 A1 | 10/2013 | Sonoda et al. | |
| 2013/0295705 A1 | 11/2013 | Sonoda et al. | |
| 2013/0299789 A1 | 11/2013 | Yamazaki et al. | |
| 2014/0004640 A1* | 1/2014 | Hamaguchi ............ | H10K 71/40 |
| | | | 438/34 |
| 2014/0004642 A1 | 1/2014 | Otsuka et al. | |
| 2014/0056493 A1 | 2/2014 | Gozzini | |
| 2015/0060826 A1 | 3/2015 | Matsumoto et al. | |
| 2015/0069360 A1 | 3/2015 | Sato | |
| 2015/0076476 A1 | 3/2015 | Odaka et al. | |
| 2016/0172595 A1 | 6/2016 | Malinowski et al. | |
| 2016/0315133 A1 | 10/2016 | Sato | |
| 2017/0141167 A1 | 5/2017 | Naganuma | |
| 2017/0256754 A1 | 9/2017 | Defranco et al. | |
| 2018/0190908 A1 | 7/2018 | Ke et al. | |
| 2019/0280058 A1 | 9/2019 | Li | |
| 2020/0203662 A1 | 6/2020 | Mollard et al. | |
| 2020/0387686 A1 | 12/2020 | Jhang et al. | |
| 2021/0151714 A1* | 5/2021 | Haas ..................... | H10K 59/122 |
| 2021/0257420 A1 | 8/2021 | Park et al. | |
| 2022/0075979 A1* | 3/2022 | Han ..................... | G09G 3/3275 |
| 2022/0278177 A1 | 9/2022 | Kubota et al. | |

FOREIGN PATENT DOCUMENTS

| | | |
|---|---|---|
| JP | 2000-036385 A | 2/2000 |
| JP | 2003-059663 A | 2/2003 |
| JP | 2003-332051 A | 11/2003 |
| JP | 2008-098106 A | 4/2008 |
| JP | 2008-147072 A | 6/2008 |
| JP | 2008-251270 A | 10/2008 |
| JP | 2012-238580 A | 12/2012 |
| JP | 2014-120218 A | 6/2014 |
| JP | 2014-135251 A | 7/2014 |
| JP | 2014-197522 A | 10/2014 |
| JP | 2014-232568 A | 12/2014 |
| JP | 2015-115178 A | 6/2015 |
| JP | 2016-197494 A | 11/2016 |
| JP | 2019-179696 A | 10/2019 |
| JP | 2020-160305 A | 10/2020 |
| KR | 10-0931279 | 12/2009 |
| KR | 2013-0125715 A | 11/2013 |
| WO | WO-2003/096754 | 11/2003 |
| WO | WO-2021/009621 | 1/2021 |
| WO | WO-2022/153145 | 7/2022 |

OTHER PUBLICATIONS

Malinowski.P et al., "High resolution photolithography for direct view active matrix organic light-emitting diode augmented reality displays", J. Soc. Inf. Display (Journal of the Society for Information Display), Apr. 2, 2018, vol. 26, No. 3, pp. 128-136.

Malinowski.P et al., "Photolithographic patterning of organic photodetectors with a non-fluorinated photoresist system", Organic Electronics, Jul. 12, 2014, vol. 15, No. 10, pp. 2355-2359.

Malinowski.P et al., "Multicolor 1250 ppi OLED Arrays Patterned by Photolithography", SID Digest '16 : SID International Symposium Digest of Technical Papers, May 22, 2016, vol. 47, No. 1, pp. 1009-1012.

Papadopoulos. N et al., "AMOLED Displays with In-Pixel Photodetector", Liquid Crystals and Display Technology, Jul. 9, 2020, pp. 1-19.

Ke.T et al., "Technology Developments in High-Resolution FMM-free OLED and Beol Igzo TFTs for Power-Efficient Microdisplays", SID Digest '21 : SID International Symposium Digest of Technical Papers, May 1, 2021, vol. 52, No. 1, pp. 127-130.

Malinowski.P et al., "Integration of additional functionalities into the frontplane of AMOLED displays", SID Digest '20 : SID International Symposium Digest of Technical Papers, Aug. 1, 2020, vol. 51, No. 1, pp. 646-649.

Malinowski.P et al., "Organic photolithography for displays with integrated fingerprint scanner", SID Digest '19 : SID International Symposium Digest of Technical Papers, May 29, 2019, vol. 50, No. 1, pp. 1007-1010.

Ke.T et al., "Island and Hole Fabrication on OLED Stack for High-Resolution Sensor in Display Application", IDW '20 : Proceedings of the 27TH International Display Workshops, Dec. 9, 2020, vol. 27, pp. 902-905.

Gather.M et al., "Solution-Processed Full-Color Polymer-OLED Displays Fabricated by Direct Photolithography", SID Digest '06 : SID International Symposium Digest of Technical Papers, Jun. 1, 2006, vol. 37, No. 1, pp. 909-911.

Malinowski.P et al., "Photolithography as Enabler of AMOLED Displays Beyond 1000 ppi", SID Digest '17 : SID International Symposium Digest of Technical Papers, May 1, 2017, vol. 48, No. 1, pp. 623-626.

(56)     References Cited

OTHER PUBLICATIONS

International Search Report (Application No. PCT/IB2022/050610)
Dated Apr. 19, 2022.
Written Opinion (Application No. PCT/IB2022/050610) Dated Apr.
19, 2022.

* cited by examiner

FIG. 1A
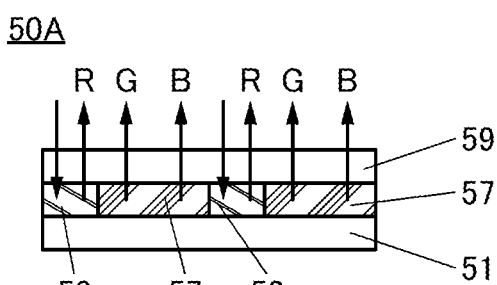
FIG. 1B
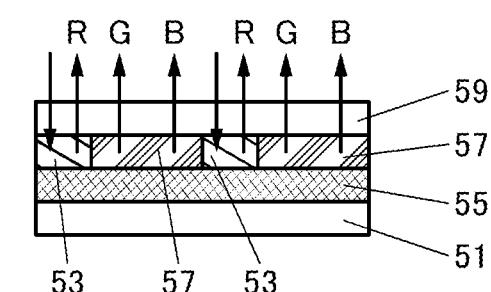
FIG. 1C
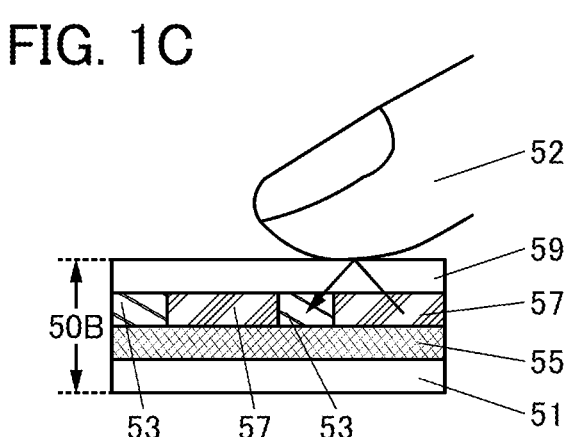
FIG. 1D
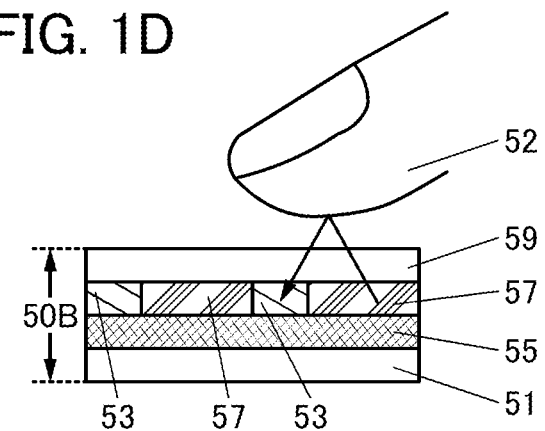
FIG. 1E
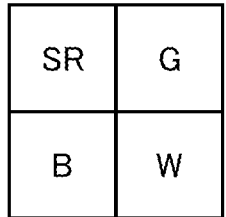
FIG. 1F
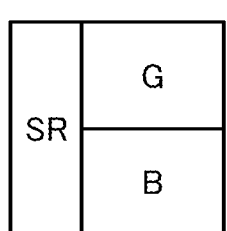
FIG. 1G
FIG. 1H
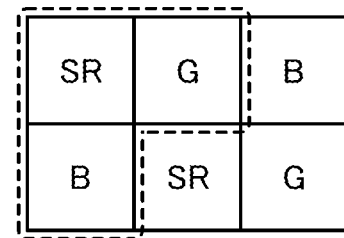

100

130

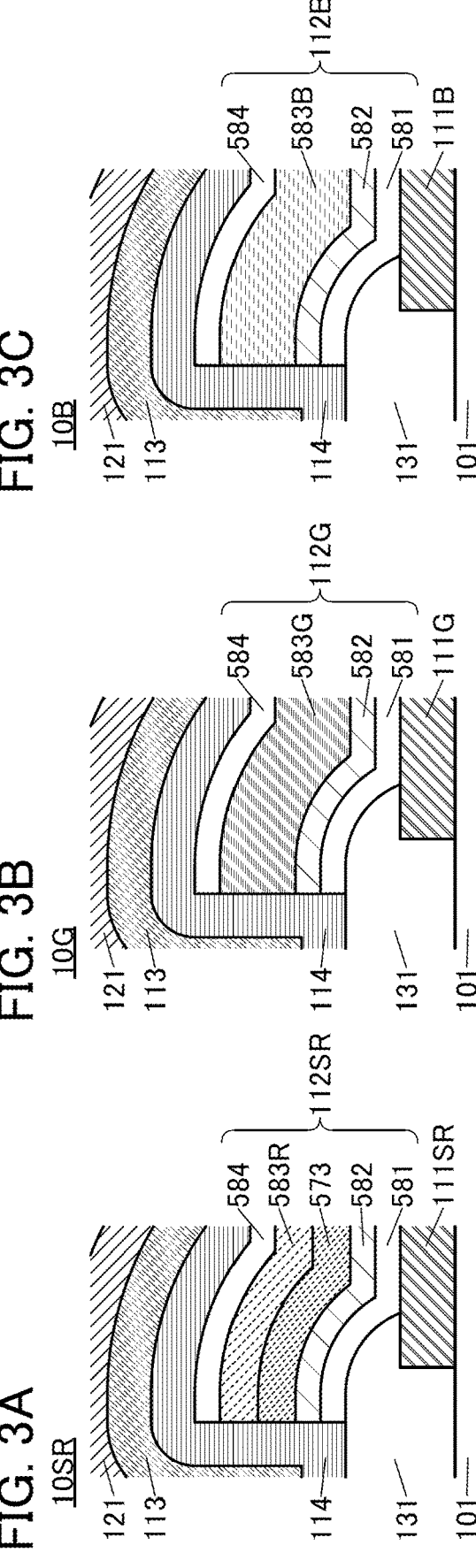

<u>100</u>

A1

110SR    112SR    110G    112G    110B    112B
　　111SR　　　　　111G　　　　　111B 121
113
114
131
101

A2

<u>100</u>

A1

110SR    112SR    110G    112G    110B    112B
　　111SR　　　　　111G　　　　　111B 121
113
114
131
101

A2

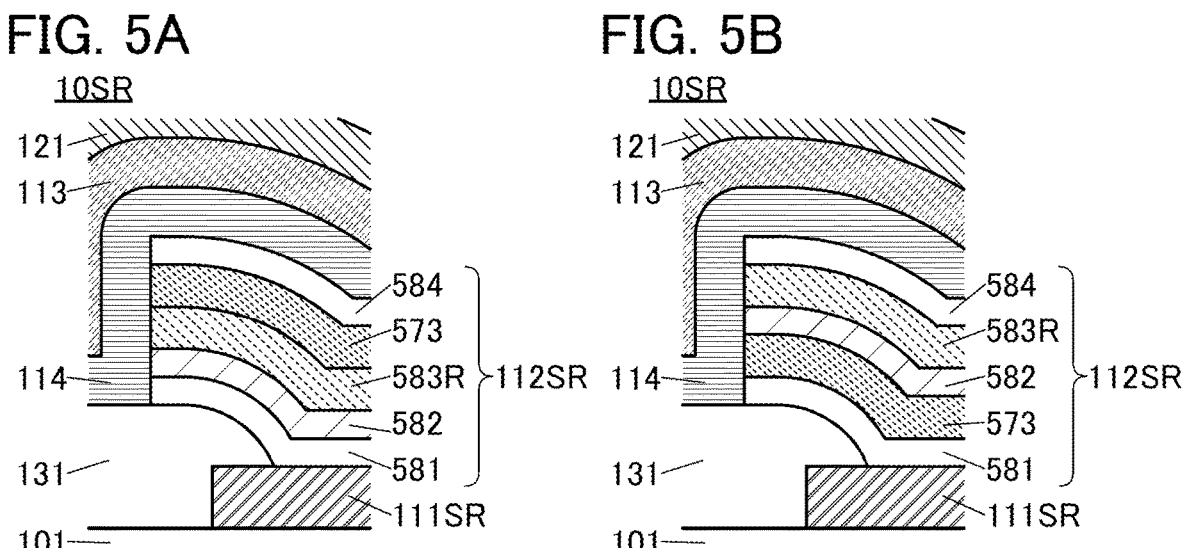
FIG. 5A        FIG. 5B
FIG. 5C        FIG. 5D
FIG. 5E
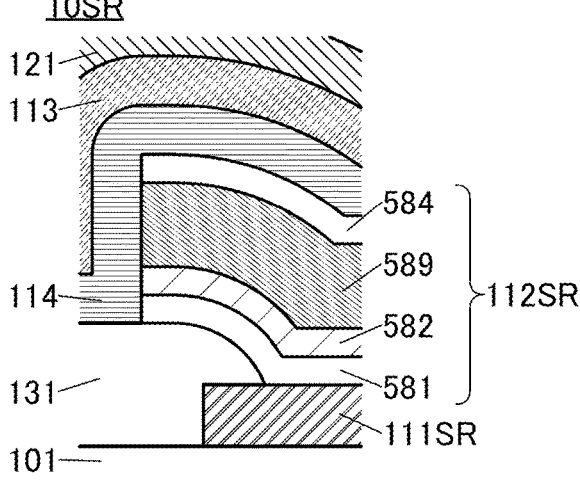

143b 101 145a 111SR 112SR 112Gf 111G 144b 146b 111B 131 111C 145a 143b 147b 101 145a 111SR 112SR 112Gf 111G 144b 111B 131 111C 145a 101 145a 111SR 112SR 112G 111G 145b 111B 131 111C 145a 145b 145a 145b 145c 145c 101 111SR 112SR 112G 111G 112B 111B 131 111C 145a 145b 101 111SR 112SR 112G 111G 112B 111B 131 111C

110SR 110G 110B 130

101 111SR 112SR 113 112G 111G 131 114 112B 111B 131 111C 101    111SR  112SR  112G  111G    112B  111B      131    111C

110SR          110G          110B          130

101  111SR      113    112G 111G 131 114 112B  111B 131 114    111C
    112SR

110SR          110G          110B          130

101  111SR    113 121  112G 111G 131 114 112B  111B 131 114    111C
    112SR

FIG. 15A
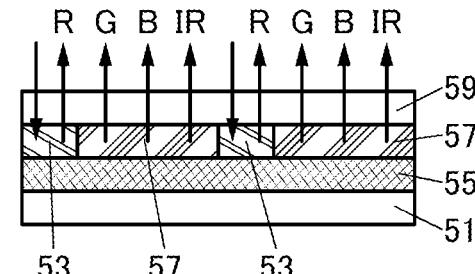
FIG. 15B
FIG. 15C
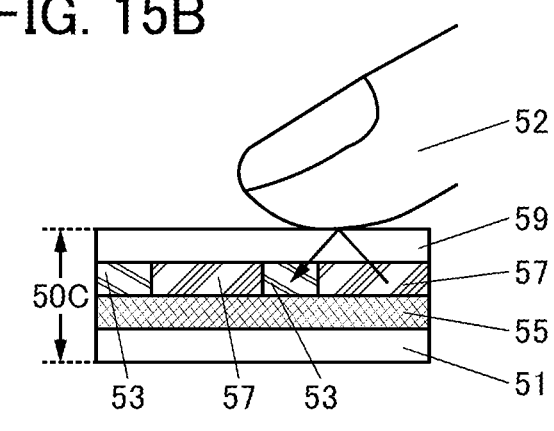
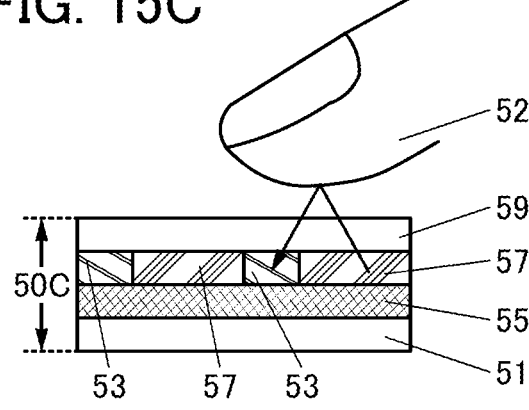
FIG. 15D
FIG. 15E
FIG. 15F
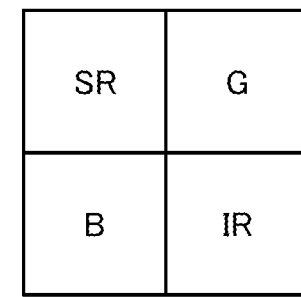
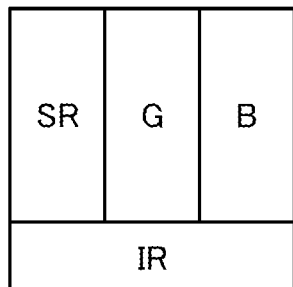

102

A5 B1          A6 110SR 110G 110B 110IR          C1          C2

| SR | G | B | IR | SR | G | B | IR |

| SR | G | B | IR | SR | G | B | IR |

111C

113

B2

Y
X

110SR          110G          110B          10IR 110IR

A5                                                                          A6
101 111SR   113 121   112G 111G   131 114 112B 111B   112IR 111IR
   112SR

10IR 121
113

584
583IR    112IR
582
581

114
131
101

111IR

102

A5   110SR/112SR   110G / 112G   131 110B / 112B   110IR / 112IR 101   A6
     111SR         111G         111B              111IR

102

A5   110SR | 112SR   110G / 112G 131 110B / 112B   110IR / 112IR 101   A6
     111SR           111G            111B                111IR

FIG. 18A
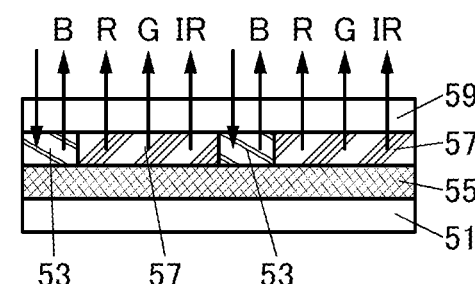
FIG. 18B      FIG. 18C      FIG. 18D
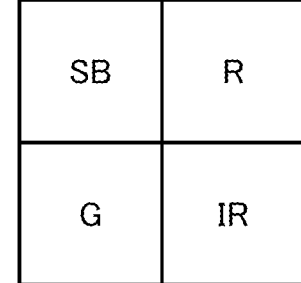
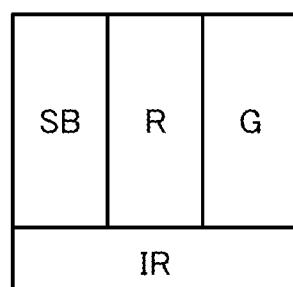

50D

50D

FIG. 21A
10SB
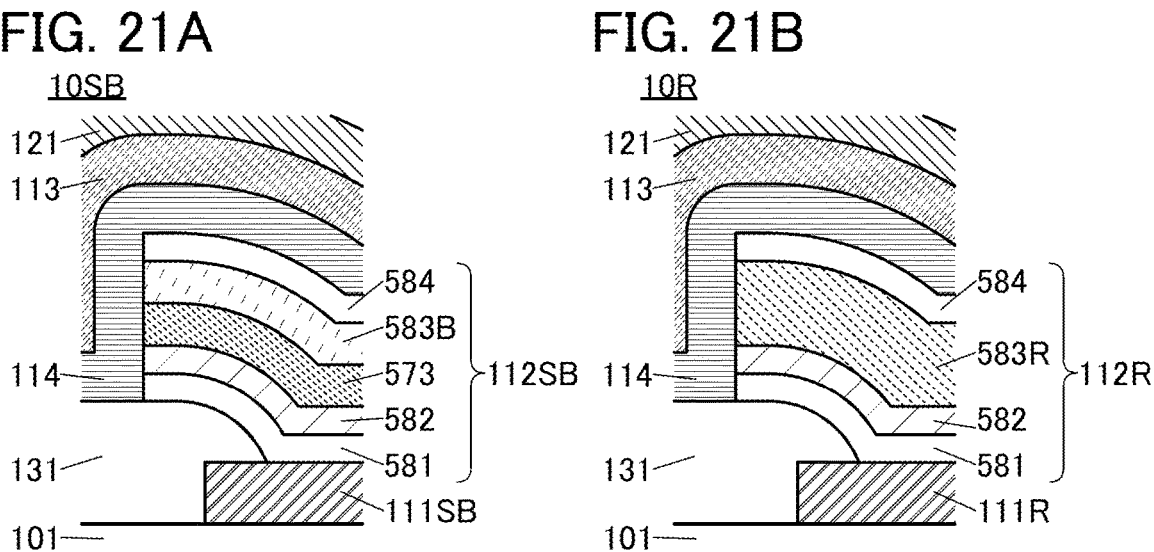
FIG. 21B
10R
FIG. 21C
104
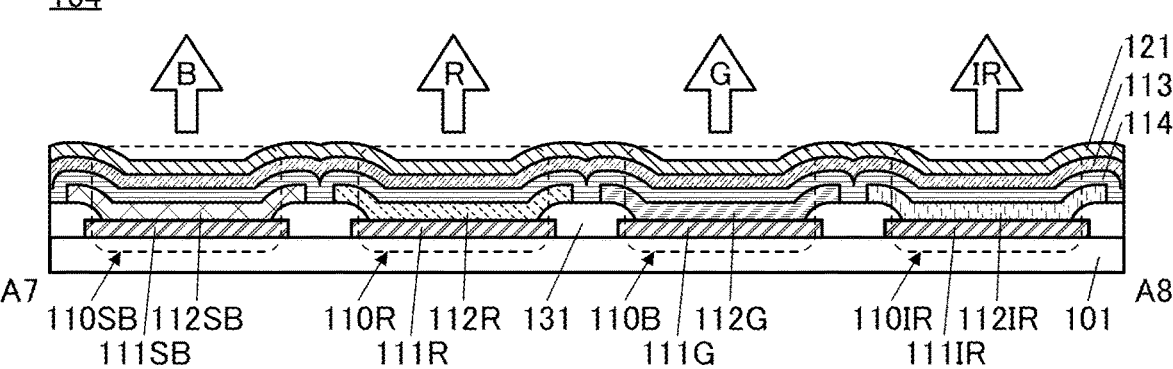
FIG. 21D
104
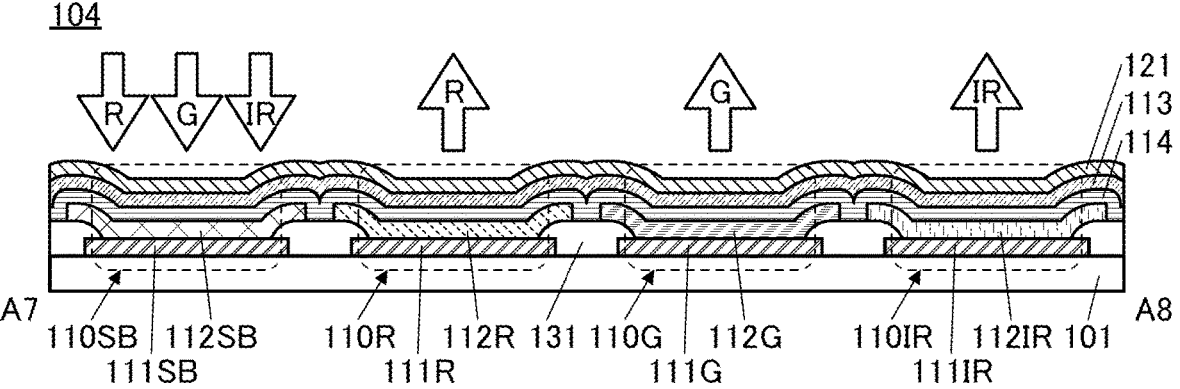

FIG. 29

Image display

FIG. 31A
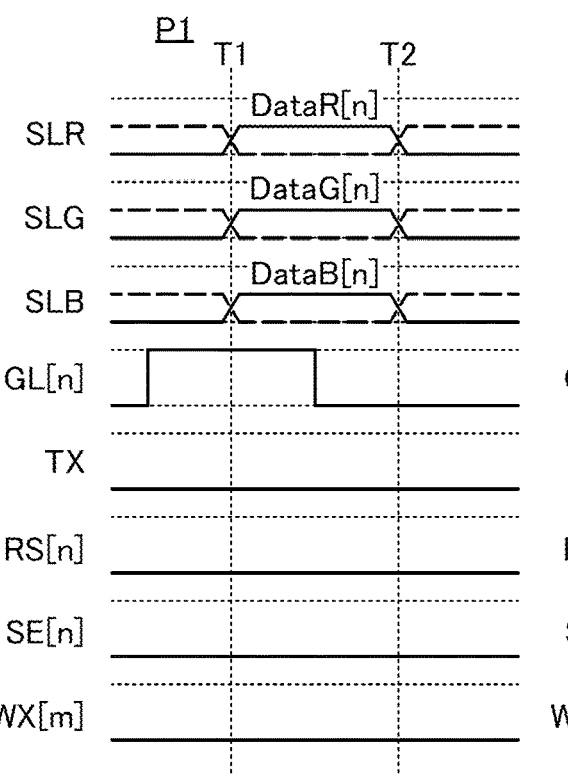
FIG. 31B
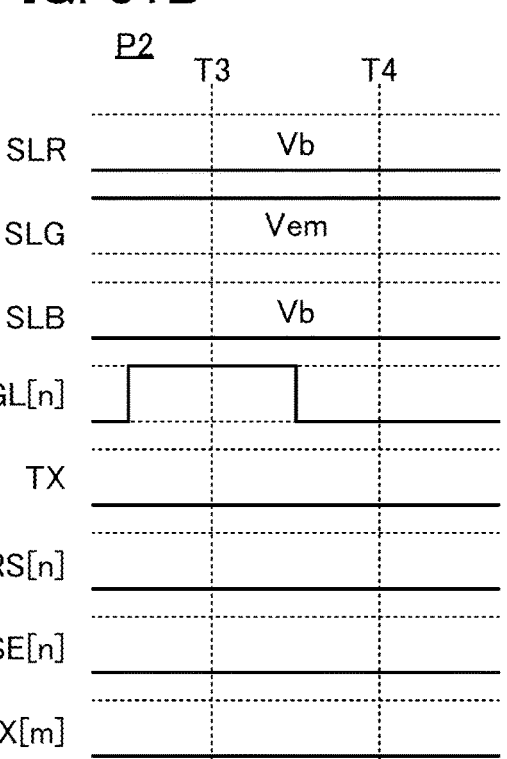
FIG. 31C
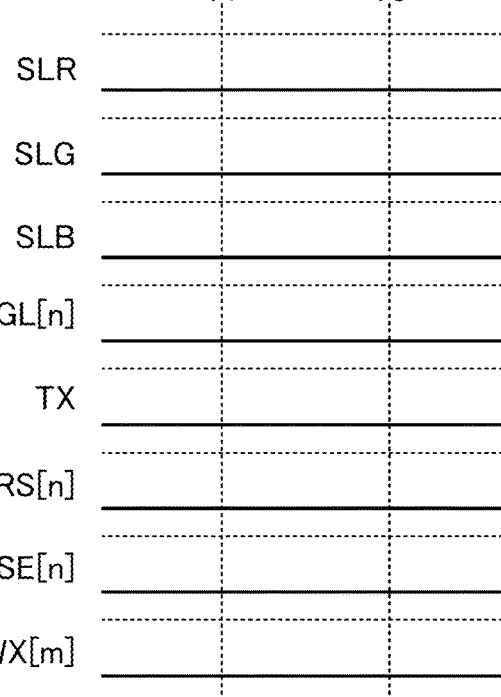
FIG. 31D

SLR

SLG

SLB

SLR

SLG

SLB

GL[n]

TX

RS[n]

SE[n]

WX[m]

sig

FIG. 38A
FIG. 38B
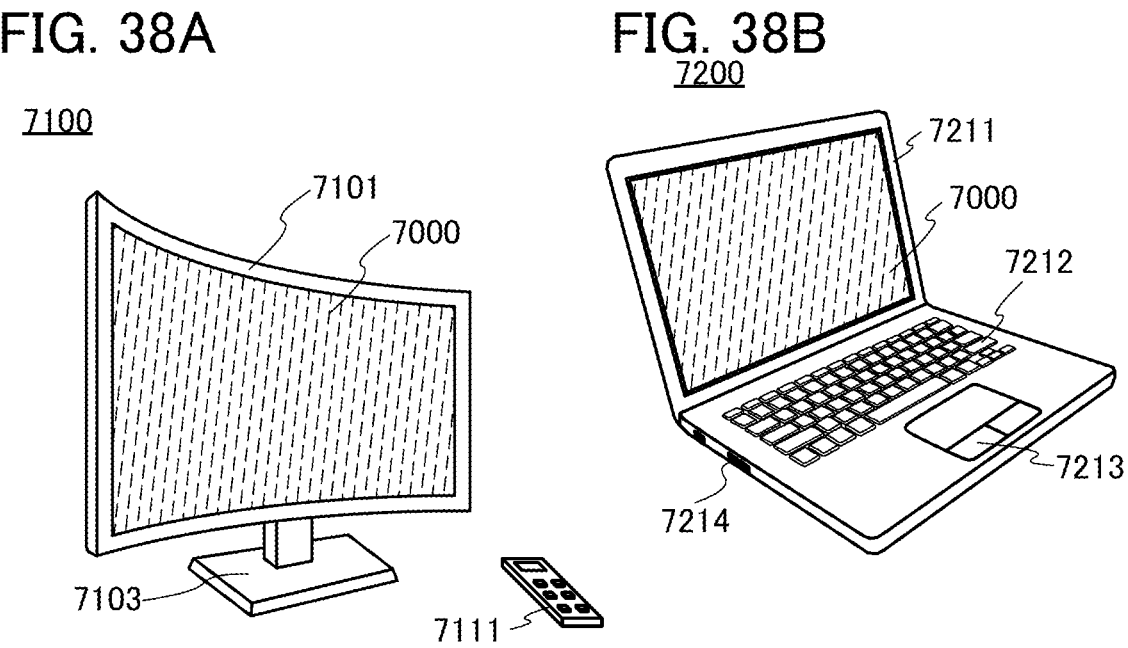
FIG. 38C
FIG. 38D
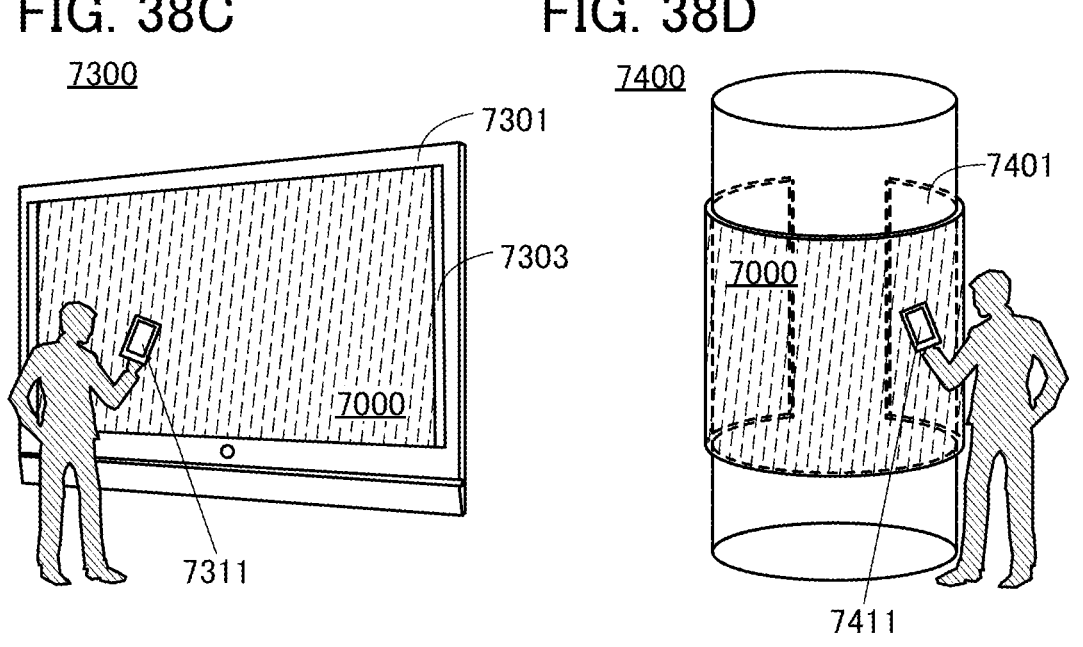

FIG. 39A
9101
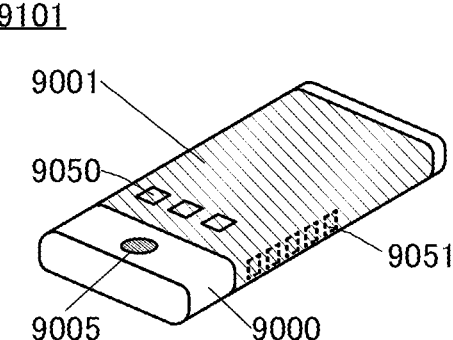
FIG. 39B
9102
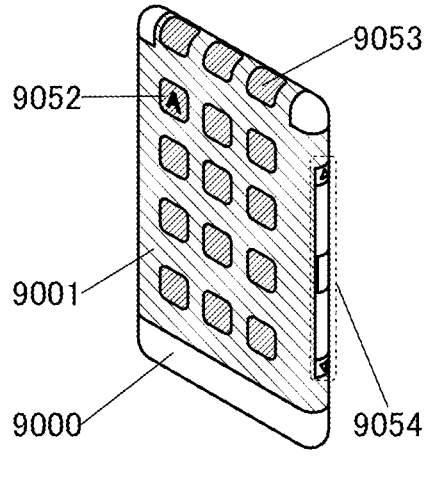
FIG. 39C
9200
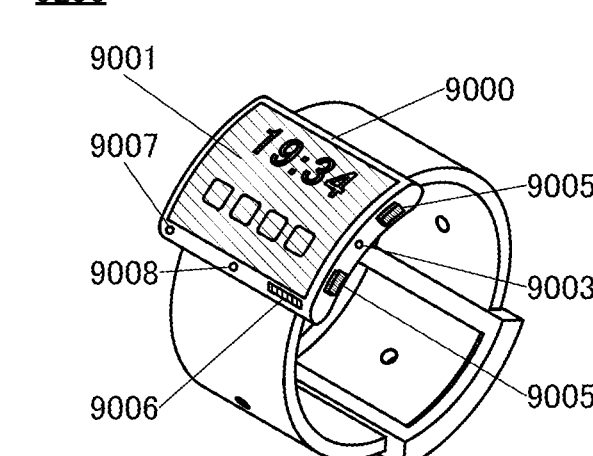
FIG. 39D
9201
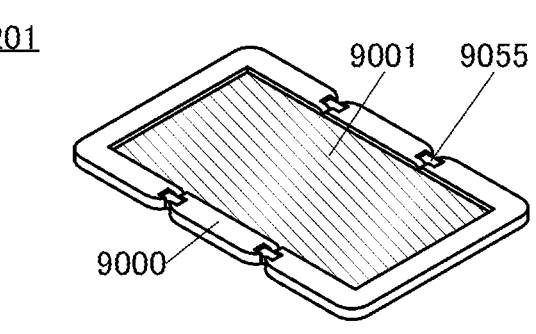
FIG. 39E
9201
FIG. 39F
9201
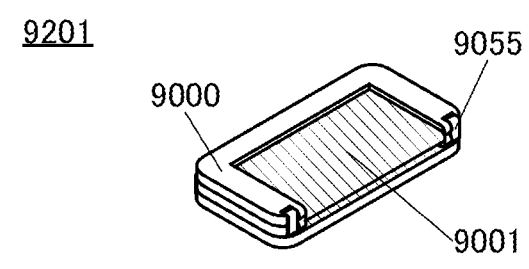

1

METHOD FOR MANUFACTURING DISPLAY APPARATUS

CROSS REFERENCE TO RELATED APPLICATIONS

This application is a U.S. National Phase Application under 35 U.S.C. § 371 of International Application PCT/IB2022/050610, filed on Jan. 25, 2022, which is incorporated by reference and claims the benefit of a foreign priority application filed in Japan on Feb. 5, 2021, as Application No. 2021-017133.

TECHNICAL FIELD

One embodiment of the present invention relates to a method for manufacturing a display apparatus. One embodiment of the present invention relates to a display apparatus, a display module, and an electronic device. One embodiment of the present invention relates to a display apparatus including a light-emitting and light-receiving device (also referred to as a light-emitting and light-receiving element) and a light-emitting device (also referred to as a light-emitting element).

Note that one embodiment of the present invention is not limited to the above technical field. Examples of the technical field of one embodiment of the present invention include a semiconductor device, a display apparatus, a light-emitting apparatus, a power storage device, a memory device, an electronic device, a lighting device, an input device (e.g., a touch sensor), an input/output device (e.g., a touch panel), a driving method thereof, and a manufacturing method thereof.

BACKGROUND ART

In recent years, display apparatuses have been expected to be applied to a variety of uses. Examples of uses of a large display apparatus include a television device for home use (also referred to as a TV or a television receiver), digital signage, and a PID (Public Information Display). In addition, a smartphone and a tablet terminal including a touch panel are being developed as portable information terminals.

For example, light-emitting apparatuses including light-emitting devices have been developed as display apparatuses. Light-emitting devices (also referred to as EL devices or EL elements) utilizing electroluminescence (hereinafter referred to as EL) have features such as ease of reduction in thickness and weight, high-speed response to input signals, and driving with a constant DC voltage power source, and have been used in display apparatuses. For example, Patent Document 1 discloses a flexible light-emitting apparatus including an organic EL device (also referred to as organic EL element).

REFERENCE

Patent Document

[Patent Document 1] Japanese Published Patent Application No. 2014-197522

SUMMARY OF THE INVENTION

Problems to be Solved by the Invention

An object of one embodiment of the present invention is to provide a method for manufacturing a display apparatus having a light sensing function. An object of one embodiment of the present invention is to provide a method of manufacturing a high-resolution display apparatus having a light sensing function. An object of one embodiment of the present invention is to provide a method for manufacturing a highly convenient display apparatus. An object of one embodiment of the present invention is to provide a method for manufacturing a multifunction display apparatus. An object of one embodiment of the present invention is to provide a method for manufacturing a display apparatus with a high aperture ratio. An object of one embodiment of the present invention is to provide a method for manufacturing a novel display apparatus.

An object of one embodiment of the present invention is to improve the manufacturing yield of a display apparatus having a light sensing function. An object of one embodiment of the present invention is to reduce the number of steps for a display apparatus having a light sensing function. An object of one embodiment of the present invention is to reduce the manufacturing cost of a display apparatus having a light sensing function.

Note that the description of these objects does not preclude the existence of other objects. One embodiment of the present invention does not need to achieve all of these objects. Other objects can be derived from the description of the specification, the drawings, and the claims.

Means for Solving the Problems

One embodiment of the present invention is a method for manufacturing a display apparatus including: a first step of forming a first pixel electrode and a second pixel electrode; a second step of depositing a light-emitting and light-receiving film over the first pixel electrode and the second pixel electrode; a third step of depositing a first sacrificial film covering the light-emitting and light-receiving film; a fourth step of etching the first sacrificial film and the light-emitting and light-receiving film to form a light-emitting and light-receiving layer over the first pixel electrode and a first sacrificial layer over the light-emitting and light-receiving layer and to expose the second pixel electrode; a fifth step of depositing an EL film over the first sacrificial layer and over the second pixel electrode; a sixth step of depositing a second sacrificial film covering the EL film; a seventh step of etching the second sacrificial film and the EL film to form an EL layer over the second pixel electrode and a second sacrificial layer over the EL layer; an eighth step of removing the first sacrificial layer and the second sacrificial layer and exposing the light-emitting and light-receiving layer and the EL layer; and a ninth step of forming a common electrode covering the light-emitting and light-receiving layer and the EL layer.

In the above-described method for manufacturing a display apparatus, the light-emitting and light-receiving layer includes an active layer and a first light-emitting layer, and the EL layer includes a second light-emitting layer. The active layer includes a first organic compound, the first light-emitting layer includes a second organic compound, and the second light-emitting layer includes a third organic compound. The first organic compound, the second organic compound, and the third organic compound are preferably different from each other.

In the above-described method for manufacturing a display apparatus, the first pixel electrode, the light-emitting and light-receiving layer, and the common electrode form a light-emitting and light-receiving device having a function of emitting light of a first wavelength range and a function of receiving light of a second wavelength range. The second pixel electrode, the EL layer, and the common electrode form a light-emitting device having a function of emitting light of the second wavelength range. The first wavelength range is preferably different from the second wavelength range.

In the above-described method for manufacturing a display apparatus, the second wavelength range is preferably included in a wavelength range of visible light.

In the above-described method for manufacturing a display apparatus, the second wavelength range is preferably included in a wavelength range of infrared light.

In the above-described method for manufacturing a display apparatus, a step of forming a layer covering a top surface and a side surface of the light-emitting and light-receiving layer and a top surface and a side surface of the EL layer is included between the eighth step and the ninth step. The layer is preferably a layer containing a substance with a high electron-injection property.

In the above-described method for manufacturing a display apparatus, a step of forming a layer covering a top surface and a side surface of the light-emitting and light-receiving layer and a top surface and a side surface of the EL layer is included between the eighth step and the ninth step. The layer preferably has a stacked-layer structure of a first layer containing a substance with a high electron-transport property and a second layer containing a substance with a high electron-injection property over the first layer.

In the above-described method for manufacturing a display apparatus, a step of forming a layer covering a top surface and a side surface of the light-emitting and light-receiving layer and a top surface and a side surface of the EL layer is included between the eighth step and the ninth step. The layer is preferably a layer containing a substance with a high hole-injection property.

In the above-described method for manufacturing a display apparatus, a step of forming a layer covering a top surface and a side surface of the light-emitting and light-receiving layer and a top surface and a side surface of the EL layer is included between the eighth step and the ninth step. The layer preferably has a stacked-layer structure of a first layer containing a substance with a high hole-transport property and a second layer containing a substance with a high hole-injection property over the first layer.

In the above-described method for manufacturing a display apparatus, the first sacrificial film includes one or more of a metal film, an alloy film, a metal oxide film, a semiconductor film, and an inorganic insulating film. In the fourth step, dry etching using an etching gas containing no oxygen gas is preferably used for etching the light-emitting and light-receiving film.

In the above-described method for manufacturing a display apparatus, the etching gas containing no oxygen gas is preferably one or more selected from $CF_4$, $C_4F_8$, $SF_6$, $CHF_3$, $Cl_2$, $H_2O$, $BCl_3$, $H_2$, and a noble gas.

Effect of the Invention

With one embodiment of the present invention, a method for manufacturing a display apparatus having a light sensing function can be provided. With one embodiment of the present invention, a method of manufacturing a high-resolution display apparatus having a light sensing function can be provided. With one embodiment of the present invention, a method for manufacturing a highly convenient display apparatus can be provided. With one embodiment of the present invention, a method for manufacturing a multifunction display apparatus can be provided. With one embodiment of the present invention, a method for manufacturing a display apparatus with a high aperture ratio can be provided. With one embodiment of the present invention, a method for manufacturing a novel display apparatus can be provided.

With one embodiment of the present invention, the manufacturing yield of a display apparatus having a light sensing function can be improved. With one embodiment of the present invention, the number of steps for a display apparatus having a light sensing function can be reduced. With one embodiment of the present invention, the manufacturing cost of a display apparatus having a light sensing function can be reduced.

Note that the description of these effects does not preclude the existence of other effects. One embodiment of the present invention does not need to have all of these effects. Other effects can be derived from the description of the specification, the drawings, and the claims.

BRIEF DESCRIPTION OF THE DRAWINGS

FIG. 1A to FIG. 1D are cross-sectional views illustrating examples of a display apparatus. FIG. 1E to FIG. 1H are top views illustrating pixel examples.

FIG. 3A to FIG. 3C are diagrams illustrating a structure example of a display apparatus.

FIG. 5A to FIG. 5E are diagrams illustrating structure examples in a display apparatus.

FIG. 15A to FIG. 15C are cross-sectional views illustrating an example of a display apparatus.

FIG. 15D to FIG. 15F are top views illustrating pixel examples.

FIG. 18A is a cross-sectional view illustrating an example of a display apparatus. FIG. 18B to FIG. 18D are top views illustrating pixel examples.

FIG. 21A to FIG. 21D are diagrams illustrating a structure example of a display apparatus.

FIG. 29 is a circuit diagram illustrating an example of a pixel circuit.

FIG. 31A to FIG. 31D are timing charts illustrating the example of a method for driving a display apparatus.

FIG. 32A and FIG. 32B are timing charts illustrating the example of a method for driving a display apparatus.

FIG. 38A to FIG. 38D are diagrams illustrating examples of electronic devices.

FIG. 39A to FIG. 39F are diagrams illustrating examples of electronic devices.

MODE FOR CARRYING OUT THE INVENTION

Figure 2A:
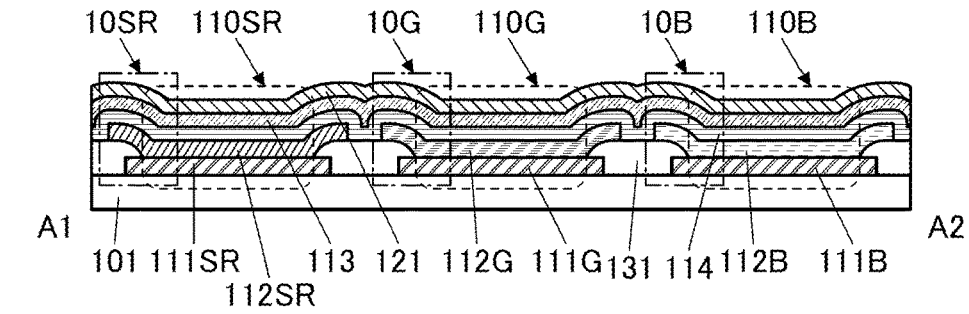
FIG. 2A to FIG. 2D are diagrams illustrating a structure example of a display apparatus.

Embodiments are described in detail with reference to the drawings. Note that the present invention is not limited to the following description, and it will be readily appreciated by those skilled in the art that modes and details of the present invention can be modified in various ways without departing from the spirit and scope of the present invention. Therefore, the present invention should not be construed as being limited to the description in the following embodiments. Note that in structures of the invention described below, the same portions or portions having similar functions are denoted by the same reference numerals in different drawings, and the description thereof is not repeated. Furthermore, the same hatch pattern is used for the portions having similar functions, and the portions are not especially denoted by reference numerals in some cases.

In addition, the position, size, range, or the like of each structure illustrated in drawings does not represent the actual position, size, range, or the like in some cases for easy understanding. Therefore, the disclosed invention is not necessarily limited to the position, size, range, or the like disclosed in the drawings.

Note that the term "film" and the term "layer" can be interchanged with each other depending on the case or circumstances. For example, the term "conductive layer"

can be replaced with the term "conductive film". As another example, the term "insulating film" can be replaced with the term "insulating layer".

Embodiment 1

In this embodiment, a display apparatus of one embodiment of the present invention will be described.

The display apparatus of one embodiment of the present invention includes a plurality of pixels in a display portion. The pixels are arranged in a matrix. The pixels each include a light-emitting device and a light-emitting and light-receiving device. The display portion of the display apparatus of this embodiment has one or both of an image capturing function and a sensing function in addition to a function of displaying an image.

The light-emitting device includes a pair of electrodes and an EL layer between them. The light-emitting device is preferably an organic EL device (organic electroluminescent device). Two or more light-emitting devices that exhibit different colors include EL layers containing different materials. For example, when three kinds of light-emitting devices emitting light of red (R), green (G), and blue (B) are included, a full-color display apparatus can be achieved.

For example, an organic EL device that is a light-emitting device and an organic photodiode that is a light-receiving device can be formed over the same substrate. Thus, the organic photodiode can be incorporated in the display apparatus including the organic EL device.

However, when a subpixel including a light-receiving device is provided in addition to a subpixel including a light-emitting device, the aperture ratio of pixels might be lowered or an increase in the resolution of the display apparatus might become difficult.

Instead of the light-emitting device, a light-emitting and light-receiving device is provided in a subpixel that emits light of any color in the display apparatus of this embodiment. The light-emitting and light-receiving device has both a function of emitting light (a light-emitting function) and a function of receiving light (a light-receiving function). For example, in the case where a pixel includes three subpixels of red, green, and blue, at least one of the subpixels includes a light-emitting and light-receiving device and the other subpixels each include a light-emitting device. The light-emitting and light-receiving device functions as both a light-emitting device and a light-receiving device, whereby the pixel can have a light-receiving function without an increase in the number of subpixels included in the pixel. Thus, the display portion of the display apparatus can be provided with one or both of an image capturing function and a sensing function while keeping the aperture ratio of the pixel (aperture ratio of each subpixel) and the resolution of the display apparatus.

The light-emitting and light-receiving device can be manufactured by combining an organic EL device that is a light-emitting device and an organic photodiode that is a light-receiving device. For example, by adding an active layer of an organic photodiode to a stacked-layer structure of an organic EL device, the light-emitting and light-receiving device can be manufactured. The light-emitting and light-receiving device includes a pair of electrodes and a light-emitting and light-receiving layer between them. The light-emitting and light-receiving layer can have a structure including a layer forming an EL layer and an active layer. Furthermore, in the light-emitting and light-receiving device manufactured by combining an organic EL device and an organic photodiode, depositing a layer that can be shared with the organic EL device can inhibit an increase in the number of deposition steps.

For example, one of the pair of electrodes (a common electrode) can be a layer shared by the light-emitting and light-receiving device and the light-emitting device. In another example, at least one of a hole-injection layer, a hole-transport layer, an electron-transport layer, and an electron-injection layer is preferably a layer shared by the light-emitting and light-receiving device and the light-emitting device. In another example, the light-emitting and light-receiving device and the light-emitting device can have the same structure except for the presence or absence of the active layer of the light-emitting and light-receiving device. In other words, the light-emitting and light-receiving device can be manufactured by only adding the active layer to the light-emitting device. When the light-emitting and light-receiving device and the light-emitting device include a common layer in such a manner, the number of deposition steps and the number of masks can be reduced, thereby reducing the number of manufacturing steps and the manufacturing cost of the display apparatus. Furthermore, the display apparatus including the light-emitting and light-receiving device can be manufactured using an existing manufacturing apparatus and an existing manufacturing method for the display apparatus.

Here, as a way of separately forming the light-emitting and light-receiving layer of the light-emitting and light-receiving device and the EL layers of the light-emitting devices of different colors, an evaporation method using a shadow mask, such as a metal mask (MM) or a fine metal mask (FMM), is known. However, this method causes a deviation from the designed shape and position of an island-shaped organic film due to various influences such as the accuracy of the shadow mask, the positional deviation between the shadow mask and a substrate, a warp of the shadow mask, and the vapor-scattering-induced expansion of the outline of the deposited film; accordingly, it is difficult to achieve high resolution and a high aperture ratio. Thus, a measure has been taken for pseudo improvement in resolution (also referred to as pixel density) by employing a unique pixel arrangement such as a PenTile pattern.

In this specification and the like, a shadow mask such as a metal mask (MM) or a fine metal mask (FMM) is referred to as a metal mask (MM) in some cases. A device manufactured using a metal mask (MM) is referred to as a device having a metal mask (MM) structure in some cases. A device manufactured without using a metal mask is referred to as a device having a metal mask less (MML) structure in some cases.

In this specification and the like, a structure in which light-emitting layers in a light-emitting and light-receiving device and light-emitting devices of different colors (for example, red (R), green (G), and blue (B)) are separately formed or separately patterned may be referred to as an SBS (Side By Side) structure. In this specification and the like, a light-emitting device capable of emitting white light may be referred to as a white-light-emitting device. Note that a combination of white-light-emitting devices with coloring layers (e.g., color filters) enables a full-color display apparatus.

In one embodiment of the present invention, fine patterning of EL layers and a light-emitting and light-receiving layer is performed without a metal mask. Thus, a display apparatus with high resolution and a high aperture ratio, which has been difficult to achieve so far, can be obtained. Moreover, the EL layers and the light-emitting and light-receiving layer can be formed separately, enabling the display apparatus to perform extremely clear display with high contrast and high display quality.

In the formation method using a metal mask, it is difficult to make the distance between EL layers of different colors to less than 10 $\mu$m. However, with the method for manufacturing a display apparatus of one embodiment of the present invention, the distance between EL layers of different colors can be decreased to be less than or equal to 3 $\mu$m, less than or equal to 2 $\mu$m, or less than or equal to 1 $\mu$m. For example, with the use of an exposure apparatus for LSI, the distance can be decreased to be less than or equal to 500 nm, less than or equal to 200 nm, less than or equal to 100 nm, or less than or equal to 50 nm. The distance among the EL layers and the light-emitting and light-receiving layer can be decreased to be less than or equal to 8 $\mu$m, less than or equal to 5 $\mu$m, or less than or equal to 3 $\mu$m. Accordingly, the area of a non-light-emitting region that may exist between two light-emitting devices and between the light-emitting and light-receiving device and the light-emitting device can be significantly reduced, and the aperture ratio can be close to 100%. For example, the aperture ratio lower than 100% but higher than or equal to 50%, higher than or equal to 60%, higher than or equal to 70%, higher than or equal to 80%, or higher than or equal to 90% can be achieved.

Furthermore, patterns of the EL layer and the light-emitting and light-receiving layer can be made extremely smaller than those in the case of using a metal mask. For example, in the case of using a metal mask for separately forming the EL layers and the light-emitting and light-receiving layer, a variation in the thickness of the pattern occurs between the center and the edge of the pattern; thus, an effective area that can be used as a light-emitting region with respect to the entire pattern area is reduced. In contrast, in the above manufacturing method, a pattern is formed by processing a film which has been deposited with a uniform thickness, which enables a uniform thickness in the pattern; thus, almost the entire area can be used as a light-emitting region even in the case of a fine pattern. Therefore, the above manufacturing method makes it possible to obtain a display apparatus with both high resolution and a high aperture ratio.

As described above, with the above manufacturing method, a display apparatus in which minute light-emitting and light-receiving devices and minute light-emitting devices are integrated can be obtained, and it is not necessary to conduct a pseudo improvement in resolution with a unique pixel arrangement method such as a PenTile arrangement, for example; therefore, the display apparatus can achieve resolution higher than or equal to 500 ppi, higher than or equal to 1000 ppi, higher than or equal to 2000 ppi, higher than or equal to 3000 ppi, or higher than or equal to 5000 ppi while having what is called a stripe arrangement where R, G, and B are each arranged in one direction.

Note that a layer included in the light-emitting and light-receiving device might perform a different function between the case where the light-emitting and light-receiving device functions as the light-receiving device and the case where the light-emitting and light-receiving device functions as the light-emitting device. In this specification, the name of a component is based on its function in the case where the light-emitting and light-receiving device functions as a light-emitting device. For example, a hole-injection layer functions as a hole-injection layer in the case where the light-emitting and light-receiving device functions as a light-emitting device, and functions as a hole-transport layer in the case where the light-emitting and light-receiving device functions as a light-receiving device.

Similarly, an electron-injection layer functions as an electron-injection layer in the case where the light-emitting and light-receiving device functions as a light-emitting device, and functions as an electron-transport layer in the case where the light-emitting and light-receiving device functions as a light-receiving device.

As described above, the display portion of the display apparatus of this embodiment includes a light-emitting and light-receiving device and a light-emitting device. Specifically, light-emitting and light-receiving devices and light-emitting devices are each arranged in a matrix in the display portion. Accordingly, the display portion has one or both of an image capturing function and a sensing function in addition to a function of displaying an image.

The display portion can be used as at least one of an image sensor or a touch sensor. That is, by detecting light with the display portion, an image can be captured or an approach or contact of an object (e.g., a finger or a stylus) can be detected. Furthermore, in the display apparatus of this embodiment, the light-emitting devices can be used as a light source of the sensor. Accordingly, a light-receiving portion and a light source do not need to be provided separately from the display apparatus; hence, the number of components of an electronic device can be reduced.

In the display apparatus of this embodiment, when an object reflects light emitted from the light-emitting device included in the display portion, the light-emitting and light-receiving device can detect the reflected light; thus, detection of image capturing and touch (contact or approach) can be performed even in a dark place.

The display apparatus of this embodiment has a function of displaying an image using the light-emitting device and the light-emitting and light-receiving device. That is, the light-emitting device and the light-emitting and light-receiving device function as display devices (also referred to as display elements).

As the light-emitting device, an EL device such as an OLED (Organic Light Emitting Diode) or a QLED (Quantum-dot Light Emitting Diode) is preferably used. Examples of a light-emitting substance contained in the EL device include a substance emitting fluorescence (a fluorescent material), a substance emitting phosphorescence (a phosphorescent material), an inorganic compound (e.g., a quantum dot material), and a substance exhibiting thermally activated delayed fluorescence (a thermally activated delayed fluorescence (TADF) material). In addition, an LED (Light Emitting Diode) such as a micro-LED can be used as the light-emitting device. Any of the above-described substances can be used as the light-emitting substance included in the light-emitting and light-receiving device.

The display apparatus of this embodiment has a function of detecting light using the light-emitting and light-receiving device.

When the light-emitting and light-receiving device is used as an image sensor, the display apparatus of this embodiment can capture an image using the light-emitting and light-receiving device. For example, the display apparatus of this embodiment can be used as a scanner.

For example, data on a fingerprint, a palm print, or the like can be obtained with the use of the image sensor. That is, a biological authentication sensor can be incorporated in the display apparatus of this embodiment. When the display apparatus incorporates a biometric authentication sensor, the number of components of an electronic device can be reduced as compared with the case where a biometric authentication sensor is provided separately from the display apparatus; thus, the size and weight of the electronic device can be reduced.

Data on facial expression, eye movement, change of the pupil diameter, or the like of a user can be obtained with the use of the image sensor. By analysis of the data, information on the user's physical and mental state can be obtained. Changing the output contents of one or both of display and sound on the basis of the information allows the user to safely use a device for VR (Virtual Reality), a device for AR (Augmented Reality), or a device for MR (Mixed Reality), for example.

When the light-emitting and light-receiving device is used as a touch sensor, the display apparatus of this embodiment can detect the approach or contact of an object with the use of the light-emitting and light-receiving device.

The light-emitting and light-receiving device functions as a photoelectric conversion device that detects light entering the light-emitting and light-receiving device and generates charge. The amount of generated charge depends on the amount of incident light.

The light-emitting and light-receiving device can be manufactured by adding an active layer to the above-described structure of the light-emitting device.

For the light-emitting and light-receiving device, an active layer of a pn photodiode or a pin photodiode can be used, for example.

It is particularly preferable to use, for the light-emitting and light-receiving device, an active layer of an organic photodiode including a layer containing an organic compound. An organic photodiode, which is easily made thin, lightweight, and large in area and has a high degree of freedom for shape and design, can be used in a variety of display apparatuses.

Specific structure examples and manufacturing method examples of the display apparatus of one embodiment of the present invention are described below.

FIG. 1A to FIG. 1D each illustrate a cross-sectional view of the display apparatus of one embodiment of the present invention.

A display apparatus 50A illustrated in FIG. 1A includes a layer 53 including a light-emitting and light-receiving device and a layer 57 including light-emitting devices, between a substrate 51 and a substrate 59.

A display apparatus 50B illustrated in FIG. 1B includes the layer 53 including the light-emitting and light-receiving device, the layer 57 including the light-emitting devices, and a layer 55 including transistors, between a substrate 51 and a substrate 59. For example, the layer 53 including the light-emitting and light-receiving device and the layer 57 including the light-emitting devices can be provided over the layer 55 including the transistors.

In the display apparatus 50A and the display apparatus 50B, green (G) light and blue (B) light are emitted from the layer 57 including the light-emitting devices, and red (R) light is emitted from the layer 53 including the light-emitting and light-receiving device. FIG. 1A and FIG. 1B schematically illustrate green (G) light and blue (B) light emitted from the layer 57, red (R) light emitted from the layer 53, and light that enters the layer 53 with arrows. In the display apparatus of one embodiment of the present invention, the color of light emitted from the layer 53 including the light-emitting and light-receiving device is not limited to red.

The light-emitting and light-receiving device included in the layer 53 can detect light that enters from the outside of the display apparatus 50A or the display apparatus 50B. For example, in the case of the structure where the light-emitting and light-receiving device emits red (R) light, the light-emitting and light-receiving device can detect one or both of green (G) light and blue (B) light.

In this specification and the like, a blue (B) wavelength range is greater than or equal to 400 nm and less than 490 nm, and blue (B) light has at least one emission spectrum peak in the wavelength range. A green (G) wavelength range is greater than or equal to 490 nm and less than 580 nm, and green (G) light has at least one emission spectrum peak in the wavelength range. A red (R) wavelength range is greater than or equal to 580 nm and less than 700 nm, and red (R) light has at least one emission spectrum peak in the wavelength range. In this specification and the like, a wavelength range of visible light is greater than or equal to 400 nm and less than 700 nm, and visible light has at least one emission spectrum peak in that wavelength range. An infrared (IR) wavelength range is greater than or equal to 700 nm and less than 900 nm, and infrared (IR) light has at least one emission spectrum peak in the wavelength range. Note that in this specification and the like, the light-emitting and light-receiving device preferably has sensitivity to a detection-target wavelength range. For example, when the light-emitting and light-receiving device has sensitivity to the blue (B) wavelength range, the light-emitting and light-receiving device can detect blue (B) light.

The display apparatus of one embodiment of the present invention includes a plurality of pixels arranged in a matrix. One pixel includes one or more subpixels. One subpixel includes one light-emitting and light-receiving device or one light-emitting device. For example, the pixel can have a structure including three subpixels (e.g., three colors of R, G, and B or three colors of yellow (Y), cyan (C), and magenta (M)) or four subpixels (e.g., four colors of R, G, B, and white (W) or four colors of R, G, B, and Y). The subpixel of at least one color includes a light-emitting and light-receiving device. The light-emitting and light-receiving device may be provided in all the pixels or in some of the pixels. In addition, one pixel may include a plurality of light-emitting and light-receiving devices.

The layer 55 including the transistors includes a transistor electrically connected to the light-emitting and light-receiving device and a transistor electrically connected to the light-emitting device, for example. The layer 55 including the transistors may further include a wiring, an electrode, a terminal, a capacitor, a resistor, or the like.

The display apparatus of one embodiment of the present invention may have a function of detecting an object such as a finger that is in contact with the display apparatus. Alternatively, the display apparatus of one embodiment of the present invention may have a function of detecting an object that is approaching (but is not in contact with) the display apparatus. FIG. 1C illustrates a state where a finger 52 is in contact with the display apparatus 50B. FIG. 1D illustrates a state where the finger 52 is approaching the display apparatus 50B. For example, as illustrated in FIG. 1C and FIG. 1D, light emitted by the light-emitting device in the layer 57 is reflected by the finger 52 that is in contact with or approaching the display apparatus 50B, and the light-emitting and light-receiving device in the layer 53 detects the reflected light. Thus, the contact or approach of the finger 52 with/to the display apparatus 50B can be detected.

The display apparatus 50A and the display apparatus 50B can also function as a touch panel, a pen tablet, or the like with the use of the light-emitting and light-receiving device. Unlike in the case of using a capacitive touch sensor, an electromagnetic induction touch sensor, or the like, even the position of a highly insulating sensing target can be detected with the use of the light-emitting and light-receiving device; hence, the material of the sensing target such as a stylus is not limited, and a variety of writing materials (e.g., a brush, a glass pen, and a quill pen) can be used.

FIG. 1E to FIG. 1H illustrate pixel examples.

The pixel illustrated in FIG. 1E has what is called a stripe subpixel arrangement in which the light-emitting devices emitting light of the same color or the light-emitting and light-receiving devices emitting light of the same color are arranged in one direction. The pixel includes a subpixel (SR) that emits red light and has a light-receiving function, a subpixel (G) that emits green light, and a subpixel (B) that emits blue light. In a display apparatus including a pixel composed of three subpixels of red (R), green (G), and blue (B), a light-emitting device used in the red (R) subpixel can be replaced with a light-emitting and light-receiving device, so that the display apparatus can have a light-receiving function in the pixel.

In the case where touch detection is performed with the light-emitting and light-receiving device, for example, it is preferable that light emitted from a light source be hard for a user to recognize. Since blue light has lower visibility than green light, light-emitting devices that emit blue light are preferably used as a light source. Accordingly, the light-emitting and light-receiving device preferably has a function of receiving blue light.

A pixel illustrated in FIG. 1F employs a matrix arrangement of subpixels and includes a subpixel (SR) that emits red light and has a light-receiving function, a subpixel (G) that emits green light, a subpixel (B) that emits blue light, and a subpixel (W) that emits white light. Also in a display apparatus including a pixel composed of four subpixels of red (R), green (G), blue (B), and white (W), a light-emitting device used in the red (R) subpixel can be replaced with a light-emitting and light-receiving device, so that the display apparatus having a light-receiving function in the pixel can be manufactured.

A pixel illustrated in FIG. 1G includes a subpixel (SR) that emits red light and has a light-receiving function, a subpixel (G) that emits green light, and a subpixel (B) that emits blue light. The subpixel (SR) is positioned in a column different from a column where the subpixel (G) and the subpixel (B) are positioned. The subpixel (G) and the subpixel (B) are alternately arranged in the same column; one is provided in an odd-numbered row and the other is provided in an even-numbered row. The color of the subpixel positioned in a column different from the column where the subpixels of the other colors are positioned is not limited to red (R) and may be green (G) or blue (B).

FIG. 1H illustrates two pixels, and one pixel is composed of three subpixels surrounded by dotted lines. A pixel illustrated in FIG. 1H includes a subpixel (SR) that emits red light and has a light-receiving function, a subpixel (G) that emits green light, and a subpixel (B) that emits blue light. In the pixel on the left in FIG. 1H, the subpixel (G) is positioned in the same row as the subpixel (SR), and the subpixel (B) is positioned in the same column as the subpixel (SR). In the pixel on the right in FIG. 1H, the subpixel (G) is positioned in the same row as the subpixel (SR), and the subpixel (B) is positioned in the same column as the subpixel (G). In every odd-numbered row and every even-numbered row of the pixel layout illustrated in FIG. 1H, the subpixel (SR), the subpixel (G), and the subpixel (B) are repeatedly arranged. In addition, subpixels of different colors are arranged in the odd-numbered row and the even-numbered row in every column.

Note that the arrangement of subpixels is not limited to the order illustrated in FIG. 1E to FIG. 1H. For example, the positions of a subpixel (B) and a subpixel (G) may be reversed. Although FIG. 1E to FIG. 1H illustrate the examples in which the subpixels of the respective colors have the same area, one embodiment of the present invention is not limited thereto. The subpixel area may differ depending on the color. Although FIG. 1E to FIG. 1H illustrate the structures in which the subpixel having a light-receiving function emits red (R) light, one embodiment of the present invention is not limited thereto. For example, a structure may be employed in which the pixel includes a subpixel that emits green light and has a light-receiving function, a subpixel that emits red light, and a subpixel (B) that emits blue light.

The pixel arrangement in the display apparatus of this embodiment need not be changed when a light-receiving function is incorporated into pixels; thus, the display portion can be provided with one or both of an image capturing function and a sensing function without reductions in the aperture ratio and resolution.

Structure Example 1

FIG. 2A is a schematic top view of a display apparatus 100 of one embodiment of the present invention. The display apparatus 100 includes a plurality of light-emitting and light-receiving devices 110SR that emit red light and have a light-receiving function, a plurality of light-emitting devices 110G that emit green light, and a plurality of light-emitting devices 110B that emit blue light. In FIG. 2A, to easily distinguish the light-emitting and light-receiving devices and the light-emitting devices, the light-emitting and light-receiving region of each light-emitting and light-receiving device is denoted by SR, and the light-emitting region of each light-emitting device is denoted by G or B.

The light-emitting and light-receiving devices 110SR, the light-emitting devices 110G, and the light-emitting devices 110B are each arranged in a matrix. FIG. 2A illustrates an example of a display apparatus having a stripe arrangement which is illustrated in FIG. 1E. Note that the arrangement of the light-emitting devices is not limited thereto, and a delta arrangement or a zigzag arrangement may be employed as well. Alternatively, a PenTile arrangement can be used.

The light-emitting and light-receiving device 110SR, the light-emitting device 110G, and the light-emitting device 110B are arranged in an X direction. The light-emitting devices of the same color are arranged in a Y direction intersecting with the X direction.

Figure 2B:
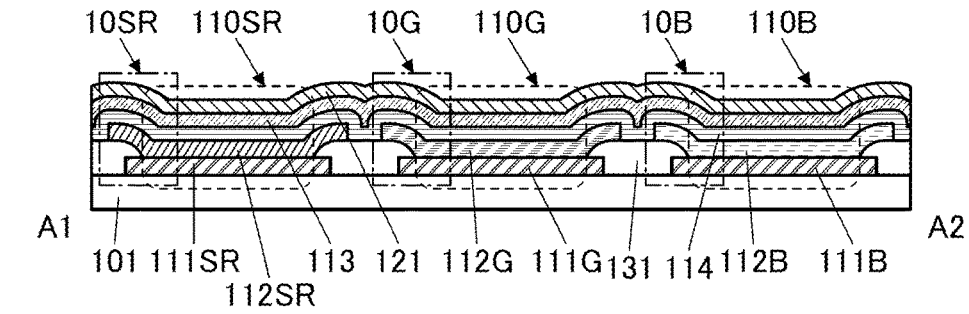
Figure 2C:
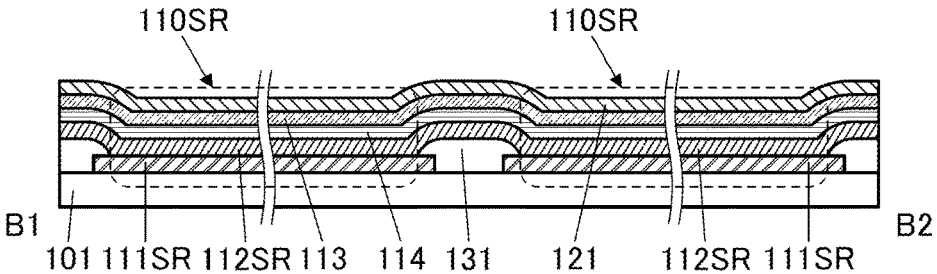

FIG. 2B is a schematic cross-sectional view taken along the dashed-dotted line A1-A2 in FIG. 2A, and FIG. 2C is a schematic cross-sectional view taken along the dashed-dotted line B1-B2.

FIG. 2B illustrates cross sections of the light-emitting and light-receiving device 110SR, the light-emitting device 110G, and the light-emitting device 110B. The light-emitting and light-receiving device 110SR includes a pixel electrode 111SR, a light-emitting and light-receiving layer 112SR, a layer 114, and a common electrode 113. The light-emitting device 110G includes a pixel electrode 111G, an EL layer 112G, the layer 114, and the common electrode 113. The light-emitting device 110B includes a pixel electrode 111B, an EL layer 112B, the layer 114, and the common electrode 113. The layer 114 and the common electrode 113 are provided so as to be shared by the light-emitting and light-receiving device 110SR, the light-emitting device 110G, and the light-emitting device 110B. The layer 114 can also be referred to as a common layer. The light-emitting and light-receiving layer 112SR included in the light-emitting and light-receiving device 110SR contains at least a light-emitting organic compound having an emission spectrum peak in the red wavelength range. The EL layer 112G included in the light-emitting element 110G contains at least a light-emitting organic compound having an emission spectrum peak in the green wavelength range. The EL layer 112B included in the light-emitting device 110B contains at least a light-emitting organic compound having an emission spectrum peak in the blue wavelength range.

The light-emitting and light-receiving layer 112SR, the EL layer 112G, and the EL layer 112B may each include one or more of an electron-injection layer, an electron-transport layer, a hole-injection layer, and a hole-transport layer in addition to the layer containing a light-emitting organic compound (the light-emitting layer). The layer 114 does not necessarily include the light-emitting layer. For example, the layer 114 includes one or more of an electron-injection layer, an electron-transport layer, a hole-injection layer, and a hole-transport layer.

The pixel electrode 111SR, the pixel electrode 111G, and the pixel electrode 111B are provided for the respective light-emitting devices. Each of the common electrode 113 and the layer 114 is provided as a continuous layer shared by the light-emitting devices. A conductive film having a light-transmitting property with respect to visible light is used for either each of the pixel electrodes or the common electrode 113, and a conductive film having a reflective property is used for the other. When the pixel electrodes have a light-transmitting property and the common electrode 113 has a reflective property, a bottom-emission display apparatus can be provided; whereas when the pixel electrodes have a reflective property and the common electrode 113 has a light-transmitting property, a top-emission display apparatus can be provided. Note that when both the pixel electrodes and the common electrode 113 have a light-transmitting property, a dual-emission display apparatus can be provided.

An insulating layer 131 is provided to cover the end portions of the pixel electrode 111SR, the pixel electrode 111G, and the pixel electrode 111B. The end portions of the insulating layer 131 are preferably tapered. In this specification and the like, a tapered shape indicates a shape in which at least part of a side surface of a structure is inclined to a substrate surface. For example, a tapered shape preferably includes a region where the angle between the inclined side surface and the substrate surface (the angle is also referred to as a taper angle) is less than 90°. Note that the insulating layer 131 is not necessarily provided when not needed.

The light-emitting and light-receiving layer 112SR, the EL layer 112G, and the EL layer 112B each include a region in contact with a top surface of the pixel electrode and a region in contact with a surface of the insulating layer 131. End portions of the light-emitting and light-receiving layer 112SR, the EL layer 112G, and the EL layer 112B are positioned over the insulating layer 131.

As illustrated in FIG. 2B, there is a gap between the two EL layers of the light-emitting devices of different colors. In this manner, the light-emitting and light-receiving layer 112SR, the EL layer 112G, and the EL layer 112G are preferably provided so as not to be in contact with each other. This suitably prevents unintentional light emission from being caused by a current flowing through two adjacent EL layers. As a result, the contrast can be increased to achieve a display apparatus with high display quality.

As illustrated in FIG. 2C, the light-emitting and light-receiving layer 112SR is formed in a band shape so that the light-emitting and light-receiving layer 112SR can be continuous in the Y direction. When the light-emitting and light-receiving layer 112SR and the like are formed in a band shape, no space for dividing the layer is needed and thus the area of a non-light-emitting region between the light-emitting devices can be reduced, resulting in a higher aperture ratio. Note that FIG. 2C illustrates the cross section of the light-emitting and light-receiving device 110SR as an example; the light-emitting device 110G and the light-emitting device 110B can have a similar shape.

A protective layer 121 is provided over the common electrode 113 to cover the light-emitting and light-receiving device 110SR, the light-emitting device 110G, and the light-emitting device 110B. The protective layer 121 has a function of preventing diffusion of impurities such as water into the light-emitting devices from above.

The protective layer 121 can have, for example, a single-layer structure or a stacked-layer structure at least including an inorganic insulating film. Examples of the inorganic insulating film include an oxide film and a nitride film such as a silicon oxide film, a silicon oxynitride film, a silicon nitride oxide film, a silicon nitride film, an aluminum oxide film, an aluminum oxynitride film, and a hafnium oxide film. Alternatively, a semiconductor material such as indium gallium oxide or indium gallium zinc oxide may be used for the protective layer 121.

As the protective layer 121, a stacked-layer film of an inorganic insulating film and an organic insulating film can be used. For example, a structure in which an organic insulating film is interposed between a pair of inorganic insulating films is preferable. Furthermore, the organic insulating film preferably functions as a planarization film. Thus, a top surface of the organic insulating film can be flat, and accordingly, coverage with the inorganic insulating film thereover can be improved, leading to an improvement in barrier properties. Moreover, a top surface of the protective layer 121 is flat, which is preferable because the influence of uneven shape due to the lower structure can be reduced in the case where a component (e.g., a color filter, an electrode of a touch sensor, a lens array, or the like) is provided over the protective layer 121.

FIG. 2A illustrates a connection electrode 111C that is electrically connected to the common electrode 113. The connection electrode 111C is supplied with a potential (e.g., an anode potential or a cathode potential) that is to be supplied to the common electrode 113. The connection electrode 111C is provided outside a display region where the light-emitting and light-receiving device 110SR and the like are arranged. In FIG. 2A, the common electrode 113 is denoted by dashed line.

The connection electrode 111C can be provided along the outer periphery of the display region. For example, the connection electrode 111C may be provided along one side of the outer periphery of the display region or two or more sides of the outer periphery of the display region. That is, in the case where the display region has a rectangular top surface shape, a top surface shape of the connection electrode 111C can be a band shape, an L shape, a U shape having a corner portion (a square bracket shape), a quadrangular shape, or the like. The top surface shape of the display region is not limited to the rectangular shape and may be a polygonal shape or a shape having a curved line. In that case, the top surface shape of the connection electrode 111C may be a shape that is along part of the outer periphery of the display region.

Figure 2D:
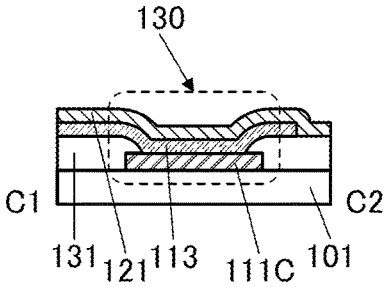

FIG. 2D is a schematic cross-sectional view taken along the dashed-dotted line C1-C2 in FIG. 2A. FIG. 2D illustrates a connection portion 130 in which the connection electrode 111C is electrically connected to the common electrode 113. In the connection portion 130, the common electrode 113 is provided on and in contact with the connection electrode 111C and the protective layer 121 is provided to cover the common electrode 113. In addition, the insulating layer 131 is provided to cover end portions of the connection electrode 111C.

[Device Structure]

Next, detailed structures of the light-emitting and light-receiving device and the light-emitting device, which can be used in the display apparatus of one embodiment of the present invention, are described.

The display apparatus of one embodiment of the present invention can have any of the following structures: a top-emission structure in which light is emitted in a direction opposite to the substrate where the light-emitting and light-receiving device and the light-emitting device are formed, a bottom-emission structure in which light is emitted toward the substrate where the light-emitting and light-receiving device and the light-emitting device are formed, and a dual-emission structure in which light is emitted toward both surfaces.

In the description here, the top-emission display apparatus is taken as an example. In addition, it is assumed that the pixel electrode 111 functions as an anode and the common electrode 113 functions as a cathode in both of the light-emitting and light-receiving device and the light-emitting device.

In this specification and the like, unless otherwise specified, in describing a structure including a plurality of elements (e.g., light-emitting devices and light-emitting layers), alphabets are not added when a common part of the elements is described. For example, when a common part of the light-emitting device 110G, the light-emitting device 110B, and the like is described, the light-emitting devices are simply referred to as the light-emitting device 110, in some cases. When a common part of the pixel electrode 111SR, the pixel electrode 111G, and the pixel electrode 111B is described, the pixel electrodes are simply referred to as the pixel electrode 111, in some cases.

FIG. 3A, FIG. 3B, and FIG. 3C illustrate enlarged views of a region 10SR, a region 10G, and a region 10B indicated by the dashed-dotted lines in FIG. 2B, respectively.

As illustrated in FIG. 3A, the light-emitting and light-receiving device 110SR includes the pixel electrode 111SR, the light-emitting and light-receiving layer 112SR, the layer 114, and the common electrode 113 stacked in this order. The light-emitting and light-receiving layer 112SR includes at least an active layer 573 and a light-emitting layer 583R. The light-emitting layer 583R contains a light-emitting substance that emits red light. The active layer 573 and the light-emitting layer 583R may be in contact with each other. FIG. 3A illustrates an example in which the light-emitting and light-receiving layer 112SR includes a hole-injection layer 581, a hole-transport layer 582, the active layer 573, the light-emitting layer 583R, and an electron-transport layer 584 stacked in this order. As the layer 114, an electron-injection layer can be used. The layer 114 may have a stacked-layer structure of an electron-transport layer and an electron-injection layer over the electron-transport layer. Note that it is acceptable that the light-emitting and light-receiving layer 112SR does not include at least one of the hole-injection layer 581, the hole-transport layer 582, and the electron-transport layer 584. Furthermore, the light-emitting and light-receiving layer 112SR may include another layer such as a hole-blocking layer or an electron-blocking layer.

The active layer 573 contains a semiconductor. Examples of the semiconductor include an inorganic semiconductor such as silicon and an organic semiconductor including an organic compound. As the semiconductor included in the active layer 573, an organic semiconductor can be suitably used. The active layer 573 contains an n-type semiconductor material and a p-type semiconductor material. The active layer 573 can have a structure including a mixed layer of an n-type semiconductor material and a p-type semiconductor material (a bulk heterojunction structure). In the case where the active layer 573 has a bulk heterojunction structure, an n-type semiconductor material and a p-type semiconductor material can be co-evaporated to form the active layer 573, for example. Alternatively, the active layer 573 may have a stacked-layer structure (a bilayer structure) of a layer containing an n-type semiconductor material and a layer containing a p-type semiconductor material. Note that a structure other than a bulk heterojunction structure or a bilayer structure may be applied to the active layer 573.

The positions of end portions of the layers included in the light-emitting and light-receiving layer 112SR are aligned or substantially aligned with each other. In other words, top surface shapes of the layers included in the light-emitting and light-receiving layer 112SR are aligned or substantially aligned with each other. For example, as illustrated in FIG. 3A, the positions of the end portions of the hole-injection layer 581, the hole-transport layer 582, the active layer 573, the light-emitting layer 583R, and the electron-transport layer 584 are aligned or substantially aligned with each other. In other words, the top surface shapes of the hole-injection layer 581, the hole-transport layer 582, the active layer 573, the light-emitting layer 583R, and the electron-transport layer 584 are aligned or substantially aligned with each other.

Note that in this specification and the like, the expression "top surface shapes are aligned or substantially aligned with each other" means that at least outlines of stacked layers partly overlap with each other. For example, the case of processing an upper layer and a lower layer with the use of the same mask pattern or mask patterns that are partly the same is included. However, in some cases, the outlines do not completely overlap with each other and the upper layer is positioned on an inner side of the lower layer or the upper layer is positioned on an outer side of the lower layer; such a case is also represented by the expression "top surface shapes are aligned or substantially aligned with each other".

As illustrated in FIG. 3B, the light-emitting device 110G includes the pixel electrode 111G, the EL layer 112G, the layer 114, and the common electrode 113 stacked in this order. The EL layer 112G includes at least a light-emitting layer 583G. The light-emitting layer 583G contains a light-emitting substance that emits green light. FIG. 3B illustrates an example in which the EL layer 112G includes the hole-injection layer 581, the hole-transport layer 582, the light-emitting layer 583G, and the electron-transport layer 584 stacked in this order.

The positions of end portions of the layers included in the EL layer 112G are aligned or substantially aligned with each other. In other words, top surface shapes of the layers included in the EL layer 112G are aligned or substantially aligned with each other. For example, as illustrated in FIG. 3B, the positions of the end portions of the hole-injection layer 581, the hole-transport layer 582, the light-emitting layer 583G, and the electron-transport layer 584 are aligned or substantially aligned with each other. In other words, the top surface shapes of the hole-injection layer 581, the hole-transport layer 582, the light-emitting layer 583G, and the electron-transport layer 584 are aligned or substantially aligned with each other.

As illustrated in FIG. 3C, the light-emitting device 110B includes the pixel electrode 111B, the EL layer 112B, the layer 114, and the common electrode 113 stacked in this order. The EL layer 112B includes at least a light-emitting layer 583B. The light-emitting layer 583B contains a light-emitting substance that emits blue light. FIG. 3C illustrates an example in which the EL layer 112B includes the hole-injection layer 581, the hole-transport layer 582, the light-emitting layer 583G, and the electron-transport layer 584 stacked in this order.

The positions of end portions of the layers included in the EL layer 112B are aligned or substantially aligned with each other. In other words, top surface shapes of the layers included in the EL layer 112B are aligned or substantially aligned with each other. For example, as illustrated in FIG. 3C, the positions of the end portions of the hole-injection layer 581, the hole-transport layer 582, the light-emitting layer 583B, and the electron-transport layer 584 are aligned or substantially aligned with each other. In other words, the top surface shapes of the hole-injection layer 581, the hole-transport layer 582, the light-emitting layer 583B, and the electron-transport layer 584 are aligned or substantially aligned with each other.

The active layer 573 contains an organic compound that is different from an organic compound contained in the light-emitting layer 583R, an organic compound contained in the light-emitting layer 583G, and an organic compound contained in the light-emitting layer 583B. The light-emitting layer 583R contains the organic compound that is different from the organic compound contained in the active layer 573, the organic compound contained in the light-emitting layer 583G, and the organic compound contained in the light-emitting layer 583B. The light-emitting layer 583G contains the organic compound that is different from the organic compound contained in the active layer 573, the organic compound contained in the light-emitting layer 583R, and the organic compound contained in the light-emitting layer 583B. The light-emitting layer 583B contains the organic compound that is different from the organic compound contained in the active layer 573, the organic compound contained in the light-emitting layer 583R, and the organic compound contained in the light-emitting layer 583G.

The wavelength range of light emitted by the light-emitting layer 583R, the wavelength range of light emitted by the light-emitting layer 583G, and the wavelength range of light emitted by the light-emitting layer 583B are different from one another. Furthermore, the organic compound contained in the active layer 573 has sensitivity to one or more of a wavelength range of light emitted by the light-emitting layer 583G and a wavelength range of light emitted by the light-emitting layer 583B.

In the case of the structure in which the pixel electrode 111SR, the pixel electrode 111G, and the pixel electrode 111B function as cathodes and the common electrode 113 functions as an anode, the hole-injection layer 581 is replaced by an electron-injection layer, the hole-transport layer 582 is replaced by an electron-transport layer, the electron-transport layer 584 is replaced by a hole-transport layer, and the layer 114 is replaced by a hole-injection layer.

Alternatively, the layer 114 may be replaced by a hole-transport layer. Note that the layer 114 is not necessarily provided.

Structures of light-emitting devices can be classified roughly into a single structure and a tandem structure. A light-emitting device having a single structure includes one light-emitting unit between a pair of electrodes. Note that in this specification and the like, a light-emitting unit includes at least one light-emitting layer. The light-emitting unit may further include one or more functional layers such as a hole-injection layer, a hole-transport layer, an electron-transport layer, and an electron-injection layer. In the case of obtaining white light emission with a light-emitting device including two light-emitting layers, the two light-emitting layers are preferably selected such that their emission colors are complementary colors. For example, when the emission color of a first light-emitting layer and the emission color of a second light-emitting layer are complementary colors, the light-emitting device can emit white light as a whole. In the case of a light-emitting device including three or more light-emitting layers, white light emission can be obtained by mixing emission colors of the light-emitting layers.

A device having a tandem structure includes two or more light-emitting units between a pair of electrode, and each light-emitting unit preferably includes one or more light-emitting layers. To obtain white light emission, the structure is made so that light from light-emitting layers of the light-emitting units can be combined to be white light. Note that a structure for obtaining white light emission is similar to that in the case of a single structure. In the device having a tandem structure, an intermediate layer such as a charge-generation layer is provided between a plurality of light-emitting units.

When the white-light-emitting device (having a single structure or a tandem structure) and a light-emitting device having an SBS structure with patterned light-emitting layers are compared to each other, the light-emitting device having an SBS structure can have lower power consumption than the white-light-emitting device. To reduce power consumption, a light-emitting device having an SBS structure is preferably used. Meanwhile, the white-light-emitting device is suitable in terms of lower manufacturing cost or higher manufacturing yield because the manufacturing process of the white-light-emitting device is simpler than that of the light-emitting device having an SBS structure.

Although FIG. 3B or the like illustrates an example in which the light-emitting device has a single structure, one embodiment of the present invention is not limited thereto. The light-emitting device may have a tandem structure.

The light-emitting and light-receiving device 110SR, the light-emitting device 110G, and the light-emitting device 110B are each an electroluminescent device that emits light to the common electrode 113 side by applying voltage between the pixel electrode 111 and the common electrode 113. The light-emitting and light-receiving device 110SR also functions as a photoelectric conversion element (also referred to as a photoelectric conversion device) that detects light entering the light-emitting and light-receiving device 110SR and generates charge. In the light-emitting and light-receiving device 110SR, charge generated in the active layer 573 by incident light can be extracted as a current. At this time, voltage may be applied between the pixel electrode 111 and the common electrode 113. The amount of generated charge depends on the amount of light entering the light-emitting and light-receiving device 110SR. The light-emitting and light-receiving device 110SR has a function of detecting one or more of visible light and infrared light.

In the display apparatus of this embodiment, an organic compound is used for the active layer 573 of the light-emitting and light-receiving device 110SR. The light-emitting and light-receiving device 110SR can share the layers other than the active layer 573 and the light-emitting layer 583R with the light-emitting device 110G and the light-emitting device 110B. Therefore, the light-emitting and light-receiving device 110SR can be formed concurrently with formation of the light-emitting devices only by adding a step of depositing the active layer 573 in the manufacturing process of the light-emitting devices. The light-emitting devices and the light-emitting and light-receiving device 110SR can be formed over the same substrate. Accordingly, the light-emitting and light-receiving device 110SR can be incorporated in the display apparatus without a significant increase in the number of manufacturing steps.

In the example of the display apparatus 100, the light-emitting and light-receiving device 110SR and the light-emitting devices have the same structure except the active layer 573 and the light-emitting layer 583R of the light-emitting and light-receiving device 110SR, the light-emitting layer 583G of the light-emitting device 110G, and the light-emitting layer 583B of the light-emitting device 110B, which are separately formed. However, structures of the light-emitting and light-receiving device 110SR and the light-emitting devices are not limited thereto. The light-emitting and light-receiving device 110SR and the light-emitting devices may include a separately formed layer in addition to the active layer 573 and the light-emitting layers 583. The light-emitting and light-receiving device 110SR and the light-emitting devices preferably include one or more shared layers (common layers). Thus, the light-emitting and light-receiving device 110SR can be incorporated in the display apparatus without a significant increase in the number of manufacturing steps.

When the components of the light-emitting and light-receiving device 110SR and the components of the light-emitting devices are partly shared, a margin for misalignment can be decreased compared with the case of separately forming every component of the light-emitting and light-receiving device, 110SR and the light-emitting devices. Accordingly, the aperture ratio of a pixel can be increased, so that the light extraction efficiency of the display apparatus can be increased. Thus, lifetime of the light-emitting and light-receiving device 110SR and the light-emitting devices can be extended. Furthermore, the display apparatus with high luminance can be provided. Furthermore, the display apparatus with high resolution can be provided.

A conductive film that transmits visible light is used as the electrode through which light is extracted and light enters out of the pixel electrode 111 and the common electrode 113. A conductive film that reflects visible light is preferably used as the electrode through which light is not extracted and light does not enter.

The light-emitting devices included in the display apparatus of this embodiment preferably employs a micro optical resonator (microcavity) structure. Therefore, one of the pair of electrodes of the light-emitting devices is preferably an electrode having properties of transmitting and reflecting visible light (a semi-transmissive and semi-reflective electrode), and the other is preferably an electrode having a property of reflecting visible light (a reflective electrode). When the light-emitting devices have a microcavity structure, light obtained from the light-emitting layers can be resonated between the electrodes, whereby light emitted from the light-emitting devices can be intensified. The light-emitting and light-receiving device may employ a microcavity structure. The semi-transmissive and semi-reflective electrode can have a structure including a conductive material having a reflective property and a conductive material having a light-transmitting property, for example.

The transparent electrode has a light transmittance higher than or equal to 40%. For example, an electrode having a visible light transmittance higher than or equal to 40% is preferably used in the light-emitting devices. The semi-transmissive and semi-reflective electrode has a visible light reflectance higher than or equal to 10% and lower than or equal to 95%, preferably higher than or equal to 30% and lower than or equal to 80%. The reflective electrode has a visible light reflectance higher than or equal to 40% and lower than or equal to 100%, preferably higher than or equal to 70% and lower than or equal to 100%. These electrodes preferably have a resistivity lower than or equal to $1\times10^{-2}$ $\Omega$cm. Note that in the case where any of the light-emitting devices emits infrared light, the infrared light transmittance and reflectance of these electrodes preferably satisfy the above-described numerical ranges of the visible light transmittance and reflectance.

The light-emitting and light-receiving device and the light-emitting devices each include at least the light-emitting layer 583. The light-emitting and light-receiving device and the light-emitting elements may each further include, as a layer other than the light-emitting layer 583, a layer containing a substance with a high hole-injection property, a substance with a high hole-transport property, a hole-blocking material, a substance with a high electron-transport property, a substance with a high electron-injection property, an electron-blocking material, a substance with a bipolar property (a substance with a high electron- and hole-transport property), or the like.

For example, the light-emitting devices and the light-emitting and light-receiving device can share at least one of the hole-injection layer, the hole-transport layer, the electron-transport layer, and the electron-injection layer. Furthermore, at least one of the hole-injection layer, the hole-transport layer, the electron-transport layer, and the electron-injection layer can be separately formed for the light-emitting devices and the light-emitting and light-receiving device.

The hole-injection layer is a layer that injects holes from an anode to the hole-transport layer and contains a material with a high hole-injection property. As the material with a high hole-injection property, a composite material containing a hole-transport material (e.g., an aromatic amine compound) and an acceptor material (electron-accepting material) can be used.

In the light-emitting devices, the hole-transport layer transports holes that are injected from the anode by the hole-injection layer, to the light-emitting layer. In the light-emitting and light-receiving device, the hole-transport layer transports holes that are generated in the active layer on the basis of incident light, to the anode. The hole-transport layer is a layer containing a hole-transport material. As the hole-transport material, a substance having a hole mobility greater than or equal to $1\times10^{-6}$ cm$^2$/Vs is preferable. Note that other substances can also be used as long as they have a property of transporting more holes than electrons. As the hole-transport material, a material having a high hole-transport property, such as a $\pi$-electron-rich heteroaromatic compound (e.g., a carbazole derivative, a thiophene derivative, and a furan derivative) or an aromatic amine (a compound having an aromatic amine skeleton), is preferable.

In the light-emitting devices, the electron-transport layer transports electrons that are injected from the cathode by the electron-injection layer, to the light-emitting layer. In the light-emitting and light-receiving device, the electron-transport layer transports electrons that are generated in the active layer on the basis of incident light, to the cathode. The electron-transport layer is a layer containing an electron-transport material. As the electron-transport material, a substance having an electron mobility greater than or equal to $1\times10^{-6}$ cm 2/Vs is preferable. Note that other substances can also be used as long as they have a property of transporting more electrons than holes. As the electron-transport material, it is possible to use a material with a high electron-transport property, such as a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative having a quinoline ligand, a benzoquinoline derivative, a quinoxaline derivative, a dibenzoquinoxaline derivative, a pyridine derivative, a bipyridine derivative, a pyrimidine derivative, or a $\pi$-electron deficient heteroaromatic compound such as a nitrogen-containing heteroaromatic compound.

The electron-injection layer is a layer injecting electrons from a cathode to the electron-transport layer, and a layer containing a material with a high electron-injection property. As the material with a high electron-injection property, an alkali metal, an alkaline earth metal, or a compound thereof can be used. As the material with a high electron-injection property, a composite material containing an electron-transport material and a donor material (electron-donating material) can also be used.

The light-emitting layer 583 is a layer containing a light-emitting substance. The light-emitting layer 583 can contain one or more kinds of light-emitting substances. As the light-emitting substance, a substance that exhibits an emission color of blue, purple, bluish purple, green, yellowish green, yellow, orange, red, or the like is appropriately used. As the light-emitting substance, a substance that emits infrared light can also be used.

Examples of the light-emitting substance include a fluorescent material, a phosphorescent material, a TADF material, and a quantum dot material.

Examples of the fluorescent material include a pyrene derivative, an anthracene derivative, a triphenylene derivative, a fluorene derivative, a carbazole derivative, a dibenzothiophene derivative, a dibenzofuran derivative, a dibenzoquinoxaline derivative, a quinoxaline derivative, a pyridine derivative, a pyrimidine derivative, a phenanthrene derivative, and a naphthalene derivative.

Examples of the phosphorescent material include an organometallic complex (particularly an iridium complex) having a 4H-triazole skeleton, a 1H-triazole skeleton, an imidazole skeleton, a pyrimidine skeleton, a pyrazine skeleton, or a pyridine skeleton; an organometallic complex (particularly an iridium complex) having a phenylpyridine derivative including an electron-withdrawing group as a ligand; a platinum complex; and a rare earth metal complex.

The light-emitting layer 583 may contain one or more kinds of organic compounds (e.g., a host material and an assist material) in addition to the light-emitting substance (a guest material). As one or more kinds of organic compounds, one or both of the hole-transport material and the electron-transport material can be used. Alternatively, as one or more kinds of organic compounds, a bipolar material or a TADF material may be used.

The light-emitting layer 583 preferably contains a phosphorescent material and a combination of a hole-transport material and an electron-transport material that easily forms an exciplex. With such a structure, light emission can be efficiently obtained by ExTET (Exciplex-Triplet Energy Transfer), which is energy transfer from an exciplex to a light-emitting substance (a phosphorescent material). When a combination of materials is selected so as to form an exciplex that exhibits light emission whose wavelength overlaps with the wavelength of a lowest-energy-side absorption band of the light-emitting substance, energy can be transferred smoothly and light emission can be obtained efficiently. With this structure, high efficiency, low-voltage driving, and a long lifetime of the light-emitting and light-receiving device and the light-emitting elements can be achieved at the same time.

In the combination of materials for forming an exciplex, the HOMO level (highest occupied molecular orbital level) of the hole-transport material is preferably higher than or equal to the HOMO level of the electron-transport material. The LUMO level (lowest unoccupied molecular orbital level) of the hole-transport material is preferably higher than or equal to the LUMO level of the electron-transport material. The LUMO levels and the HOMO levels of the materials can be derived from the electrochemical characteristics (reduction potentials and oxidation potentials) of the materials that are measured by cyclic voltammetry (CV).

Note that the formation of an exciplex can be confirmed by a phenomenon in which the emission spectrum of a mixed film in which the hole-transport material and the electron-transport material are mixed is shifted to the longer wavelength side than the emission spectrum of each of the materials (or has another peak on the longer wavelength side), observed by comparison of the emission spectrum of the hole-transport material, the emission spectrum of the electron-transport material, and the emission spectrum of the mixed film of these materials, for example. Alternatively, the formation of an exciplex can be confirmed by a difference in transient response, such as a phenomenon in which the transient photoluminescence (PL) lifetime of the mixed film has longer lifetime components or has a larger proportion of delayed components than that of each of the materials, observed by comparison of the transient PL of the hole-transport material, the transient PL of the electron-transport material, and the transient PL of the mixed film of these materials. The transient PL can be rephrased as transient electroluminescence (EL). That is, the formation of an exciplex can also be confirmed by a difference in transient response observed by comparison of the transient EL of the hole-transport material, the transient EL of the electron-transport material, and the transient EL of the mixed film of these materials.

The active layer 573 contains a semiconductor. Examples of the semiconductor include an inorganic semiconductor such as silicon and an organic semiconductor including an organic compound. This embodiment shows an example in which an organic semiconductor is used as the semiconductor included in the active layer 573. The use of an organic semiconductor is preferable because the light-emitting layer 583 and the active layer 573 can be formed by the same method (e.g., a vacuum evaporation method) and thus the same manufacturing apparatus can be used.

Examples of an n-type semiconductor material contained in the active layer 573 include electron-accepting organic semiconductor materials such as fullerene (e.g., $C_{60}$ and $C_{70}$) and a fullerene derivative. Fullerene has a soccer ball-like shape, which is energetically stable. Both the HOMO level and the LUMO level of fullerene are deep (low). Having a deep LUMO level, fullerene has an extremely high electron-accepting property (acceptor property). When $\pi$-electron conjugation (resonance) spreads in a plane as in benzene, the electron-donating property (donor property) usually increases. Although $\pi$-electrons widely spread in fullerene having a spherical shape, its electron-accepting property is high. The high electron-accepting property efficiently causes rapid charge separation and is useful for a light-emitting and light-receiving element. Both $C_{60}$ and $C_{70}$ have a wide absorption band in the visible light region, and $C_{70}$ is especially preferable because of having a larger $\pi$-electron conjugation system and a wider absorption band in the long wavelength region than $C_{60}$. As other examples of the fullerene derivative, [6,6]-Phenyl-C71-butyric acid methyl ester (abbreviation: PC70BM), [6,6]-Phenyl-C61-butyric acid methyl ester (abbreviation: PC60BM), 1',1",4',4"-Tetrahydro-di[1,4]methanonaphthaleno[1,2:2',3', 56,60:2",3"][5,6]fullerene-C60 (abbreviation: ICBA), or the like can be given.

Examples of the n-type semiconductor material include a metal complex having a quinoline skeleton, a metal complex having a benzoquinoline skeleton, a metal complex having an oxazole skeleton, a metal complex having a thiazole skeleton, an oxadiazole derivative, a triazole derivative, an imidazole derivative, an oxazole derivative, a thiazole derivative, a phenanthroline derivative, a quinoline derivative, a benzoquinoline derivative, a quinoxaline derivative, a dibenzoquinoxaline derivative, a pyridine derivative, a bipyridine derivative, a pyrimidine derivative, a naphthalene derivative, an anthracene derivative, a coumarin derivative, a rhodamine derivative, a triazine derivative, and a quinone derivative.

Examples of a p-type semiconductor material contained in the active layer 573 include electron-donating organic semiconductor materials such as copper(II) phthalocyanine (CuPc), tetraphenyldibenzoperiflanthene (DBP), zinc phthalocyanine (ZnPc), tin phthalocyanine (SnPc), and quinacridone.

Examples of a p-type semiconductor material include a carbazole derivative, a thiophene derivative, a furan derivative, and a compound having an aromatic amine skeleton. Other examples of the p-type semiconductor material include a naphthalene derivative, an anthracene derivative, a pyrene derivative, a triphenylene derivative, a fluorene derivative, a pyrrole derivative, a benzofuran derivative, a benzothiophene derivative, an indole derivative, a dibenzofuran derivative, a dibenzothiophene derivative, an indolocarbazole derivative, a porphyrin derivative, a phthalocyanine derivative, a naphthalocyanine derivative, a quinacridone derivative, a polyphenylene vinylene derivative, a polyparaphenylene derivative, a polyfluorene derivative, a polyvinylcarbazole derivative, and a polythiophene derivative.

The HOMO level of the electron-donating organic semiconductor material is preferably shallower (higher) than the HOMO level of the electron-accepting organic semiconductor material. The LUMO level of the electron-donating organic semiconductor material is preferably shallower (higher) than the LUMO level of the electron-accepting organic semiconductor material.

Fullerene having a spherical shape is preferably used as the electron-accepting organic semiconductor material, and an organic semiconductor material having a substantially planar shape is preferably used as the electron-donating organic semiconductor material. Molecules of similar shapes tend to aggregate, and aggregated molecules of similar kinds, which have molecular orbital energy levels close to each other, can improve the carrier-transport property.

For example, the active layer 573 is preferably formed by co-evaporation of an n-type semiconductor and a p-type semiconductor. Alternatively, the active layer 573 may be formed by stacking a layer containing an n-type semiconductor and a layer containing a p-type semiconductor.

Either a low molecular compound or a high molecular compound can be used for the light-emitting devices and the light-emitting and light-receiving device, and an inorganic compound may also be included. Each of the layers included in the light-emitting elements and the light-emitting and light-receiving element can be formed by an evaporation method (including a vacuum evaporation method), a transfer method, a printing method, an inkjet method, a coating method, or the like.

As the hole-transport material, a high molecular compound such as poly(3,4-ethylenedioxythiophene)/poly(styrenesulfonic acid) (PEDOT/PSS), or an inorganic compound such as a molybdenum oxide or copper iodide (CuI) can be used, for example. As the electron-transport material, an inorganic compound such as zinc oxide (ZnO) can be used.

For the active layer 573, a high molecular compound such as poly[[4,8-bis[5-(2-ethylhexyl)-2-thienyl]benzo[1,2-b:4,5-b']dithiophene-2,6-diyl]]-2,5-thiophenediyl[5,7-bis(2-ethylhexyl)-4,8-dioxo-4H,8H-benzo[1,2-c:4,5-c']dithiophene-1,3-diyl]] polymer (abbreviation: PBDB-T) or a PBDB-T derivative, which functions as a donor, can be used. For example, a method in which an acceptor material is dispersed to PBDB-T or a PBDB-T derivative can be used.

The active layer 573 may contain a mixture of three or more kinds of materials. For example, the wavelength range may be extended by mixing a third material in addition to the n-type semiconductor material and the p-type semiconductor material. In this case, the third material may be a low molecular compound or a high molecular compound.

The light-emitting layer 583R contains a light-emitting material that emits red light. The active layer 573 contains an organic compound that absorbs visible light. Alternatively, the active layer 573 may contain an organic compound that absorbs visible light and infrared light. Alternatively, the active layer 573 may contain an organic compound that absorbs visible light and an organic compound that absorbs infrared light. Note that it is preferable that the organic compound contained in the active layer 573 hardly absorbs at least light emitted by the light-emitting layer 583R. Thus, red light can be efficiently extracted from the light-emitting and light-receiving device 110SR, and one or more of light having a shorter wavelength than red light (e.g., green light and blue light) and light having a longer wavelength than red light (e.g., infrared light) can be detected with high accuracy.

Figure 4A:
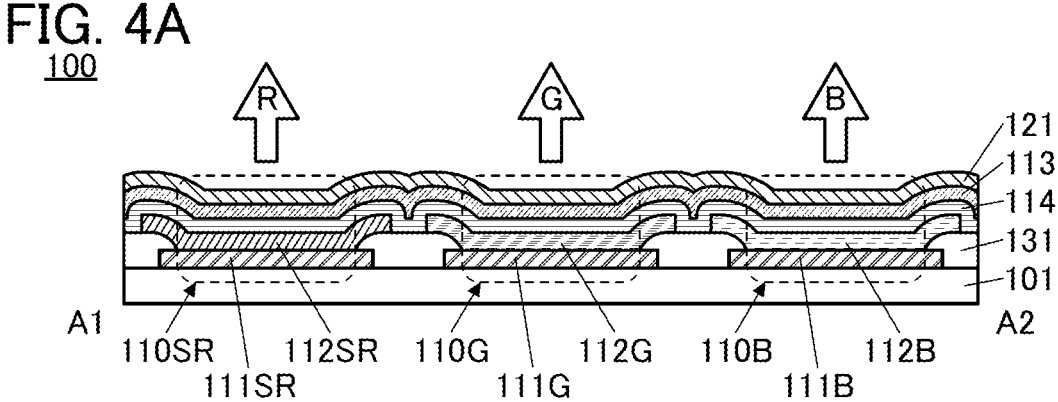
FIG. 4A and FIG. 4B are diagrams illustrating structure examples of display apparatuses.

FIG. 4A illustrates a state where the light-emitting and light-receiving device 110SR functions as a light-emitting device. FIG. 4A illustrates an example in which the light-emitting device 110B emits blue (B) light, the light-emitting device 110G emits green (G) light, and the light-emitting and light-receiving device 110SR emits red (R) light.

Figure 4B:
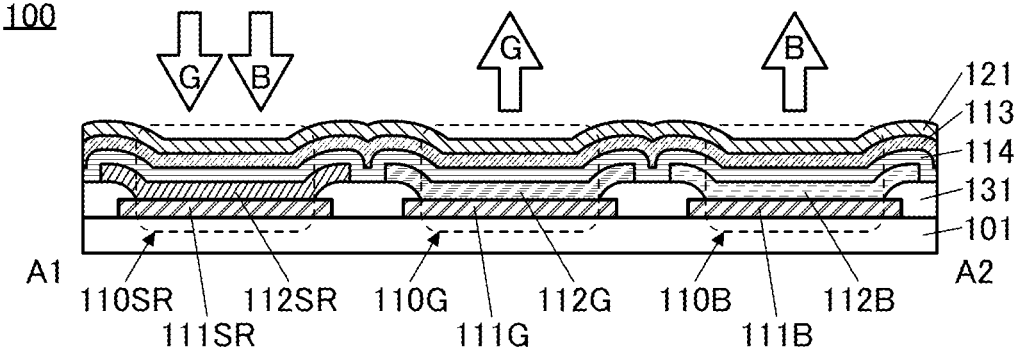

FIG. 4B illustrates a state in which the light-emitting and light-receiving device 110SR functions as a light-emitting and light-receiving device. In the example illustrated in FIG. 4B, the light-emitting and light-receiving device 110SR receives blue (B) light emitted by the light-emitting device 110B and green (G) light emitted by the light-emitting device 110G.

The light-emitting and light-receiving device 110SR can be regarded as having a structure of a light-emitting device to which the active layer 573 is added. That is, the light-emitting and light-receiving device 110SR can be formed concurrently with formation of the light-emitting devices only by adding a step of depositing the active layer 573 in the manufacturing process of the light-emitting devices. The light-emitting devices and the light-emitting and light-receiving device can be formed over the same substrate. Thus, the display portion can be provided with one or both of an image capturing function and a sensing function without a significant increase in the number of manufacturing steps.

The stacking order of the light-emitting layer 583R and the active layer 573 is not limited. FIG. 3A illustrates an example in which the active layer 573 is provided over the hole-transport layer 582, and the light-emitting layer 583R is provided over the active layer 573. The stacking order of the light-emitting layer 583R and the active layer 573 may be reversed.

It is acceptable that the light-emitting and light-receiving device 110SR does not include at least one of the hole-injection layer 581, the hole-transport layer 582, the electron-transport layer 584, and the layer 114. Furthermore, the light-emitting and light-receiving device may include another functional layer such as a hole-blocking layer or an electron-blocking layer.

FIG. 5A to FIG. 5E illustrate structure examples different from that of the light-emitting and light-receiving device 110SR illustrated in FIG. 3A.

The light-emitting and light-receiving device 110SR illustrated in FIG. 5A has a stacked-layer structure in which the pixel electrode 111SR, the hole-injection layer 581, the hole-transport layer 582, the light-emitting layer 583R, the active layer 573, the electron-transport layer 584, the layer 114, and the common electrode 113 are stacked in this order.

FIG. 5A illustrates an example in which the light-emitting layer 583R is provided over the hole-transport layer 582, and the active layer 573 is stacked over the light-emitting layer 583R. As illustrated in FIG. 5A, the active layer 573 and the light-emitting layer 583R may be in contact with each other.

A buffer layer is preferably provided between the active layer 573 and the light-emitting layer 583R. In this case, the buffer layer preferably has a hole-transport property and an electron-transport property. For example, a substance with a bipolar property is preferably used for the buffer layer. Alternatively, as the buffer layer, at least one layer of a hole-injection layer, a hole-transport layer, an electron-transport layer, an electron-injection layer, a hole-blocking layer, an electron-blocking layer, and the like can be used. FIG. 5B illustrates an example in which the hole-transport layer 582 is used as the buffer layer.

The buffer layer provided between the active layer 573 and the light-emitting layer 583R can inhibit transfer of excitation energy from the light-emitting layer 583R to the active layer 573. Furthermore, the buffer layer can also be used to adjust the optical path length (cavity length) of the microcavity structure. Thus, a high emission efficiency can be obtained from the light-emitting and light-receiving device including the buffer layer between the active layer 573 and the light-emitting layer 583R.

FIG. 5C illustrates an example of a stacked-layer structure in which a hole-transport layer 582a, the active layer 573, a hole-transport layer 582b, and the light-emitting layer 583R are stacked in this order over the hole-injection layer 581. The hole-transport layer 582b functions as a buffer layer. The hole-transport layer 582a and the hole-transport layer 582b may include the same material or different materials.

Instead of the hole-transport layer 582b, any of the above-described layers that can be used as the buffer layer may be used. The positions of the active layer 573 and the light-emitting layer 583R may be interchanged.

The light-emitting and light-receiving device illustrated in FIG. 5D is different from the light-emitting and light-receiving devices illustrated in FIG. 3A in not including the hole-transport layer 582. Thus, it is acceptable that the light-emitting and light-receiving device does not include at least one of the hole-injection layer 581, the hole-transport layer 582, the electron-transport layer 584, and the layer 114. Furthermore, the light-emitting and light-receiving device may include another functional layer such as a hole-blocking layer or an electron-blocking layer.

The light-emitting and light-receiving device illustrated in FIG. 5E is different from the light-emitting and light-receiving device illustrated in FIG. 3A in not including the active layer 573 and the light-emitting layer 583R and in including a layer 589.

The layer 589 is a layer serving as both a light-emitting layer and an active layer, and a layer containing three materials which are an n-type semiconductor that can be used for the active layer 573, a p-type semiconductor that can be used for the active layer 573, and a light-emitting substance that can be used for the light-emitting layer 583R can be used, for example.

Note that an absorption band on the lowest energy side of an absorption spectrum of a mixed material of the n-type semiconductor and the p-type semiconductor and a maximum peak of an emission spectrum (PL spectrum) of the light-emitting substance preferably do not overlap each other and are further preferably positioned fully apart from each other.

Manufacturing Method Example 1

Figures 6A, 6B, 6C, 6D, 6E, 6F:
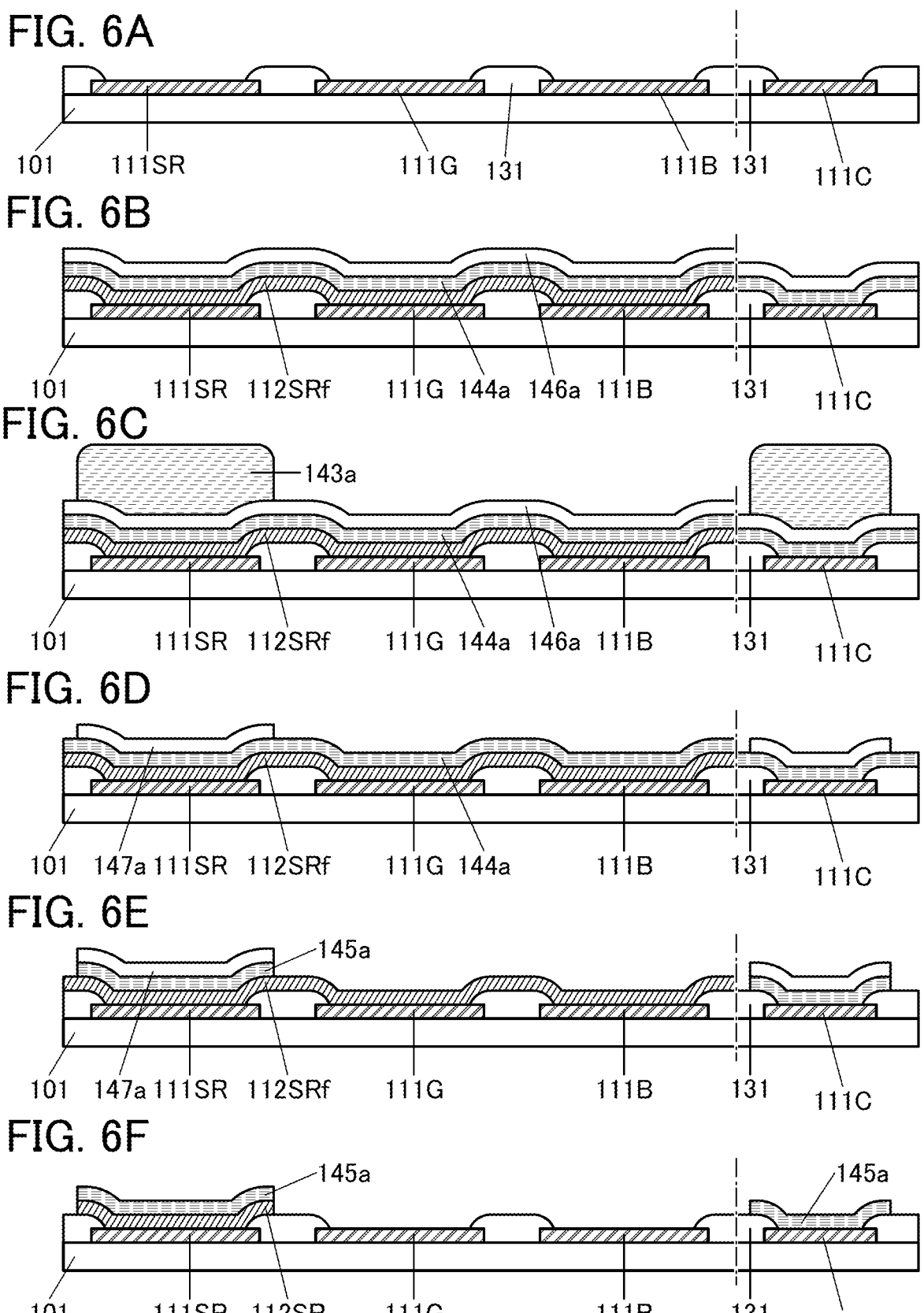
FIG. 6A to FIG. 6F are diagrams illustrating a manufacturing method example of a display apparatus.

An example of a method for manufacturing the display apparatus of one embodiment of the present invention is described below with reference to the drawings. Here, description is given by taking the display apparatus 100 described in the above structure example as an example. FIG. 6A to FIG. 7F are schematic cross-sectional views of steps in the manufacturing method of the display apparatus described as an example below. In FIG. 6A and the like, the schematic cross-sectional views of the connection portion 130 and the periphery thereof are also illustrated on the right side.

Note that thin films constituting the display apparatus (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. Examples of the CVD method include a plasma-enhanced chemical vapor deposition (PECVD) method and a thermal CVD method. An example of a thermal CVD method is a metal organic CVD (MOCVD) method.

Alternatively, thin films constituting the display apparatus (insulating films, semiconductor films, conductive films, or the like) can be formed by a method such as spin coating, dipping, spray coating, ink-jetting, dispensing, screen printing, offset printing, a doctor knife method, slit coating, roll coating, curtain coating, or knife coating.

The thin films constituting the display apparatus can be processed by a photolithography method or the like. Besides, a nanoimprinting method, a sandblasting method, a lift-off method, or the like may be used to process thin films.

Alternatively, island-shaped thin films may be directly formed by a deposition method using a shielding mask such as a metal mask.

There are the following two typical examples of a photolithography method. In one of the methods, a resist mask is formed over a thin film that is to be processed, the thin film is processed by etching or the like, and then the resist mask is removed. In the other method, a photosensitive thin film is deposited and then the thin film is processed into a desired shape by performing light exposure and development.

As light for exposure in a photolithography method, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by a liquid immersion exposure technique. As the light for exposure, extreme ultraviolet (EUV) light, X-rays, or the like may be used. Furthermore, instead of the light used for the exposure, an electron beam can also be used. It is preferable to use EUV, X-rays, or an electron beam which enables extremely minute processing. Note that a photomask is not needed when exposure is performed by scanning with a beam such as an electron beam.

For etching of thin films, a dry etching method, a wet etching method, a sandblasting method, or the like can be used.

[Preparation for Substrate 101]

As a substrate 101, a substrate having at least heat resistance high enough to withstand heat treatment performed later can be used. When an insulating substrate is used as the substrate 101, a glass substrate, a quartz substrate, a sapphire substrate, a ceramic substrate, an organic resin substrate, or the like can be used. Alternatively, a semiconductor substrate such as a single crystal semiconductor substrate or a polycrystalline semiconductor substrate of silicon, silicon carbide, or the like; a compound semiconductor substrate of silicon germanium or the like; an SOI substrate; or the like can be used.

As the substrate 101, it is particularly preferable to use the semiconductor substrate or the insulating substrate over which a semiconductor circuit including a semiconductor element such as a transistor is formed. The semiconductor circuit preferably forms a pixel circuit, a gate line driver circuit (a gate driver), a source line driver circuit (a source driver), or the like, for example. In addition to the above, an arithmetic circuit, a memory circuit, or the like may be formed.

[Formation of Pixel Electrodes 111SR, 111G, and 111B and Connection Electrode 111C]

Next, the pixel electrode 111SR, the pixel electrode 111G, the pixel electrode 111B, and the connection electrode 111C are formed over the substrate 101. First, a conductive film to be a pixel electrode is deposited, a resist mask is formed by a photolithography method, and an unnecessary portion of the conductive film is removed by etching. After that, the resist mask is removed to form the pixel electrode 111SR, the pixel electrode 111G, and the pixel electrode 111B.

In the case where a conductive film with a property of reflecting visible light is used as each pixel electrode, it is preferable to use a material (e.g., silver or aluminum) having as high reflectance as possible in the whole wavelength range of visible light. This can increase color reproducibility as well as light extraction efficiency of the light-emitting devices.

[Formation of Insulating Layer 131]

Next, the insulating layer 131 is formed so as to cover the end portions of the pixel electrode 111SR, the pixel electrode 111G, and the pixel electrode 111B (FIG. 6A). An organic insulating film or an inorganic insulating film can be used for the insulating layer 131. The end portions of the insulating layer 131 are preferably tapered to improve step coverage with an EL film described later. In particular, when an organic insulating film is used, a photosensitive material is preferably used, in which case the shape of the end portions can be easily controlled by the conditions of light exposure and development.

[Formation of Light-Emitting and Light-Receiving Film 112SRf]

Subsequently, a light-emitting and light-receiving film 112SRf to be the light-emitting and light-receiving layer 112SR is deposited over the pixel electrode 111SR, the pixel electrode 111G, the pixel electrode 111B, and the insulating layer 131.

The light-emitting and light-receiving film 112SRf includes at least a film functioning as an active layer and a film functioning as a light-emitting layer as illustrated in FIG. 3A. A structure may be employed in which one or more films functioning as an electron-injection layer, an electron-transport layer, a charge-generation layer, a hole-transport layer, and a hole-injection layer are stacked in addition to the above. The light-emitting and light-receiving film 112SRf can be formed by, for example, an evaporation method, a sputtering method, an ink-jet method, or the like. Without limitation to this, the above-described deposition method can be used as appropriate.

The light-emitting and light-receiving film 112SRf can be a stacked film in which a hole-injection layer, a hole-transport layer, an active layer, a light-emitting layer, and an electron-transport layer are stacked in this order, for example. In that case, a film including the electron-injection layer can be used as the layer 114 formed later. In particular, by providing an electron-transport layer to cover the light-emitting layer, damage to the light-emitting layer caused by a subsequent photolithography step or the like can be inhibited; thus, the light-emitting device with high reliability can be manufactured. Furthermore, by using layers containing the same organic compound for an electron-transport layer used for the light-emitting and light-receiving film 112SRf or the like and the electron-injection layer used for the layer 114 formed later, bonding of these layers can become favorable and a light-emitting device with high emission efficiency and high reliability can be obtained. For example, an organic compound with an electron-transport property can be used for the electron-transport layer, and a material containing the organic compound and a metal can be used for the electron-injection layer.

The light-emitting and light-receiving film 112SRf is preferably formed so as not to be provided over the connection electrode 111C. For example, in the case where the light-emitting and light-receiving film 112SRf is formed by an evaporation method (or a sputtering method), it is preferable that the light-emitting and light-receiving film 112SRf be formed using a shielding mask so as not to be deposited over the connection electrode 111C.

[Formation of Sacrificial Film 144a]

Next, a sacrificial film 144a is formed to cover the light-emitting and light-receiving film 112SRf. The sacrificial film 144a is provided in contact with a top surface of the connection electrode 111C.

As the sacrificial film 144a, it is possible to use a film highly resistant to etching treatment performed on each film of the light-emitting and light-receiving film 112SRf, i.e., a film having high etching selectivity. Furthermore, as the sacrificial film 144a, it is possible to use a film having high etching selectivity with respect to a protective film such as a protective film 146a described later. Moreover, as the sacrificial film 144a, it is possible to use a film that can be removed by a wet etching method that causes little damage to each film.

As the sacrificial film 144a, an inorganic film such as a metal film, an alloy film, a metal oxide film, a semiconductor film, or an inorganic insulating film can be used, for example. The sacrificial film 144a can be formed by any of a variety of deposition methods such as a sputtering method, a vacuum evaporation method, a CVD method, and an ALD method. The sacrificial film 144a is preferably formed by a method that causes as little damage as possible to the light-emitting and light-receiving film 112SRf. For example, an ALD method or a vacuum evaporation method can be suitably used for the formation of the sacrificial film 144a. Aluminum oxide is particularly suitably used as the sacrificial film 144a in terms of low manufacturing cost. The ALD method causes less deposition damage to a surface where the sacrificial film 144a is to be formed (here, the light-emitting and light-receiving film 112SRf) than the sputtering method. In other words, the ALD method enables formation of the sacrificial film 144a without sputtering damage to the light-emitting and light-receiving film 112SRf and thus is suitable.

For the sacrificial film 144a, a metal material such as gold, silver, platinum, magnesium, nickel, tungsten, chromium, molybdenum, iron, cobalt, copper, palladium, titanium, aluminum, yttrium, zirconium, or tantalum or an alloy material containing the metal material can be used, for example. It is particularly preferable to use a low-melting-point material such as aluminum or silver.

For the sacrificial film 144a, a metal oxide such as an indium gallium zinc oxide (an In—Ga—Zn oxide, also referred to as IGZO) can be used. It is also possible to use indium oxide, indium zinc oxide (In—Zn oxide), indium tin oxide (In—Sn oxide), indium titanium oxide (In—Ti oxide), indium tin zinc oxide (In—Sn—Zn oxide), indium titanium zinc oxide (In—Ti—Zn oxide), indium gallium tin zinc oxide (In—Ga—Sn—Zn oxide), or the like. Indium tin oxide containing silicon, or the like can also be used.

Note that an element M (M is one or more kinds selected from aluminum, silicon, boron, yttrium, copper, vanadium, beryllium, titanium, iron, nickel, germanium, zirconium, molybdenum, lanthanum, cerium, neodymium, hafnium, tantalum, tungsten, and magnesium) may be used instead of gallium. In particular, M is preferably one or more kinds selected from gallium, aluminum, and yttrium.

For the sacrificial film 144a, an inorganic insulating material such as aluminum oxide, hafnium oxide, or silicon oxide can be used.

At the formation of the sacrificial film 144a by an ALD method or a sputtering method, thermal deposition may be used. In the case of using thermal deposition, the temperature is preferably set at a temperature at which deterioration of the light-emitting and light-receiving film 112SRf is not caused. The substrate temperature at the time of depositing the sacrificial film 144a is preferably higher than or equal to room temperature and lower than or equal to 200° C., further preferably higher than or equal to 50° C. and lower than or equal to 150° C., still further preferably higher than or equal to 70° C. and lower than or equal to 100° C., and typically approximately 80° C. When the substrate temperature at the time of depositing the sacrificial film 144a is low, the sacrificial film 144a becomes a sparse film, and when the etching rate of the sacrificial film 144a to the etchant becomes high in a later step, a defect such as disappearance or peeling of the sacrificial film 144a might occur. Setting the substrate temperature within the above-described range can inhibit deterioration of the light-emitting and light-receiving film 112SRf as well as the disappearance or occurrence of the peeling.

The sacrificial film 144a is preferably formed using a material that can be dissolved in a solvent chemically stable with respect to at least the uppermost film of the light-emitting and light-receiving film 112SRf. Specifically, a material that is dissolved in water or alcohol can be suitably used for the sacrificial film 144a. In depositing the sacrificial film 144a, it is preferable that application of such a material dissolved in a solvent such as water or alcohol be performed by a wet deposition method and followed by heat treatment for evaporating the solvent. At this time, the heat treatment is preferably performed under a reduced-pressure atmosphere, in which case the solvent can be removed at a low temperature in a short time and thermal damage to the light-emitting and light-receiving film 112SRf can be accordingly minimized.

As a wet deposition method that can be used for forming the sacrificial film 144a, spin coating, dipping, spray coating, ink-jetting, dispensing, screen printing, offset printing, a doctor knife method, slit coating, roll coating, curtain coating, knife coating, or the like can be given.

For the sacrificial film 144a, an organic material such as polyvinyl alcohol (PVA), polyvinylbutyral, polyvinylpyrrolidone, polyethylene glycol, polyglycerin, pullulan, water-soluble cellulose, or an alcohol-soluble polyamide resin can be used.

Note that the sacrificial film 144a may have a single-layer structure or a stacked-layer structure of two or more layers. In the case of the stacked-layer structure, any of the above-described materials can be used.

[Formation of Protective Film 146a]

Next, the protective film 146a is formed over the sacrificial film 144a (FIG. 6B).

The protective film 146a is a film used as a hard mask when the sacrificial film 144a is etched later. In a later step of processing the protective film 146a, the sacrificial film 144a is exposed. Thus, the combination of films having high etching selectivity therebetween is selected for the sacrificial film 144a and the protective film 146a. It is thus possible to select a film that can be used for the protective film 146a depending on an etching condition of the sacrificial film 144a and an etching condition of the protective film 146a.

For example, in the case where dry etching using a gas containing fluorine (also referred to as a fluorine-based gas) is performed for the etching of the protective film 146a, the protective film 146a can be formed using silicon, silicon nitride, silicon oxide, tungsten, titanium, molybdenum, tantalum, tantalum nitride, an alloy containing molybdenum and niobium, an alloy containing molybdenum and tungsten, or the like. Here, for example, a film of a metal oxide such as IGZO or ITO is given as a film having high etching selectivity (i.e., enabling low etching rate) in dry etching using the fluorine-based gas, and such a film can be used as the sacrificial film 144a.

Without being limited to the above, a material of the protective film 146a can be selected from a variety of materials depending on the etching condition of the sacrificial film 144a and the etching condition of the protective film 146a. For example, any of the films that can be used for the sacrificial film 144a can be used.

As the protective film 146a, a nitride film can be used, for example. Specifically, it is possible to use a nitride such as silicon nitride, aluminum nitride, hafnium nitride, titanium nitride, tantalum nitride, tungsten nitride, gallium nitride, or germanium nitride.

Alternatively, as the protective film 146a, an oxide film can be used. Typically, it is possible to use an oxide film or an oxynitride film of silicon oxide, silicon oxynitride, aluminum oxide, aluminum oxynitride, hafnium oxide, hafnium oxynitride, or the like.

As the protective film 146a, an organic film that can be used as the light-emitting and light-receiving film 112SRf to be the light-emitting and light-receiving layer 112SR or the like can be used. For example, the protective film 146a can be formed using the same film as the organic film that is used for the light-emitting and light-receiving film 112SRf, an EL film to be the EL layer 112G, or an EL film to be the EL layer 112B. The use of such an organic film is preferable, in which case the deposition apparatus for the light-emitting and light-receiving film 112SRf or the like can be used in common.

The protective film 146a may have a single-layer structure or a stacked-layer structure of two or more layers. In the case of the stacked-layer structure, any of the above-described materials can be used.

As the stacked-layer structure of the sacrificial film 144a and the protective film 146a over the sacrificial film 144a, a two-layer structure of an In—Ga—Zn oxide formed by a sputtering method and a silicon nitride film formed by a sputtering method can be typically and suitably used. Alternatively, a two-layer structure of an In—Ga—Zn oxide formed by a sputtering method and aluminum oxide formed by an ALD method can be suitably used. Alternatively, a two-layer structure of aluminum oxide formed by an ALD method and an In—Ga—Zn oxide formed by a sputtering method can be suitably used. Each of the sacrificial film 144a and the protective film 146a may have a stacked-layer structure.

[Formation of Resist Mask 143a]

Then, a resist mask 143a is formed in a position being over the protective film 146a and overlapping with the pixel electrode 111SR and a position being over the protective film 146a and overlapping with the connection electrode 111C (FIG. 6C).

For the resist mask 143a, a resist material containing a photosensitive resin such as a positive type resist material or a negative type resist material can be used.

On the assumption that the resist mask 143a is formed over the sacrificial film 144a without the protective film 146a therebetween, there is a risk of dissolving the light-emitting and light-receiving film 112SRf due to a solvent of the resist material if a defect such as a pinhole exists in the sacrificial film 144a. Such a defect can be prevented by using the protective film 146a.

In the case where a film that is unlikely to cause a defect such as a pinhole is used as the sacrificial film 144a, the resist mask 143a may be formed directly on the sacrificial film 144a without using the protective film 146a. [Etching of protective film 146a]

Next, part of the protective film 146a that is not covered with the resist mask 143a is removed by etching, so that a band-shaped protective layer 147a is formed. At that time, the protective layer 147a is formed also over the connection electrode 111C.

In the etching of the protective film 146a, an etching condition with high selectively is preferably employed so that the sacrificial film 144a is not removed by the etching.

Either wet etching or dry etching can be performed as the etching of the protective film 146a; however, a reduction in a pattern of the protective film 146a can be inhibited with use of dry etching.

[Removal of Resist Mask 143a]

Next, the resist mask 143a is removed (FIG. 6D).

The removal of the resist mask 143a can be performed by wet etching or dry etching. It is particularly preferable to perform dry etching (also referred to as plasma ashing) using an oxygen gas as an etching gas to remove the resist mask 143a.

At this time, the removal of the resist mask 143a is performed in a state where the light-emitting and light-receiving film 112SRf is covered with the sacrificial film 144a; thus, the light-emitting and light-receiving film 112SRf is less likely to be affected by the removal. In particular, when the light-emitting and light-receiving film 112SRf is exposed to oxygen, the electrical characteristics are adversely affected in some cases; thus, it is preferable that the light-emitting and light-receiving film 112SRf be covered with the sacrificial film 144a when etching using an oxygen gas, such as plasma ashing, is performed.

[Etching of Sacrificial Film 144a]

Next, part of the sacrificial film 144a that is not covered with the protective layer 147a is removed by etching with use of the protective layer 147a as a mask, so that a band-shaped sacrificial layer 145a is formed (FIG. 6E). At that time, the sacrificial layer 145a is formed also over the connection electrode 111C.

Either wet etching or dry etching can be performed for the etching of the sacrificial film 144a; however, a dry etching method is preferably used because a reduction in a pattern can be inhibited.

[Etching of Light-Emitting and Light-Receiving Film 112SRf and Protective Layer 147a]

Next, part of the light-emitting and light-receiving film 112SRf that is not covered with the sacrificial layer 145a is removed by etching at the same time as etching of the protective layer 147a, whereby the light-emitting and light-receiving layer 112SR having a band shape is formed (FIG. 6F). At that time, the protective layer 147a over the connection electrode 111C is also removed.

The light-emitting and light-receiving film 112SRf and the protective layer 147a are preferably etched by the same treatment so that the process can be simplified to reduce the manufacturing cost of the display apparatus.

In particular, for the etching of the light-emitting and light-receiving film 112SRf, a dry etching method is preferably used. Using an etching gas not containing an oxygen gas is preferable to inhibit a change in quality of the light-emitting and light-receiving film 112SRf and obtain a highly reliable display apparatus. Examples of the etching gas that does not contain an oxygen gas include $CF_4$, $C_4F_8$, $SF_6$, $CHF_3$, $Cl_2$, $H_2O$, $BCl_3$, $H_2$, or a noble gas such as He. Alternatively, a mixed gas of the above gas and a dilution gas that does not contain oxygen can be used as the etching gas.

Note that the etching of the light-emitting and light-receiving film 112SRf and the etching of the protective layer 147a may be performed separately. In that case, either the etching of the light-emitting and light-receiving film 112SRf or the etching of the protective layer 147a may be performed first.

At this step, the light-emitting and light-receiving layer 112SR and the connection electrode 111C are covered with the sacrificial layer 145a.

[Formation of EL film 112Gf]

Subsequently, an EL film 112Gf to be the EL layer 112G later is deposited over the sacrificial layer 145a, the insulating layer 131, the pixel electrode 111G, and the pixel electrode 111B.

The EL film 112Gf includes at least a film containing a light-emitting compound. A structure in which one or more of films functioning as an electron-injection layer, an electron-transport layer, a charge-generation layer, a hole-transport layer, and a hole-injection layer are stacked may be employed in addition to the above. The EL film 112Gf can be formed by, for example, an evaporation method, a sputtering method, an ink-jet method, or the like. Without limitation to this, the above-described deposition method can be used as appropriate.

For example, the EL film 112Gf is preferably a stacked film in which a hole-injection layer, a hole-transport layer, a light-emitting layer, and an electron-transport layer are stacked in this order. In that case, a film including the electron-injection layer can be used as the layer 114 formed later. In particular, by providing the electron-transport layer to cover the light-emitting layer, damage to the light-emitting layer caused by a subsequent photolithography step or the like can be inhibited; thus, the light-emitting device with high reliability can be manufactured. Furthermore, by using layers containing the same organic compound for an electron-transport layer used for the EL film 112Rf or the like and an electron-injection layer used for the layer 114 formed later, these bonding can be favorable and a light-emitting device with high emission efficiency and high reliability can be obtained. For example, an organic compound with an electron-transport property can be used for the electron-transport layer, and a material containing the organic compound and a metal can be used for the electron-injection layer.

In that case, similarly to the light-emitting and light-receiving film 112SRf, the EL film 112Gf is preferably not provided over the connection electrode 111C.

[Formation of Sacrificial Film 144b]

Then, a sacrificial film 144b is formed over the EL film 112Gf. At this time, the sacrificial film 144a is concurrently formed also over the connection electrode 111C so as to cover the sacrificial layer 145a.

The sacrificial film 144b can be formed in a manner similar to that for the sacrificial film 144a. In particular, the sacrificial film 144b and the sacrificial film 144a are preferably formed using the same material. The description of the sacrificial film 144a can be referred to for the sacrificial film 144b; thus, the detailed description is omitted.

[Formation of Protective Film 146b]

Next, a protective film 146b is formed over the sacrificial film 144b.

The protective film 146b can be formed in a manner similar to that for the protective film 146a. In particular, the protective film 146b and the protective film 146a are preferably formed using the same material. The description of the protective film 146a can be referred to for the protective film 146b; thus, the detailed description is omitted.

[Formation of resist mask 143b]

Figures 7A, 7B, 7C, 7D, 7E, 7F:
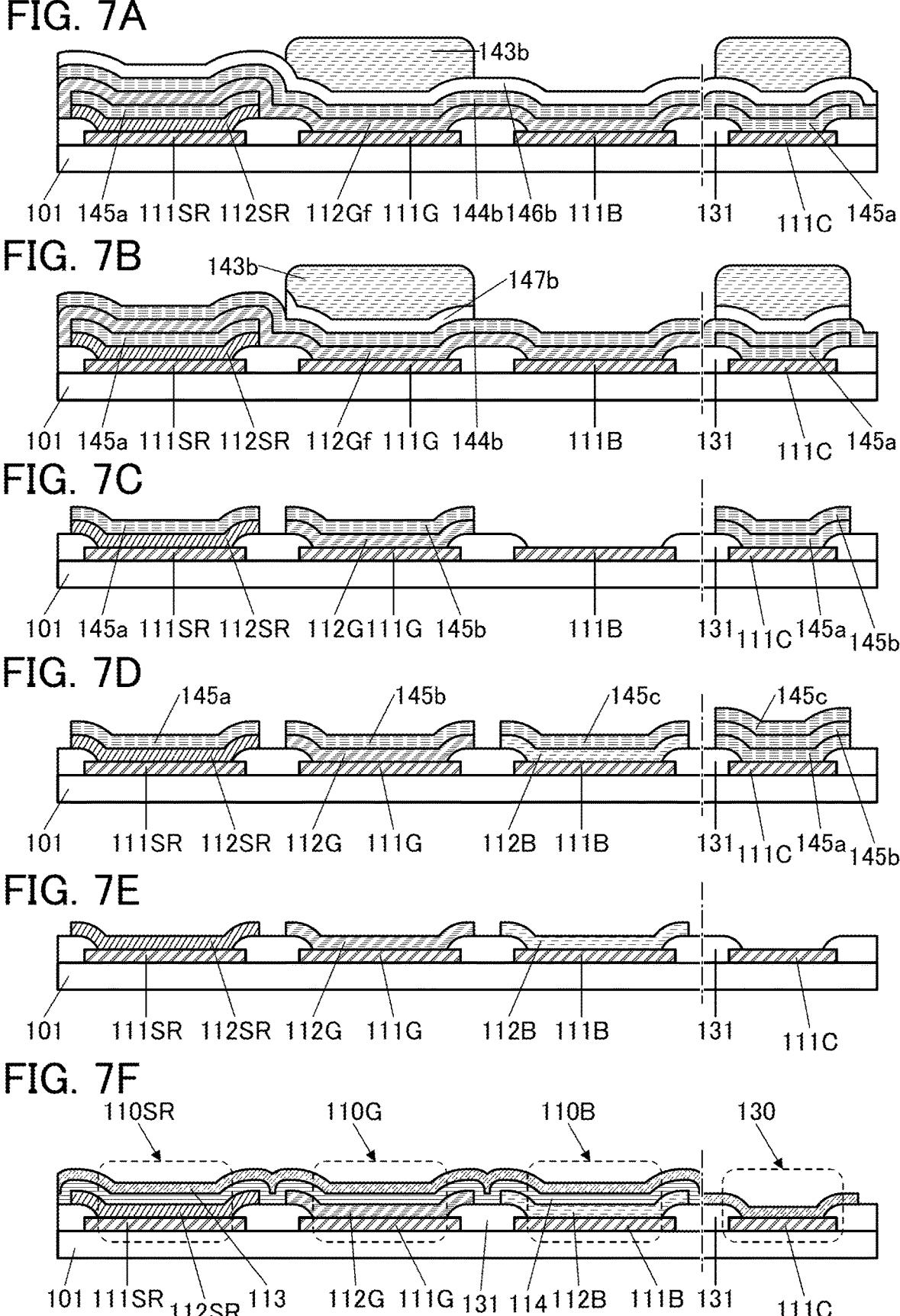
FIG. 7A to FIG. 7F are diagrams illustrating the manufacturing method example of a display apparatus.

Then, a resist mask 143b is formed in a region being over the protective film 146b and overlapping with the pixel electrode 111G and a region being over the protective film 146b and overlapping with the connection electrode 111C (FIG. 7A).

The resist mask 143b can be formed in a manner similar to that for the resist mask 143a.

[Etching of protective film 146b]

Next, part of the protective film 146b that is not covered with the resist mask 143b is removed by etching, so that a band-shaped protective layer 147b is formed (FIG. 7B). At that time, the protective layer 147b is formed also over the connection electrode 111C.

For the etching of the protective film 146b, the above description of the protective film 146a can be referred to.

[Removal of Resist Mask 143b]

Next, the resist mask 143a is removed. For the removal of resist mask 143b, the above description of the resist mask 143a can be referred to.

[Etching of Sacrificial Film 144b]

Next, part of the sacrificial film 144b that is not covered with the protective layer 147b is removed by etching with use of the protective layer 147b as a mask, so that a band-shaped sacrificial layer 145b is formed. At that time, the sacrificial layer 145b is formed also over the connection electrode 111C. The sacrificial layer 145a and the sacrificial layer 145b are stacked over the connection electrode 111C.

For the etching of the sacrificial film 144b, the above description of the sacrificial film 144a can be referred to.

[Etching of EL Film 112Gf and Protective Layer 147b]

Next, the protective layer 147b and part of the EL film 112Gf that is not covered with the sacrificial layer 145b are removed by etching at the same time, so that the band-shaped EL layer 112G is formed (FIG. 7C). At that time, the protective layer 147b over the connection electrode 111C is also removed.

For the etching of the EL film 112Gf and the protective layer 147b, the above description of the light-emitting and light-receiving film 112SRf and the protective layer 147a can be referred to.

At this time, the light-emitting and light-receiving layer 112SR is protected by the sacrificial layer 145a, and thus can be prevented from being damaged in the etching step of the EL film 112Gf.

In the above manner, the band-shaped light-emitting and light-receiving layer 112SR and the band-shaped EL layer 112G can be separately formed with high alignment accuracy

[Formation of EL Layer 112B]

The above-described steps from the formation of the EL film to the etching of the EL film and the protective layer is performed on an EL film to be the EL layer 112B, whereby the island-shaped EL layer 112B and an island-shaped sacrificial layer 145c over the island-shaped EL layer 112B can be formed (FIG. 7D).

Specifically, after the formation of the EL layer 112G, an EL film to be the EL layer 112B, a sacrificial film to be the sacrificial layer 145c, a protective film to be a protective layer, and a resist mask are sequentially formed. After that, the protective film is etched to form a protective layer; then, the resist mask is removed. Subsequently, the sacrificial film is etched to form the sacrificial layer 145c. Then, the protective layer and the EL film are etched to form the band-shaped EL layer 112B.

In formation of the EL layer 112B, the sacrificial layer 145c is formed over the connection electrode 111C. The sacrificial layer 145a, the sacrificial layer 145b, and the sacrificial layer 145c are stacked over the connection electrode 111C.

In this embodiment, an example of forming the light-emitting and light-receiving layer and the EL layers in the order of the light-emitting and light-receiving layer 112SR, the EL layer 112G, and the EL layer 112B is described; however, the formation order of the light-emitting and light-receiving layer and the EL layers is not particularly limited. For example, the EL layer 112B, the light-emitting and light-receiving layer 112SR, and the EL layer 112G may be formed in this order.

[Removal of Sacrificial Layer]

Next, the sacrificial layer 145a, the sacrificial layer 145b, and the sacrificial layer 145c are removed to expose the top surfaces of the light-emitting and light-receiving layer 112SR, the EL layer 112G, and the EL layer 112B (FIG. 7E). At that time, the top surface of the connection electrode 111C is also exposed.

The sacrificial layer 145a, the sacrificial layer 145b, and the sacrificial layer 145c can be removed by wet etching or dry etching. At this time, a method that causes damage to the light-emitting and light-receiving layer 112SR, the EL layer 112G, and the EL layer 112B as little as possible is preferably employed. In particular, a wet etching method is preferably used. For example, wet etching using a tetramethyl ammonium hydroxide (TMAH) solution, diluted hydrofluoric acid, oxalic acid, phosphoric acid, acetic acid, nitric acid, or a mixed solution of any of these acids is preferably performed.

Alternatively, the sacrificial layer 145a, the sacrificial layer 145b, and the sacrificial layer 145c are preferably removed by being dissolved in a solvent such as water or alcohol. Examples of the alcohol in which the sacrificial layer 145a, the sacrificial layer 145b, and the sacrificial layer 145c can be dissolved include ethyl alcohol, methyl alcohol, isopropyl alcohol (IPA), and glycerin.

After the sacrificial layer 145a, the sacrificial layer 145b, and the sacrificial layer 145c are removed, drying treatment is preferably performed in order to remove water contained in the light-emitting and light-receiving layer 112SR, the EL layer 112G, and the EL layer 112B and water adsorbed on the surfaces of the light-emitting and light-receiving layer 112SR, the EL layer 112G, and the EL layer 112B. For example, heat treatment is preferably performed in an inert gas atmosphere or a reduced-pressure atmosphere. The heat treatment can be performed at a substrate temperature higher than or equal to 50° C. and lower than or equal to 200° C., preferably higher than or equal to 60° C. and lower than or equal to 150° C., further preferably higher than or equal to 70° C. and lower than or equal to 120° C. The heat treatment is preferably performed in a reduced-pressure atmosphere because drying at a lower temperature is possible.

In the above manner, the light-emitting and light-receiving layer 112SR, the EL layer 112G, and the EL layer 112B can be separately formed.

[Formation of Layer 114]

Then, the layer 114 is deposited to cover the light-emitting and light-receiving layer 112SR, the EL layer 112G, and the EL layer 112B.

The layer 114 can be formed in a manner similar to that of the light-emitting and light-receiving film 112SRf or the like. In the case where the layer 114 is deposited by an evaporation method, the layer 114 is preferably deposited using a shielding mask so as not to be deposited over the connection electrode 111C.

[Formation of Common Electrode 113]

Then, the common electrode 113 is formed to cover the layer 114 and the connection electrode 111C (FIG. 7F).

The common electrode 113 can be formed by a deposition method such as an evaporation method or a sputtering method. Alternatively, a film formed by an evaporation method and a film formed by a sputtering method may be stacked. In that case, the common electrode 113 is preferably formed so as to cover a region where the layer 114 is deposited. That is, a structure in which end portions of the layer 114 overlap with the common electrode 113 can be obtained. The common electrode 113 is preferably formed using a shielding mask.

The common electrode 113 is electrically connected to the connection electrode 111C outside a display region.

[Formation of Protective Layer]

Next, the protective layer 121 is formed over the common electrode 113. An inorganic insulating film used for the protective layer 121 is preferably deposited by a sputtering method, a PECVD method, or an ALD method. In particular, an ALD method is preferable because a film deposited by ALD method has excellent step coverage and is less likely to cause a defect such as pinhole. An organic insulating film is preferably deposited by an ink-jet method because a uniform film can be formed in a desired area.

Through the above steps, the display apparatus 100 illustrated in FIG. 2B and FIG. 2C can be manufactured.

Although the case where the common electrode 113 and the layer 114 are formed so as to have different top surface shapes is described above, they may be formed in the same region.

Figures 8A, 8B, 8C:
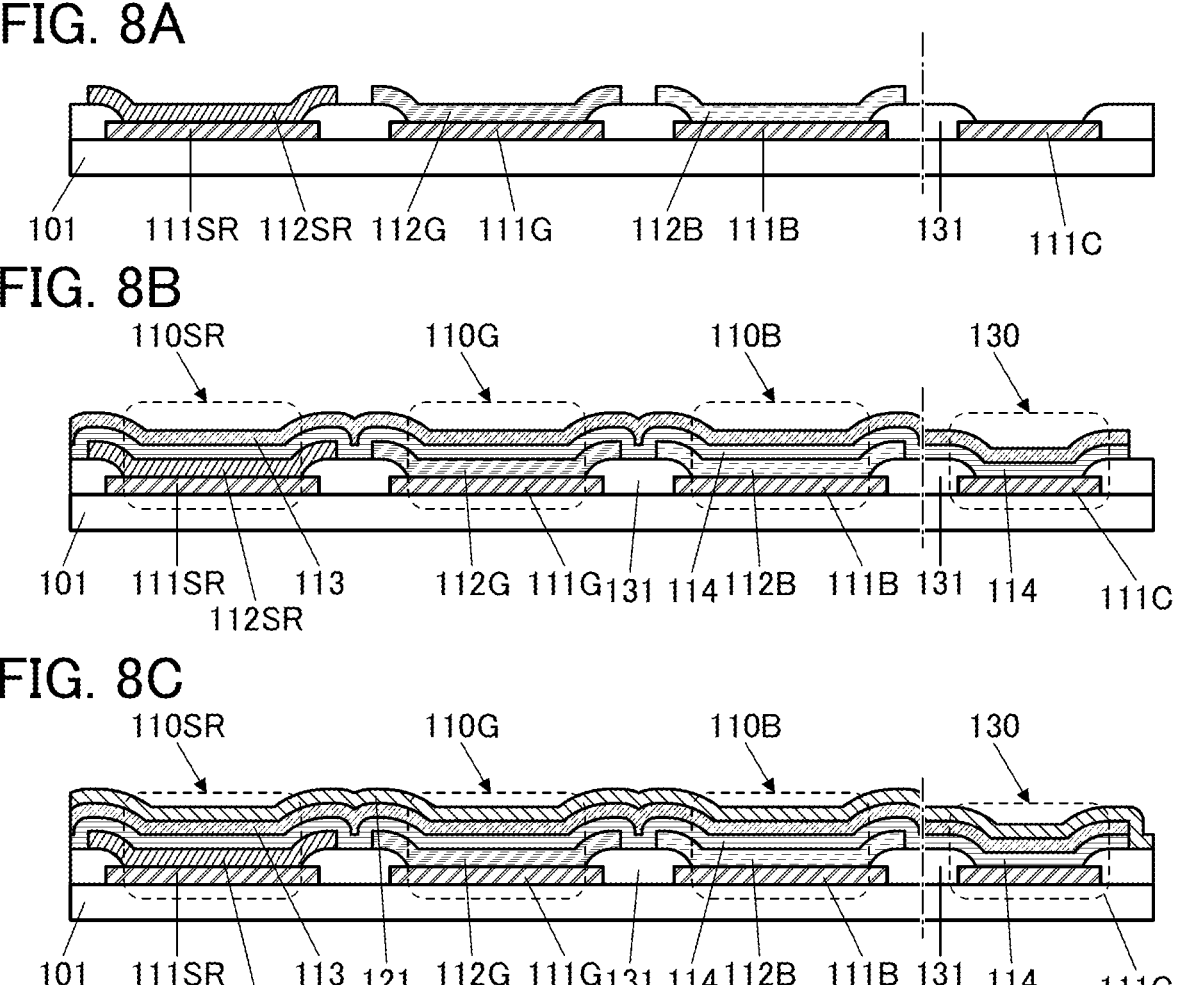
FIG. 8A to FIG. 8C are diagrams illustrating the manufacturing method example of a display apparatus.

FIG. 8A is a schematic cross-sectional view after removal of the sacrificial layer in the above description. Next, as illustrated in FIG. 8B, the layer 114 and the common electrode 113 are formed using the same shielding mask or without using a shielding mask. Thus, manufacturing cost can be reduced as compared with the case of using different shielding masks.

As illustrated in FIG. 8B, in the connection portion 130, the layer 114 is provided between the connection electrode 111C and the common electrode 113. At this time, for the layer 114, a material with as low electric resistance as possible is preferably used. Alternatively, it is preferable to form the layer 114 as thin as possible, in which case the electric resistance of the layer 114 in the thickness direction can be reduced. For example, the layer 114 can be formed using a material having an electron-injection property or a hole-injection property having a thickness greater than or equal to 1 nm and less than or equal to 5 nm, preferably greater than or equal to 1 nm and less than or equal to 3 nm, whereby the electric resistance between the connection electrode 111C and the common electrode 113 can be made negligible in some cases.

Subsequently, the protective layer 121 is formed as illustrated in FIG. 8C. At this time, as illustrated in FIG. 8C, the protective layer 121 is preferably provided to cover end portions of the common electrode 113 and the end portions of the layer 114. Accordingly, diffusion of impurities such as water or oxygen from the outside to the layer 114 and the interface between the layer 114 and the common electrode 113 can be effectively prevented.

The above is the description of an example of the method for manufacturing the display apparatus.

Structure Example 2

A structure example of a display apparatus whose structure is partly different from that of the above-described structure example 1 is described below. Description of the portions similar to those described above is omitted below in some cases.

A display apparatus 100A illustrated in FIG. 9A to FIG. 9D is different from the display apparatus 100 mainly in the shapes of the layer 114 and the common electrode 113.

Figure 9A:
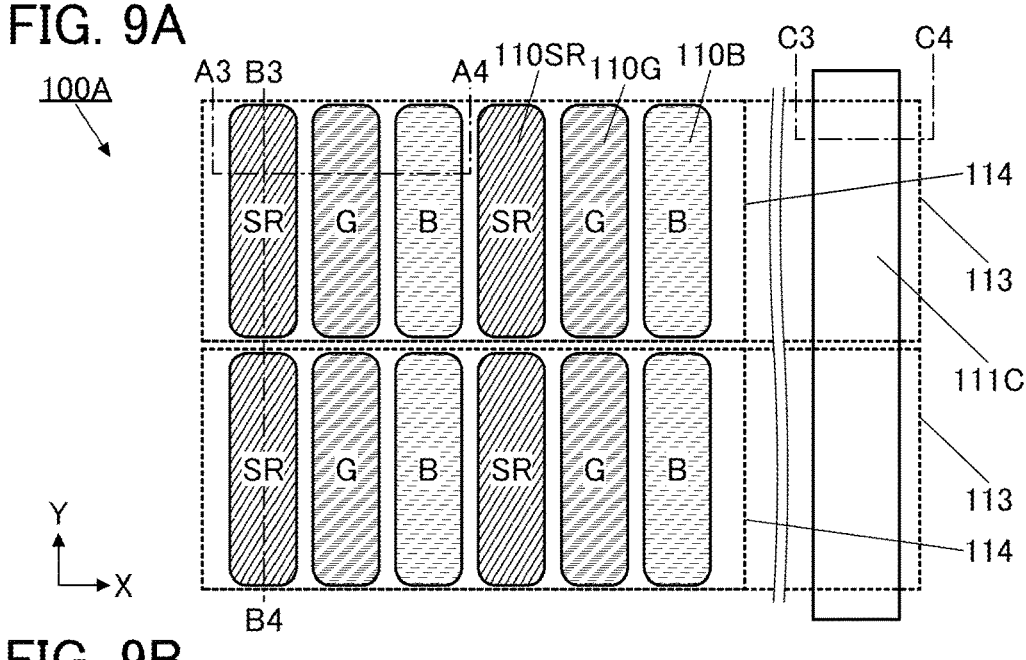
FIG. 9A to FIG. 9D are diagrams illustrating a structure example of a display apparatus.
Figure 9B:
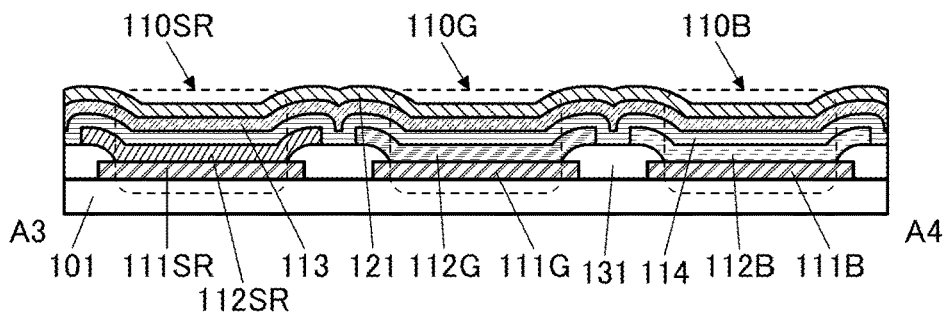
Figure 9C:
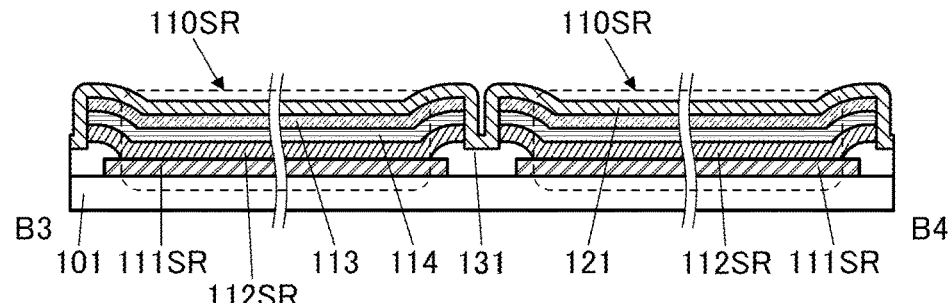
Figure 9D:
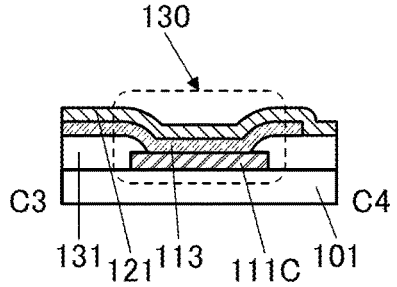

As illustrated in FIG. 9C, in a cross section in the Y direction, the light-emitting and light-receiving layer 112SR, the layer 114, and the common electrode 113 are separated between two of the light-emitting and light-receiving devices 110SR. In other words, each of the light-emitting and light-receiving layer 112SR, the layer 114, and the common electrode 113 has end portions in portions overlapping with the insulating layer 131.

In addition, the protective layer 121 is provided to cover side surfaces of each of the light-emitting and light-receiving layer 112SR, the layer 114, and the common electrode 113 in the region overlapping with the insulating layer 131.

As illustrated in FIG. 9C, a recessed portion may be formed on part of a top surface of the insulating layer 131. At this time, the protective layer 121 is preferably provided along and in contact with surfaces of the depressed portion of the insulating layer 131. This is preferable because the contact area between the insulating layer 131 and the protective layer 121 is increased and the adhesion between them is improved.

In FIG. 9A, the outline of the common electrode 113 and the layer 114 is denoted by a dashed line. As illustrated in FIG. 9A, the common electrode 113 and the layer 114 each have a band-shaped top surface shape with a longitudinal direction parallel to the X direction. By contrast, as illustrated in FIG. 9B and FIG. 9C, the light-emitting and light-receiving layer 112SR has an island shape.

Note that although not illustrated here, the light-emitting device 110G and the light-emitting device 110B can have a similar structure.

Manufacturing Method Example 2

An example of a method for manufacturing the above-described display apparatus 100A is described below. Note that the above-described manufacturing method example 1 is referred to for portions similar to those described in manufacturing method example 1, and description of the portions is omitted below. The manufacturing method example described here is different from the above-described manufacturing method example 1 in steps after the formation step of the common electrode 113.

FIG. 10A to FIG. 10D each illustrate a schematic cross-sectional view of a step described below as an example. Here, a cross section taken along the dashed-dotted line B3-B4 and a cross section taken along the dashed-dotted line C3-C4 in FIG. 9A are illustrated side by side.

Figures 10A, 10B, 10C, 10D, 10E:
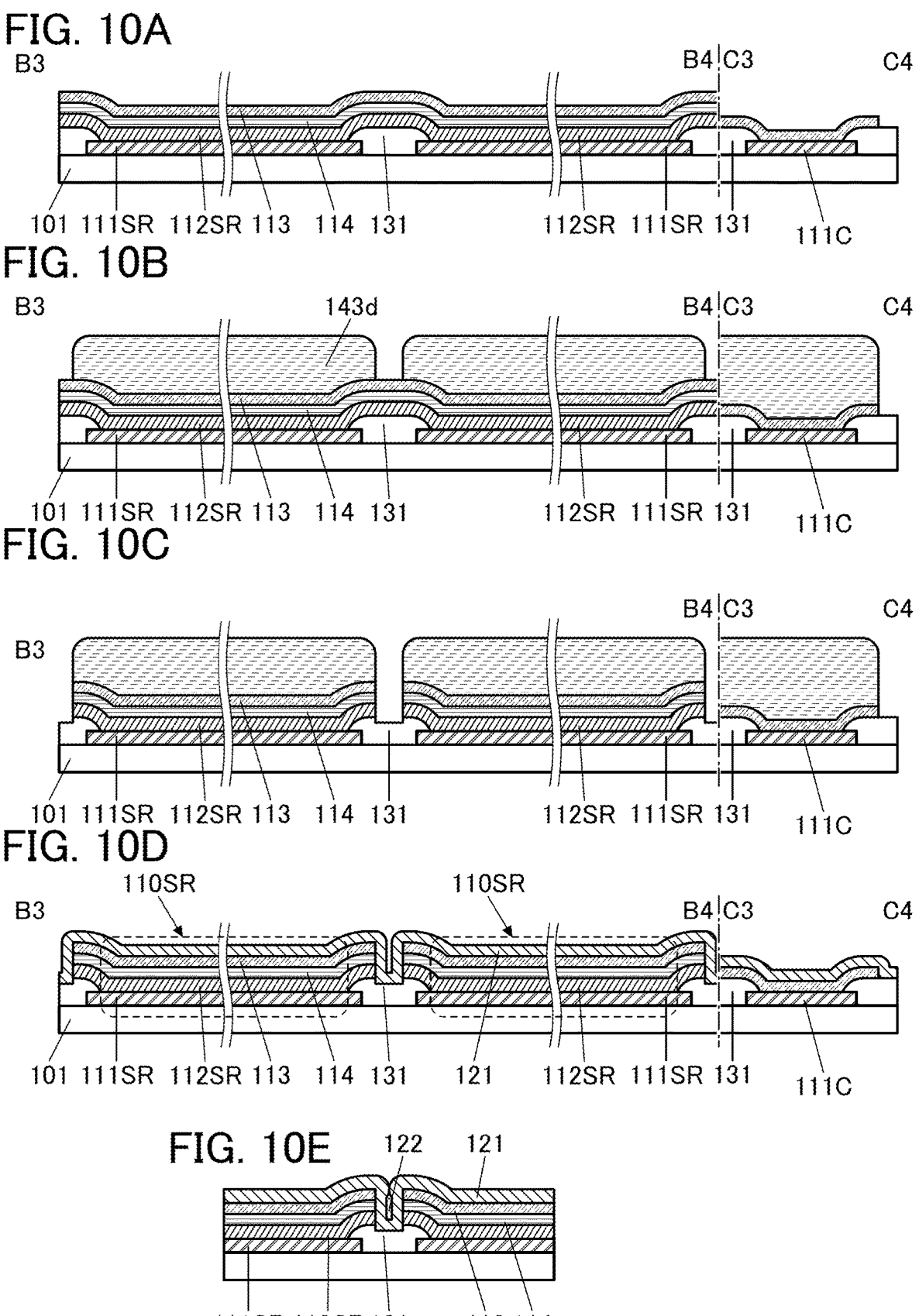
FIG. 10A to FIG. 10E are diagrams illustrating a manufacturing method example of a display apparatus.

The steps are performed sequentially up to the formation of the common electrode 113 as in the manufacturing method example 1 (FIG. 10A).

Next, a plurality of resist masks 143d are formed over the common electrode 113 (FIG. 10B). The resist mask 143d is formed to have a band-shaped top surface shape extending in the X direction. The resist mask 143d overlaps with the pixel electrode 111SR. End portions of the resist mask 143d are provided over the insulating layer 131.

Next, portions of the common electrode 113, the layer 114, the light-emitting and light-receiving layer 112SR, the EL layer 112G (not illustrated), and the EL layer 112B (not illustrated) that are not covered with the resist mask 143d are removed by etching (FIG. 10C). Accordingly, the common electrode 113 and the layer 114 that have been covering the entire pixel electrodes and provided continuously are divided with a slit formed by the etching, so that the plurality of band-shaped common electrodes 113 and the layers 114 are formed.

Etching is preferably performed by dry etching. For example, by changing the etching gas, the common electrode 113, the layer 114, the light-emitting and light-receiving layer 112SR, and the like are preferably etched successively without exposure to the air. Furthermore, a gas that does not contain oxygen as its main component is preferably used as the etching gas.

In the etching for the electrode 113, the layer 114, the light-emitting and light-receiving layer 112SR, and the like, part of the insulating layer 131 may be etched, so that the recessed portion may be formed in the upper portion of the insulating layer 131 as illustrated in FIG. 10C. Alternatively, portions of the insulating layer 131 that are not covered with the resist mask 143d are etched and divided into two in some cases.

Next, the resist masks 143d are removed. The removal of the resist masks 143d can be performed by wet etching or dry etching.

Next, the protective layer 121 is formed (FIG. 10D). The protective layer 121 is provided to cover a side surface of the common electrode 113. a side surface of the EL layer 114, and a side surface of the light-emitting and light-receiving layer 112SR. The protective layer 121 is preferably provided in contact with the top surface of the insulating layer 131.

As illustrated in FIG. 10E, a void (also referred to as a gap, a space, or the like) 122 is sometimes formed over the insulating layer 131 at the time of forming the protective layer 121. The void 122 may be in a reduced pressure state or in an atmospheric pressure. A gas such as air, nitrogen, or a noble gas or a deposition gas used for depositing the protective layer 121 may be contained.

The above is the description of the manufacturing method example of the display apparatus 100A.

Note that although the resist mask 143d is directly formed over the common electrode 113, a film functioning as a hard mask may be provided over the common electrode 113. At this time, a hard mask can be formed using the resist mask 143d as a mask and after the resist mask is removed, the hard mask can be used a mask, whereby the common electrode 113, the layer 114, the light-emitting and light-receiving layer 112SR, and the like can be etched. Note that the hard mask may be removed or left at this time.

Modification Example

An example whose structure is partly different from that of the above-described example is described below. Note that in the description below, the above description is referred to for portions similar to those described above and the portions are not described.

Modification Example 1

Figure 11A:
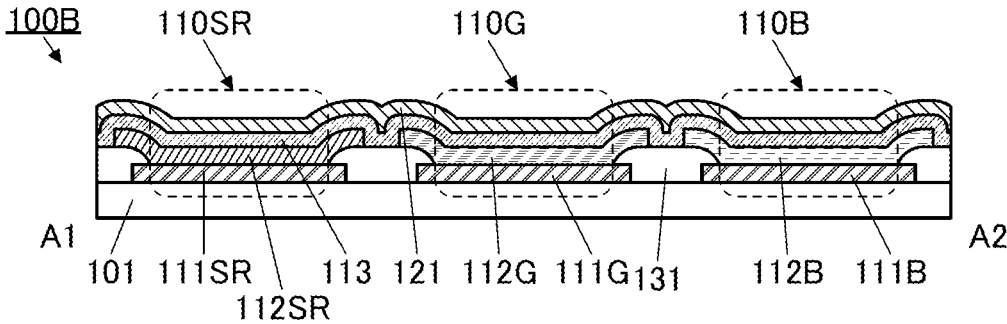
FIG. 11A to FIG. 11C are diagrams illustrating structure examples of display apparatuses.
Figure 11B:
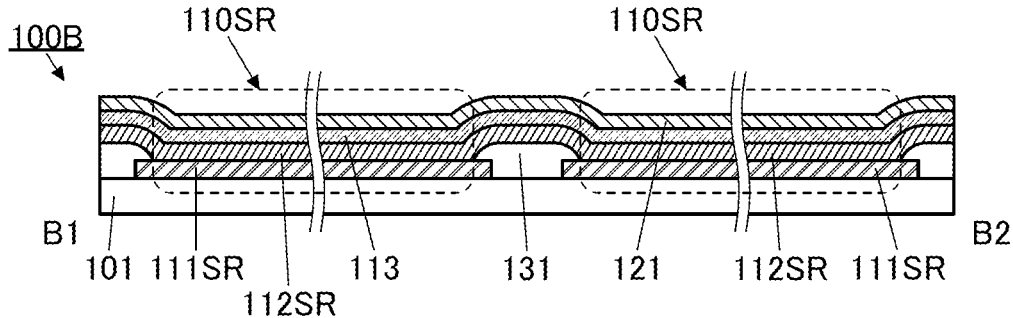

FIG. 11A and FIG. 11B are schematic cross-sectional views of a display apparatus 100B. A top view of the display apparatus 100B is similar to that in FIG. 2A. FIG. 11A corresponds to a cross section in the X direction, and FIG. 11B corresponds to a cross section in the Y direction. The display apparatus 100B is different from the display apparatus 100 mainly in not including the layer 114, which is a common layer.

The common electrode 113 is provided in contact with the top surfaces of the light-emitting and light-receiving layer 112SR, the EL layer 112G, and the EL layer 112B. Since the layer 114 is not provided, the light-emitting and light-receiving device 110SR, the light-emitting element 110G, and the light-emitting element 110B can have significantly different stacked-layer structures; thus, options for materials increase, which can increase the design flexibility.

Figure 11C:
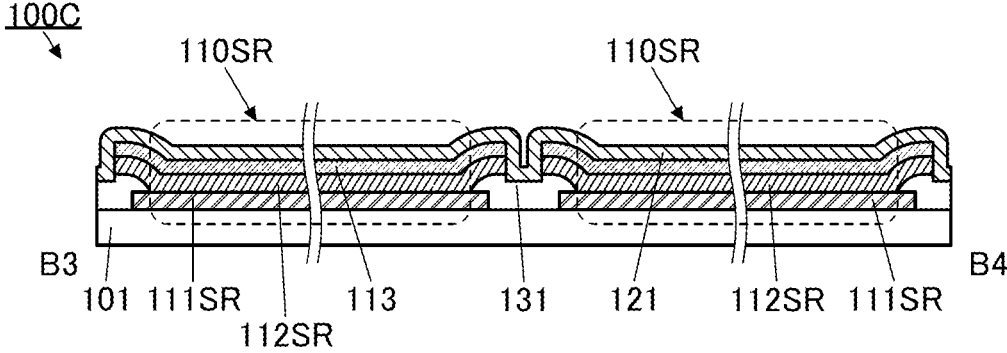

A display apparatus 100C illustrated in FIG. 11C is, as in the display apparatus 100A, an example of a case where a slit extending in the X direction is formed in a region where the common electrode 113 overlaps with the insulating layer 131. In the display apparatus 100C, the protective layer 121 is provided in contact with the side surface of the common electrode 113, the side surface of the light-emitting and light-receiving layer 112SR, and the top surface of the insulating layer 131.

Modification Example 2

Figure 12A:
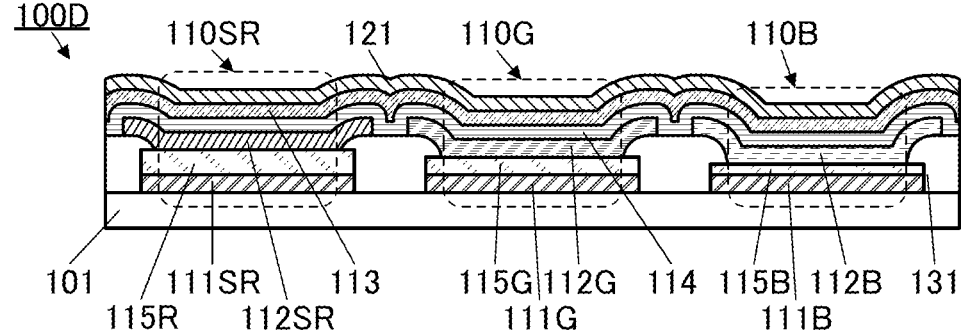
FIG. 12A to FIG. 12C are diagrams illustrating structure examples of display apparatuses.
Figure 12B:
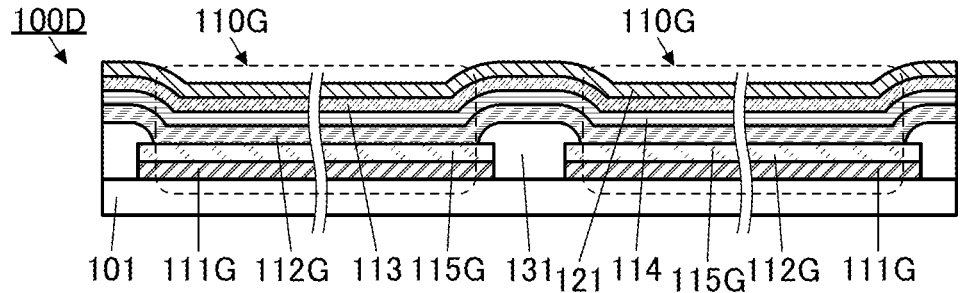

A display apparatus 100D illustrated in FIG. 12A and FIG. 12B is different from the display apparatus 100 mainly in the structure of light-emitting devices.

The light-emitting and light-receiving device 110SR includes an optical adjustment layer 115R between the pixel electrode 111SR and the light-emitting and light-receiving layer 112SR. The light-emitting device 110G includes an optical adjustment layer 115G between the pixel electrode 111G and the EL layer 112G. The light-emitting device 110B includes an optical adjustment layer 115B between the pixel electrode 111B and the EL layer 112B.

Furthermore, the optical adjustment layer 115R, the optical adjustment layer 115G, and the optical adjustment layer 115B each have a light-transmitting property with respect to visible light. The optical adjustment layer 115R, the optical adjustment layer 115G, and the optical adjustment layer 115B have different thicknesses. Thus, the optical path lengths of the light-emitting devices can differ from one another.

Here, a conductive film that has a reflective property with respect to visible light is used for the pixel electrode 111SR, the pixel electrode 111G, and the pixel electrode 111B, and a conductive film that has a reflective property and a transmitting property with respect to visible light is used for the common electrode 113. Thus, the light-emitting devices have what is called a microcavity structure, thereby increasing the intensity of light with a specific wavelength. Accordingly, a display apparatus with high color purity can be achieved.

A conductive material that has a property of transmitting visible light can be used for each of the optical adjustment layers. For example, a conductive oxide such as indium oxide, indium tin oxide, indium zinc oxide, zinc oxide, zinc oxide containing gallium, indium tin oxide containing silicon, or indium zinc oxide containing silicon can be used.

The optical adjustment layers can be formed after the formation of the pixel electrode 111SR, the pixel electrode 111G, and the pixel electrode 111B and before the formation of the light-emitting and light-receiving film 112SRf or the like. The optical adjustment layers may be formed using conductive films with different thicknesses or may have a single-layer structure, a two-layer structure, a three-layer structure, or the like from the smallest thickness to the largest thickness.

Figure 12C:
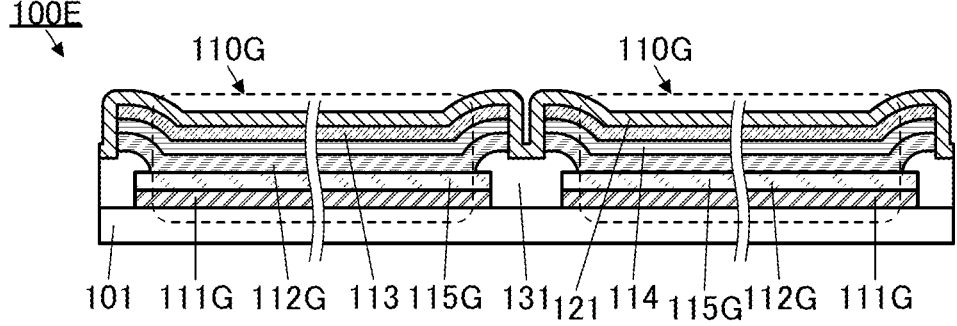

A display apparatus 100E illustrated in FIG. 12C is an example of a case of the display apparatus 100A in which an optical adjustment layer is used. FIG. 12C illustrates a cross section of the two light-emitting devices 110G that are arranged side by side in the Y direction.

Modification Example 3

Figure 13A:
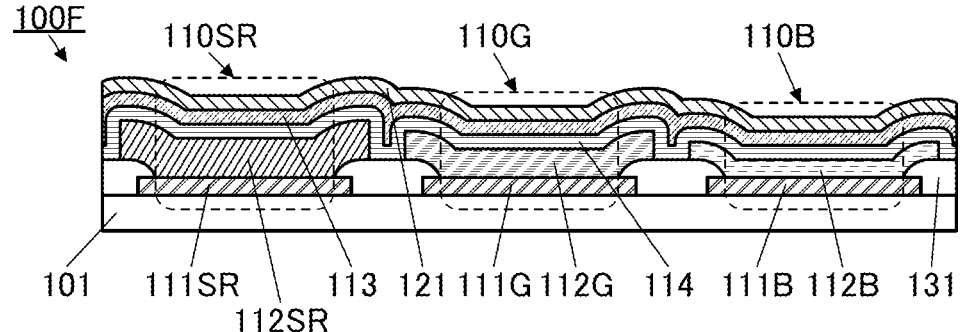
FIG. 13A to FIG. 13C are diagrams illustrating structure examples of display apparatuses.
Figure 13B:
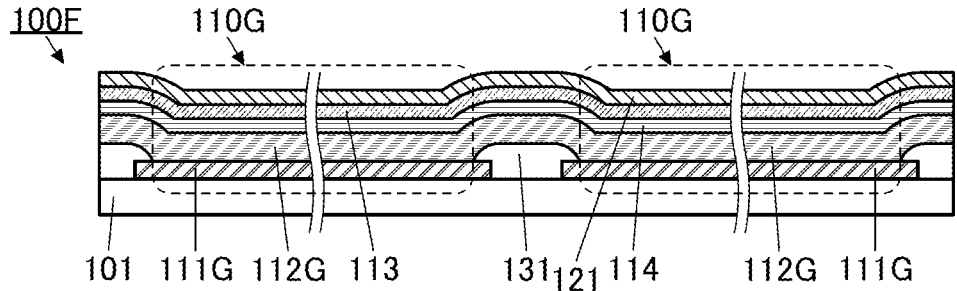

A display apparatus 100F illustrated in FIG. 13A and FIG. 13B is different from the display apparatus 100D mainly in not including an optical adjustment layer.

The display apparatus 100F is an example in which a microcavity structure with different thicknesses of the light-emitting and light-receiving layer 112SR, the EL layer 112G, and the EL layer 112B is achieved. With such a structure, an optical adjustment layer does not need to be provided additionally, leading to simplification of the process.

For example, in the display apparatus 100C, the light-emitting and light-receiving layer 112SR of the light-emitting and light-receiving device 110SR emitting light with the longest wavelength has the largest thickness, and the EL layer 112B of the light-emitting device 110B emitting light with the shortest wavelength has the smallest thickness. Without limitation to this, the thicknesses of the EL layers can be adjusted in consideration of the wavelengths of light emitted from the light-emitting devices, the optical characteristics of the layers included in the light-emitting devices, the electrical characteristics of the light-emitting devices, and the like.

Figure 13C:
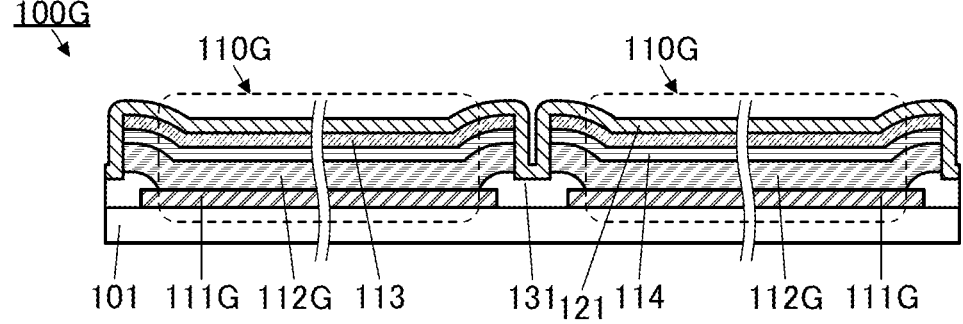

A display apparatus 100G illustrated in FIG. 13C is an example in which a microcavity structure is achieved by changing the thickness of the EL layers of the display apparatus 100A. FIG. 13C illustrates a cross section of the two light-emitting devices 110G that are arranged side by side in the Y direction.

The above is the description of the modification example.

Note that although examples using the layer 114 are described in the modification example 2 and the modification example 3, a structure in which the layer 114 is not provided may be employed.

Figure 14A:
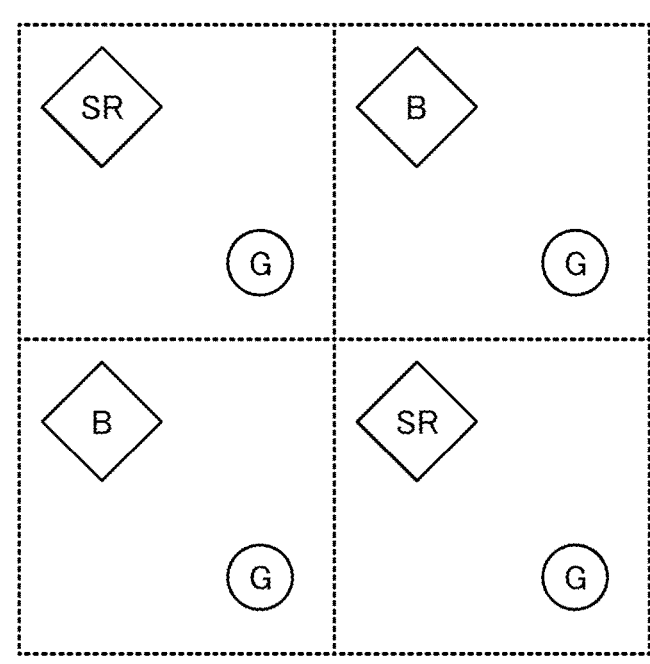
FIG. 14A to FIG. 14C are top views illustrating pixel examples.
Figures 14B, 14C:
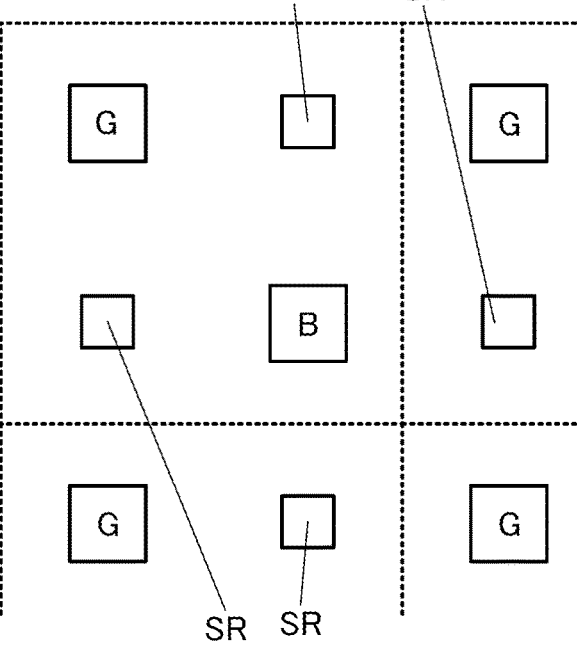

FIG. 14A to FIG. 14C illustrate structure examples different from the pixels illustrated in FIG. 1E to FIG. 1H.

Pixels illustrated in FIG. 14A employ a PenTile arrangement and each include subpixels emitting light of two colors; the combination of two colors is different depending on the pixel. The upper left pixel and the lower right pixel in FIG. 14A each include the subpixel (SR) that emits red light and has a light-receiving function and the subpixel (G) that emits green light. The lower left pixel and the upper right pixel in FIG. 14A each include the subpixel (G) that emits green light and the subpixel (B) that emits blue light. Note that the shapes of the subpixels illustrated in FIG. 14A each indicate a top-surface shape of the light-emitting device or the light-emitting and light-receiving device included in the subpixel.

FIG. 14B is a modification example of the pixel arrangement illustrated in FIG. 14A. The upper left pixel and the lower right pixel in FIG. 14B each include the subpixel (SR) that emits red light and has a light-receiving function and the subpixel (G) that emits green light. The lower left pixel and the upper right pixel in FIG. 14B each include the subpixel (SR) that emits red light and has a light-receiving function and the subpixel (B) that emits blue light.

In FIG. 14A, the subpixel (G) that emits green light is provided in each pixel. In FIG. 14B, the subpixel (SR) that emits red light and has a light-receiving function is provided in each pixel. The structure illustrated in FIG. 14B achieves higher-resolution image capturing than the structure illustrated in FIG. 14B because a subpixel having a light-receiving function is provided in each pixel. Thus, the accuracy of biometric authentication can be increased, for example.

The top-surface shapes of the light-emitting devices and the light-emitting and light-receiving devices are not particularly limited and can be a circular shape, an elliptical shape, a polygonal shape, a polygonal shape with rounded corners, or the like. The top surface shape of the light-emitting devices included in the subpixels (G) is a circular in the example in FIG. 14A and square in the example in FIG. 14B. The top surface shape of the light-emitting devices and the light-emitting and light-receiving devices may vary depending on the color thereof, or the light-emitting devices and the light-emitting and light-receiving devices of some colors or every color may have the same top surface shape.

The aperture ratio of subpixels may vary depending on the color of the subpixels, or may be the same among the subpixels of some colors or every color. For example, the aperture ratio of a subpixel provided in each pixel (the subpixel (G) in FIG. 14A, and the subpixel (SR) in FIG. 14B) may be made lower than that of a subpixel of another color.

FIG. 14C is a modification example of the pixel arrangement illustrated in FIG. 14B. Specifically, the structure of FIG. 14C is obtained by rotating the structure of FIG. 14B by 45°. Although one pixel is regarded as being formed of two subpixels in FIG. 14B, one pixel can be regarded as being formed of four subpixels as illustrated in FIG. 14C.

In the description with reference to FIG. 14C, one pixel is regarded as being formed of four subpixels surrounded by dotted lines. A pixel includes two subpixels (SR), one subpixel (G), and one subpixel (B). The pixel including a plurality of subpixels each having a light-receiving function allows high-resolution image capturing. Accordingly, the accuracy of biometric authentication can be increased. For example, the resolution of image capturing can be the square root of 2 times the resolution of display.

A display apparatus which employs the structure illustrated in FIG. 14B or FIG. 14C includes p (p is an integer greater than or equal to 2) first light-emitting devices, q (q is an integer greater than or equal to 2) second light-emitting devices, and r (r is an integer greater than p and greater than q) light-emitting and light-receiving devices. As for p and r, r=2p is satisfied. As for p, q, and r, r=p+q is satisfied. Either the first light-emitting devices or the second light-emitting devices emit green light, and the other light-emitting devices emit blue light. The light-emitting and light-receiving devices emit red light and have a light-receiving function.

As described above, the display apparatus of one embodiment of the present invention can employ pixels with a variety of arrangements.

Structure Example 3

FIG. 15A illustrates a structure example different from that of the display apparatus 50B illustrated in FIG. 1B.

A display apparatus 50C illustrated in FIG. 15A differs from the display apparatus 50B illustrated in FIG. 1B mainly in that the layer 57 including the light-emitting devices emit green (G) light, blue (B) light, and infrared (IR) light.

The light-emitting and light-receiving device included in the layer 53 can detect light that enters from the outside of the display apparatus 50C. The light-emitting and light-receiving device can detect one or more of infrared (IR) light, green (G) light, and blue (B) light, for example.

FIG. 15A schematically illustrates infrared (IR) light, green (G) light, and green (G) light emitted from the layer 57, red (R) light emitted from the layer 57, and light that enters the layer 53 with arrows.

The display apparatus 50C has a function of detecting an object such as a finger that is in contact with the display apparatus and further can capture an image of one or both of the shape of a vein and the shape of a fingerprint of a finger that is in contact with the display apparatus 50C. The target of image capturing by the display apparatus 50C is not particularly limited to the shape of a finger vein and the shape of a fingerprint, and image capturing of one or both of the shape of a palm vein and the shape of a palm print is possible, for example. FIG. 15B illustrates a state in which the finger 52 touches the surface of the display apparatus 50C. At this time, part of infrared (IR) light emitted from the layer 57 is reflected by the surface or inside of the finger 52 and part of the reflected light enters the layer 57. Accordingly, information about the position that the finger 52 touches can be obtained. An image of one or both of the shape of a vein and the shape of a fingerprint of the finger 52 can be captured.

The display apparatus 50C may have a function of detecting an object that is approaching (but is not in contact with) the display apparatus. For example, as illustrated in FIG. 15C, light emitted from the layer 57 of the display apparatus 50C is reflected by the approaching finger 52, and the reflected light is detected by the layer 53. Thus, an approach of the finger 52 to the display apparatus 50C can be detected. For example, the display apparatus 50C can function as a contactless touch panel. Depending on the distance between the finger 52 and the display apparatus, the shape of a fingerprint or a vein can be obtained in some cases. In such a case, a module or an electronic device including the display apparatus can functions as a contactless biometric authentication device.

The display apparatus 50C can capture an image of not only a living body but also a variety of objects that are in contact with or approach the surface of the display apparatus. Thus, the display apparatus 50C can also be used as an image sensor panel. For example, the light-emitting devices and the light-emitting and light-receiving device of the respective colors are made to emit light sequentially, and image capturing is performed every light emission by the light-emitting and light-receiving device. The obtained images are synthesized, so that a color image can be obtained. In other words, an electronic device including the display apparatus 50C can also be used as an image scanner capable of color image capturing. When an image is captured by the light-emitting and light-receiving device in a state where infrared (IR) light is emitted, an electronic device including the display apparatus 50C can be used as an image scanner using infrared light.

FIG. 15D to FIG. 15F illustrate pixel examples. The pixel includes a subpixel (SR) that emits red light and has a light-receiving function, a subpixel (G) that emits green light, a subpixel (B) that emits blue light, and a subpixel (IR) that emits infrared light.

The pixel illustrated in FIG. 15D shows an example employing subpixels with a stripe arrangement.

The pixel illustrated in FIG. 15E shows an example employing subpixels with a matrix arrangement.

FIG. 15F illustrates an example in which the subpixel (IR) is positioned in a row different from that of the subpixel (SR), the subpixel (G), and the subpixel (B). The subpixel (SR), the subpixel (G), and the subpixel (B) are positioned in the same row in this order. Note that the subpixel positioned in the row different from that of the subpixels of the other colors is not limited to the subpixel (IR) and may be the subpixel (SR), the subpixel (G), and the subpixel (B).

Note that the arrangement of subpixels is not limited to the orders illustrated in FIG. 15D and FIG. 15F. For example, the positions of the subpixel (B) and the subpixel (G) may be reversed.

Figures 16A, 16B, 16C:
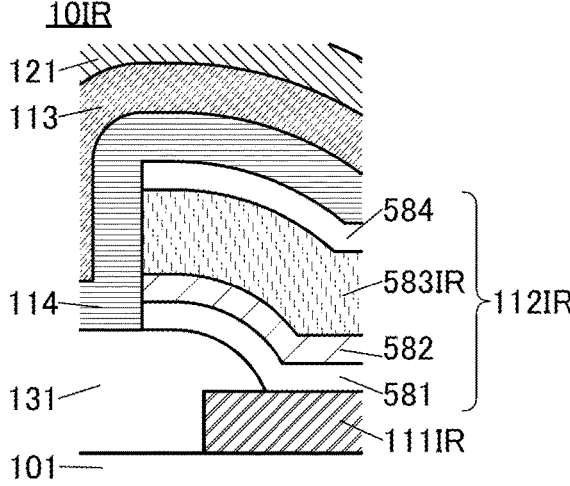
FIG. 16A to FIG. 16C are diagrams illustrating a structure example of a display apparatus.

FIG. 16A is a schematic top view of a display apparatus 102 of one embodiment of the present invention. The display apparatus 102 includes a plurality of light-emitting and light-receiving devices 110SR that emit red light and have a light-receiving function, a plurality of light-emitting devices 110G that emit green light, a plurality of light-emitting devices 110B that emit blue light, and a plurality of light-emitting devices 110IR that emit infrared light. In FIG. 16A, to easily distinguish the light-emitting and light-receiving elements and the light-emitting elements, the light-emitting and light-receiving region of each light-emitting and light-receiving element is denoted by SR, and the light-emitting region of each light-emitting element is denoted by G, B, or IR.

The light-emitting and light-receiving devices 110SR, the light-emitting devices 110G, the light-emitting devices 110B, and the light-emitting devices 110IR are each arranged in a matrix. FIG. 16A illustrates an example employing a stripe arrangement illustrated in FIG. 15E. Note that the arrangement method of the light-emitting elements is not limited thereto; another arrangement method such as a delta arrangement, a zigzag arrangement, or a PenTile arrangement may also be used.

The light-emitting and light-receiving device 110SR, the light-emitting device 110G, the light-emitting device 110B, and the light-emitting device 1101R are arranged in the X direction. The light-emitting elements of the same color are arranged in the Y direction intersecting with the X direction.

FIG. 16B is a schematic cross-sectional view taken along the dashed-dotted line A3-A4 in FIG. 16A. FIG. 2C can be referred to for the schematic cross-sectional view taken along the dashed-dotted line B1-B2.

FIG. 16B illustrates cross sections of the light-emitting and light-receiving device 110SR, the light-emitting device 110G, the light-emitting device 110B, and the light-emitting device 110IR. The light-emitting device 110IR includes a pixel electrode 111IR, an EL layer 112IR, the layer 114, and the common electrode 113. The light-emitting and light-receiving device 110SR, the light-emitting device 110G, the light-emitting device 110B, and the light-emitting device 110IR include the layer 114 and the common electrode 113 in common.

The EL layer 112IR included in the light-emitting device 110IR contains at least a light-emitting organic compound that emits light with intensity in a wavelength range of infrared light. The EL layer 112IR may include one or more of an electron-injection layer, an electron-transport layer, a hole-injection layer, and a hole-transport layer in addition to the layer containing a light-emitting organic compound (the light-emitting layer).

A conductive film having a light-transmitting property with respect to visible light and infrared light is preferably used for either the respective pixel electrodes or the common electrode 113, and a conductive film having a reflective property is preferably used for the other.

FIG. 16C illustrates an enlarged diagram of a region 10IR indicated by the dashed-dotted line in FIG. 16B. As illustrated in FIG. 16C, the light-emitting device 110IR includes the pixel electrode 111IR, the EL layer 1121R, the layer 114, and the common electrode 113 stacked in this order. The EL layer 1121R includes the hole-injection layer 581, the hole-transport layer 582, a light-emitting layer 5831R, and the electron-transport layer 584 stacked in this order. The light-emitting layer 5831R contains a light-emitting substance that emits infrared light.

The positions of end portions of the layers included in the EL layer 1121R are aligned or substantially aligned with each other. In other words, top surface shapes of the layers included in the EL layer 112IR are aligned or substantially aligned with each other. For example, as illustrated in FIG.

16C, the positions of the end portions of the hole-injection layer 581, the hole-transport layer 582, the light-emitting layer 5831R, and the electron-transport layer 584 are aligned or substantially aligned with each other. In other words, the top surface shapes of the hole-injection layer 581, the hole-transport layer 582, the light-emitting layer 5831R, and the electron-transport layer 584 are aligned or substantially aligned with each other.

The light-emitting devices 110IR are electroluminescent devices that emit infrared light to the common electrode 113 side by voltage application between the pixel electrodes 111 and the common electrode 113.

A conductive film that transmits visible light and infrared light is used as the electrode through which light is extracted and light enters out of the pixel electrode 111 and the common electrode 113. A conductive film that reflects visible light and infrared light is preferably used as the electrode through which no light is extracted and no light enters.

The description of FIG. 1A or the like can be referred to for the light-emitting and light-receiving device 110SR, the light-emitting device 110G, and the light-emitting device 110B, and the detailed description thereof is omitted.

Figure 17A:
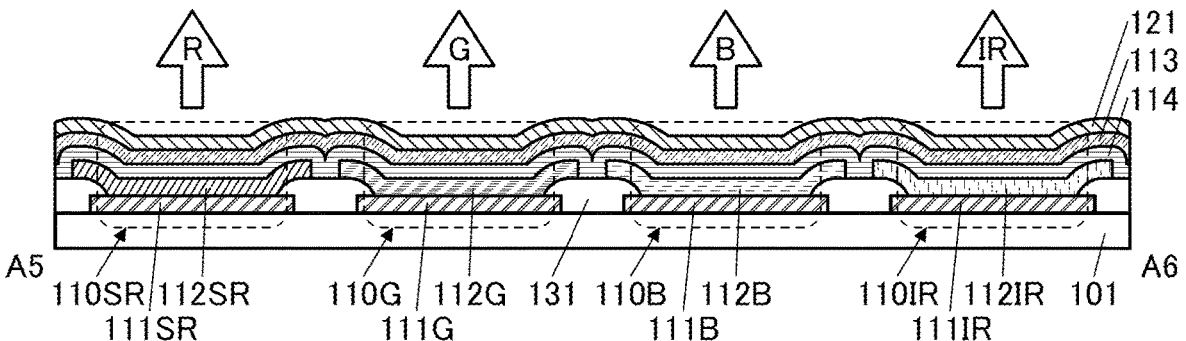
FIG. 17A and FIG. 17B are diagrams illustrating a structure example of a display apparatus.

FIG. 17A illustrates a state where the light-emitting and light-receiving device 110SR functions as a light-emitting device. FIG. 17A illustrates an example in which the light-emitting device 110IR emits infrared (IR) light, the light-emitting device 110B emits blue (B) light, the light-emitting device 110G emits green (G) light, and the light-emitting and light-receiving device 110SR emits red (R) light.

Figure 17B:
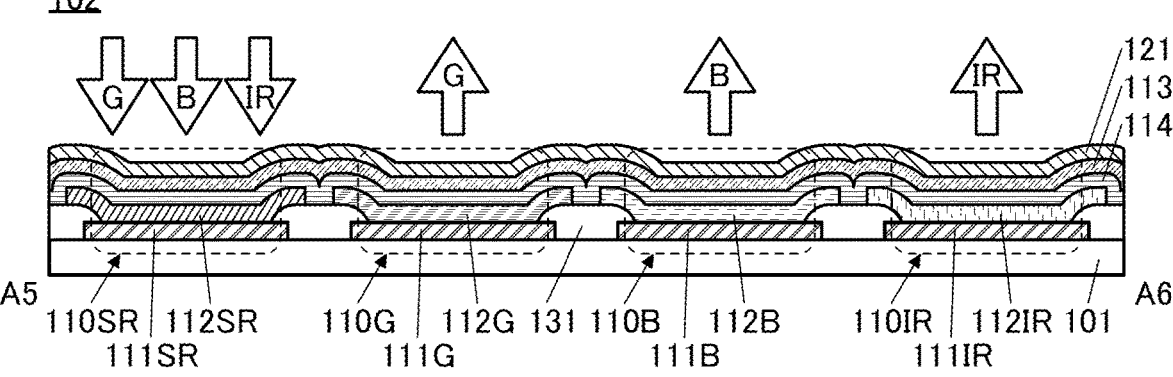

FIG. 17B illustrates a state in which the light-emitting and light-receiving device 110SR functions as a light-emitting and light-receiving device. In the example illustrated in FIG. 17B, the light-emitting and light-receiving device 110SR receives infrared (IR) light emitted by the light-emitting device 110IR, blue (B) light emitted by the light-emitting device 110B, and green (G) light emitted by the light-emitting device 110G.

Structure Example 4

FIG. 18A illustrates a structure example different from the display apparatus 50C illustrated in FIG. 15A.

A display apparatus 50D illustrated in FIG. 18A differs from the display apparatus 50C illustrated in FIG. 15A mainly in that red (R) light, green (G) light, and infrared (IR) light are emitted from the layer 57 including the light-emitting devices and blue (B) light is emitted from the layer 53 including the light-emitting and light-receiving device.

The light-emitting and light-receiving device included in the layer 53 can detect light that enters from the outside of the display apparatus 50D. The light-emitting and light-receiving device can detect one or more of infrared (IR) light, red (R) light, and green (G) light, for example.

FIG. 18A schematically illustrates infrared (IR) light, red (R) light, and green (G) light emitted from the layer 57, green (G) light emitted from the layer 57, and light that enters the layer 53 with arrows.

FIG. 18B to FIG. 18D illustrate pixel examples. The pixel includes a subpixel (SB) that emits blue light and has a light-receiving function, a subpixel (R) that emits green light, a subpixel (G) that emits green light, and a subpixel (IR) that emits infrared light.

The pixel illustrated in FIG. 18B shows an example employing subpixels with a stripe arrangement.

The pixel illustrated in FIG. 18C shows an example employing subpixels with a matrix arrangement.

FIG. 18D illustrates an example in which the subpixel (IR) is positioned in a row different from that of the subpixel (SB), the subpixel (R), and the subpixel (G). The subpixel (SB), the subpixel (R), and the subpixel (G) are positioned in the same row in this order. Note that the subpixel positioned in the row different from that of the subpixels of the other colors is not limited to the subpixel (IR) and may be the subpixel (SB), the subpixel (R), and the subpixel (G).

Note that the arrangement of subpixels is not limited to the orders illustrated in FIG. 18B and FIG. 18D. For example, the positions of the subpixel (R) and the subpixel (G) may be reversed.

Figure 19A:
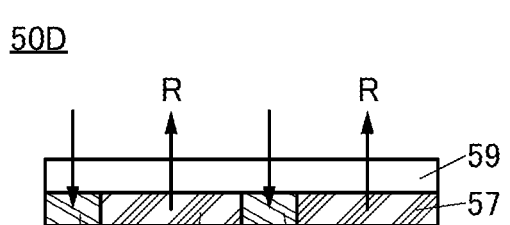
FIG. 19A to FIG. 19D are cross-sectional views illustrating examples of a display apparatus.
Figure 19B:
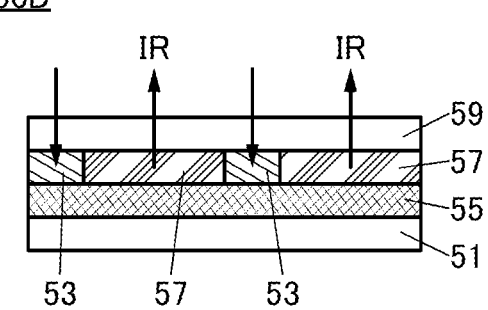

The display apparatus of one embodiment of the present invention may emit light of a particular color and receive reflected light that has been reflected by an object. FIG. 19A schematically illustrates red (R) light emitted by the layer 57 of the display apparatus 50D and light that enters the layer 53 with arrows. FIG. 19B schematically illustrates infrared (IR) light emitted by the layer 57 of the display apparatus 50D and light that enters the layer 53 with arrows.

Figure 19C:
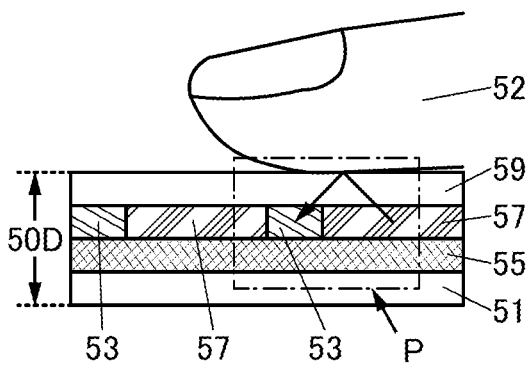

As illustrated in FIG. 19C, red (R) light is emitted with the finger 52 being in contact with or approaching the display apparatus 50D, and light reflected by the finger 52 enters the display apparatus 50D. Transmittance of the finger 52 with respect to red (R) light can be measured. Similarly, infrared (IR) light is emitted with the finger 52 being in contact with or approaching the display apparatus 50D, and light reflected by the finger 52 enters the display apparatus 50D. Transmittance of the finger 52 with respect to infrared (IR) light can be measured.

Figure 19D:
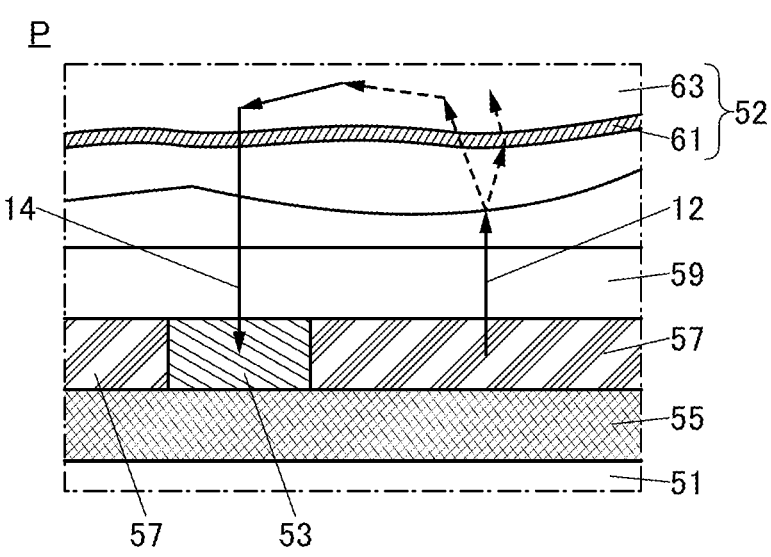

FIG. 19D illustrates an enlarged diagram of a region P indicated by the dashed-dotted line in FIG. 19C. Light 12 emitted by the layer 57 is scattered by biological tissue on the surface or at the inside of the finger 52, and part of the scattered light advances from the inside of the living body toward the layer 53. This scattered light passes through a blood vessel 61 and light 14 having passed through the blood vessel 61 enters the layer 53.

Here, the light 14 is light having passed through biological tissue 63 and the blood vessel 61 (an artery and a vein). Since an arterial blood pulses by heartbeat, light absorption by the artery fluctuates in accordance with the heartbeat. In contrast, the biological tissue 63 and the vein are not influenced by the heartbeat, and thus light absorption by the biological tissue 63 and light absorption by the vein are constant. Therefore, light transmittance of the artery can be calculated by subtracting the components that are constant over time from the light 14 that enters the display apparatus 50D. Red (R) light transmittance lowers more with hemoglobin that is not bonded to oxygen (reduced hemoglobin) than hemoglobin that is bonded to oxygen (oxyhemoglobin). Infrared (IR) light transmittance is on the same level with oxyhemoglobin and reduced hemoglobin. The red (R) light transmittance of the artery and the infrared (IR) light transmittance of the artery are measured and thus the ratio of oxyhemoglobin to reduced hemoglobin, that is, the oxygen saturation (hereinafter also referred to as peripheral oxygen saturation ($SpO_2$)) can be calculated. In this way, the display apparatus of one embodiment of the present invention can have a function of a pulse oximeter.

For example, when the finger 52 comes in contact with the display portion of the display apparatus 50D, positional information of a region that the finger 52 is in contact with is obtained. Then, a pixel in the region that the finger 52 is in contact with emits red (R) light to measure the transmittance of the artery with respect to red (R) light, and then emits infrared (IR) light to measure the transmittance of the artery with respect to infrared (IR) light. Accordingly, the oxygen saturation can be calculated. Note that the order of measuring the transmittance with respect to red (R) light and the transmittance with respect to infrared (IR) light is not particularly limited. After the transmittance with respect to infrared (IR) light is measured, the transmittance with respect to red (R) light may be measured. Furthermore, although an example of calculating the oxygen saturation using the finger 52 is described here, one embodiment of the present invention is not limited thereto. The oxygen saturation can be calculated with a part other than the finger. For example, the oxygen saturation can be calculated by measuring the transmittance of an artery with respect to red (R) light and the transmittance of the artery with respect to infrared (IR) light in the state where a palm is in contact with the display portion of the display apparatus 50D.

Figures 20A, 20B, 20C:
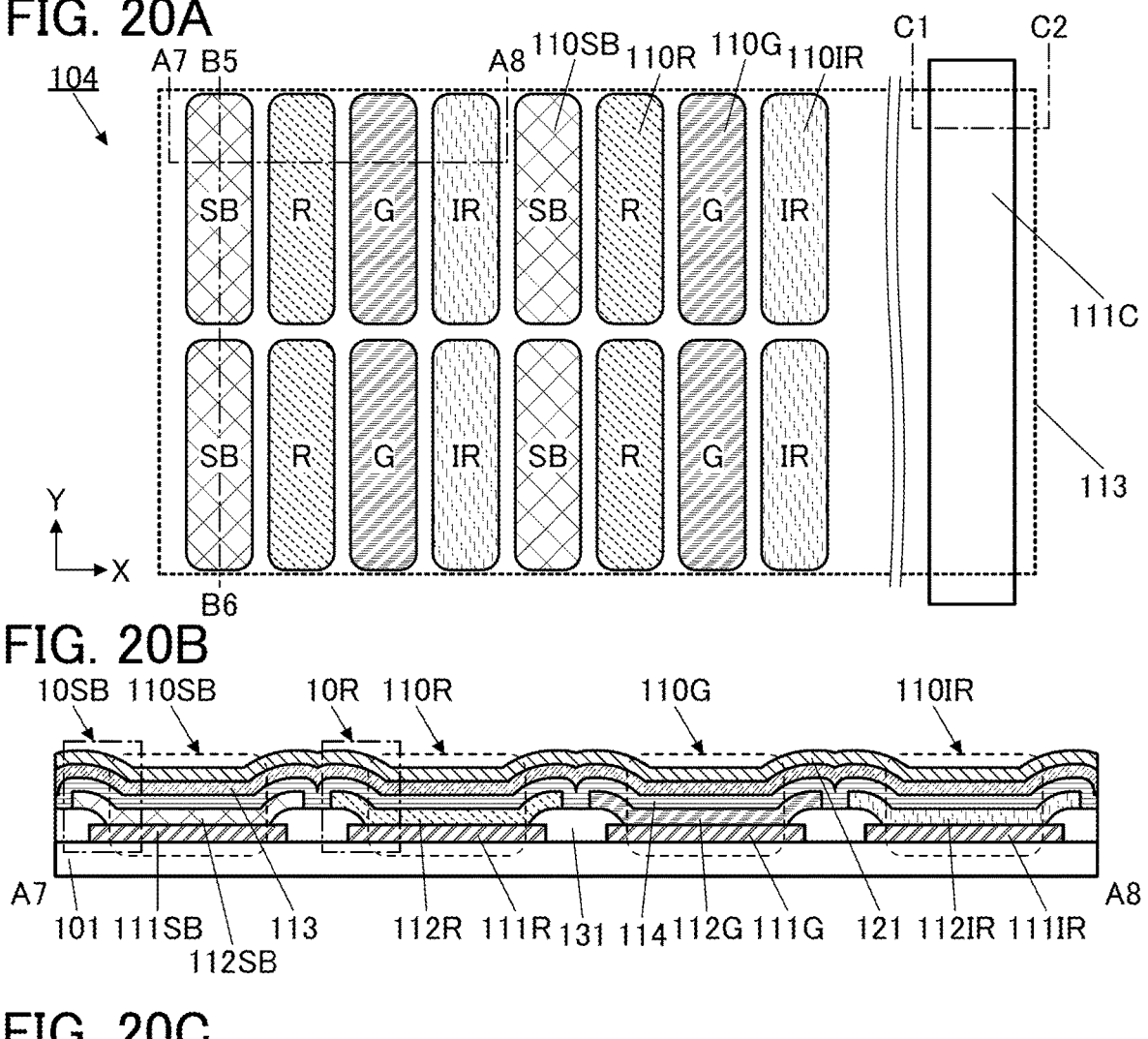
FIG. 20A to FIG. 20C are diagrams illustrating a structure example of a display apparatus.

FIG. 20A is a schematic top view of a display apparatus 104 of one embodiment of the present invention. The display apparatus 104 includes a plurality of light-emitting and light-receiving devices 110SB that emit blue light and have a light-receiving function, a plurality of light-emitting devices 110R that emit red light, a plurality of light-emitting devices 110G that emit green light, and a plurality of light-emitting devices 110IR that emit infrared light. In FIG. 20A, to easily distinguish the light-emitting and light-receiving elements and the light-emitting elements, the light-emitting and light-receiving region of each light-emitting and light-receiving element is denoted by SB, and the light-emitting region of each light-emitting element is denoted by R, G, or IR.

The light-emitting and light-receiving devices 110SB, the light-emitting devices 110R, the light-emitting devices 110G, and the light-emitting devices 110IR are each arranged in a matrix. FIG. 20A illustrates an example employing a stripe arrangement illustrated in FIG. 18B. Note that the arrangement method of the light-emitting elements is not limited thereto; another arrangement method such as a delta arrangement, a zigzag arrangement, or a PenTile arrangement may also be used.

The light-emitting and light-receiving device 110SB, the light-emitting device 110R, the light-emitting device 110G, and the light-emitting device 110IR are arranged in the X direction. The light-emitting elements of the same color are arranged in the Y direction intersecting with the X direction.

FIG. 20B is a schematic cross-sectional view taken along the dashed-dotted line A7-A8 in FIG. 20A. FIG. 20C is a schematic cross-sectional view taken along the dashed-dotted line B5-B6 in FIG. 20A.

FIG. 16B illustrates cross sections of the light-emitting and light-receiving device 110SB, the light-emitting device 110R, the light-emitting device 110G, and the light-emitting device 110IR. The light-emitting and light-receiving device 110SB includes a pixel electrode 111SB, a light-emitting and light-receiving layer 112SB, the layer 114, and the common electrode 113. The light-emitting device 110R includes a pixel electrode 111IR, an EL layer 112R, the layer 114, and the common electrode 113. For the light-emitting device 110G, the light-emitting device 110B, and the light-emitting device 110IR, the above description can be referred to and detailed description is omitted.

As illustrated in FIG. 20C, the light-emitting and light-receiving layer 112SB is formed in a band shape so that the light-emitting and light-receiving layer 112SB can be continuous in the Y direction. When the light-emitting and light-receiving layer 112SB and the like are formed in a band shape, no space for dividing the layer is needed and thus the area of a non-light-emitting region between the light-emitting devices can be reduced, resulting in a higher aperture ratio. Note that FIG. 20C illustrates the cross section of the light-emitting and light-receiving device 110SB as an example; the light-emitting device 110R, the light-emitting device 110G, and the light-emitting device 110IR can have a similar shape.

FIG. 21A illustrates an enlarged diagram of a region 10SB indicated by the dashed-dotted line in FIG. 20B. FIG. 21B illustrates an enlarged diagram of a region 10R indicated by the dashed-dotted line in FIG. 20B.

As illustrated in FIG. 21A, the light-emitting and light-receiving device 110SB includes the pixel electrode 111SB, the light-emitting and light-receiving layer 112SB, the layer 114, and the common electrode 113 stacked in this order. The light-emitting and light-receiving layer 112SB includes the hole-injection layer 581, the hole-transport layer 582, the active layer 573, the light-emitting layer 583B, and the electron-transport layer 584 stacked in this order. For the light-emitting layer 583B, the above description can be referred to and detailed description is omitted. Note that it is preferable that the organic compound contained in the active layer 573 does not easily absorb at least light emitted by the light-emitting layer 583B. This enables efficient extraction of blue light from the light-emitting and light-receiving device 110SB and high-accuracy detection of one or more of light with a shorter wavelength than blue light and light with a longer wavelength than blue light (e.g., green light, red light, and infrared light).

As illustrated in FIG. 21A, the active layer 573 and the light-emitting layer 583B may be in contact with each other. Note that it is acceptable that the light-emitting and light-receiving layer 112SB does not include at least one of the hole-injection layer 581, the hole-transport layer 582, and the electron-transport layer 584. Furthermore, the light-emitting and light-receiving layer 112SB may include another layer such as a hole-blocking layer or an electron-blocking layer.

The positions of end portions of the layers included in the light-emitting and light-receiving layer 112SB are aligned or substantially aligned with each other. In other words, top surface shapes of the layers included in the light-emitting and light-receiving layer 112SB are aligned or substantially aligned with each other. For example, as illustrated in FIG. 21A, the positions of the end portions of the hole-injection layer 581, the hole-transport layer 582, the active layer 573, the light-emitting layer 583B, and the electron-transport layer 584 are aligned or substantially aligned with each other. In other words, the top surface shapes of the hole-injection layer 581, the hole-transport layer 582, the active layer 573, the light-emitting layer 583B, and the electron-transport layer 584 are aligned or substantially aligned with each other.

As illustrated in FIG. 21B, the light-emitting device 110R includes the pixel electrode 111R, the EL layer 112R, the layer 114, and the common electrode 113 stacked in this order. The EL layer 112R includes the hole-injection layer 581, the hole-transport layer 582, the light-emitting layer 583R, and the electron-transport layer 584 stacked in this order. For the light-emitting layer 583R, the above description can be referred to and detailed description is omitted.

The positions of end portions of the layers included in the EL layer 112R are aligned or substantially aligned with each other. In other words, top surface shapes of the layers included in the EL layer 112R are aligned or substantially aligned with each other. For example, as illustrated in FIG. 21B, the positions of the end portions of the hole-injection layer 581, the hole-transport layer 582, the light-emitting layer 583R, and the electron-transport layer 584 are aligned or substantially aligned with each other. In other words, the top surface shapes of the hole-injection layer 581, the hole-transport layer 582, the light-emitting layer 583R, and the electron-transport layer 584 are aligned or substantially aligned with each other.

The light-emitting devices 110R are electroluminescent devices that emit red (R) light to the common electrode 113 side by voltage application between the pixel electrodes 111 and the common electrode 113.

FIG. 21C illustrates a state where the light-emitting and light-receiving device 110SB functions as a light-emitting device. FIG. 21A illustrates an example in which the light-emitting device 110IR emits infrared (IR) light, the light-emitting device 110R emits red (R) light, the light-emitting device 110G emits green (G) light, and the light-emitting and light-receiving device 110SB emits blue (B) light.

FIG. 21D illustrates a state in which the light-emitting and light-receiving device 110SB functions as a light-emitting and light-receiving device. In the example illustrated in FIG. 21D, the light-emitting and light-receiving device 110SB receives infrared (IR) light emitted by the light-emitting device 110IR, red (R) light emitted by the light-emitting device 110R, and green (G) light emitted by the light-emitting device 110G.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 2

In this embodiment, a structure example of a display apparatus of one embodiment of the present invention is described.

[Display Apparatus 400A]

Figure 22:
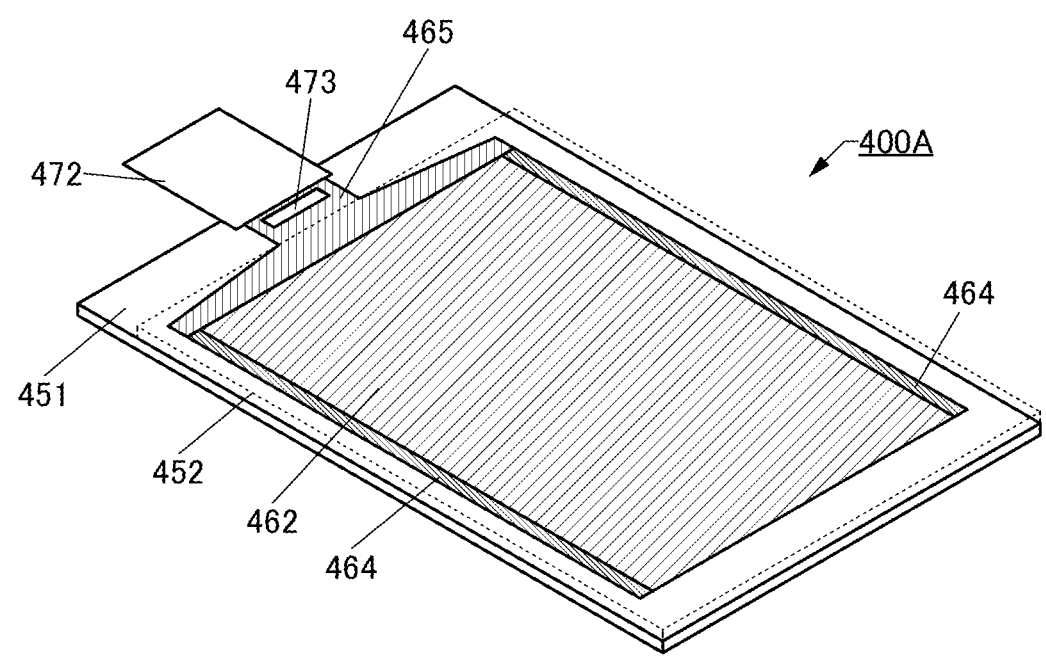
FIG. 22 is a perspective view illustrating an example of a display apparatus.
Figures 23A, 23B:
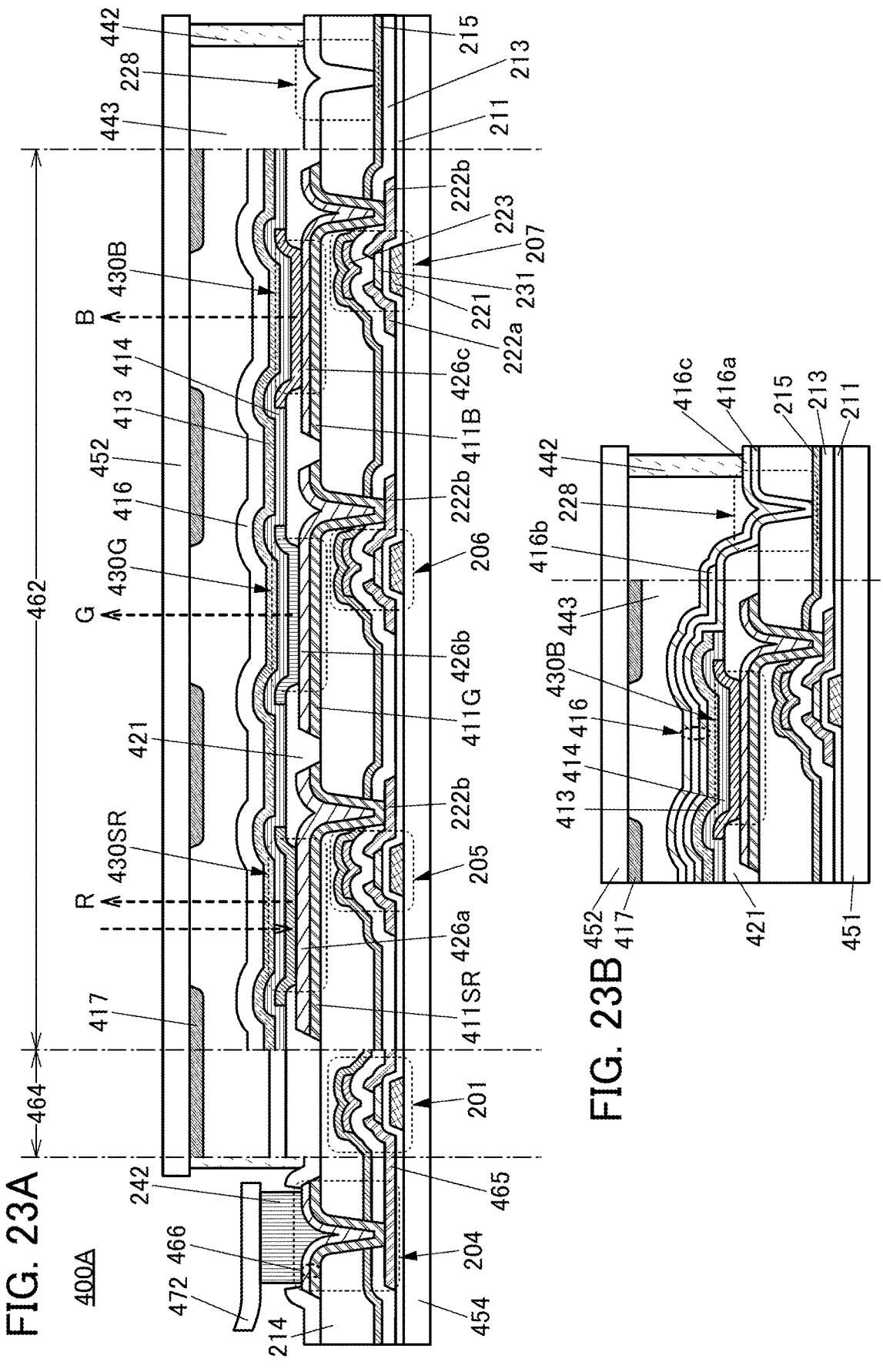
FIG. 23A and FIG. 23B are cross-sectional views illustrating an example of a display apparatus.

FIG. 22 illustrates a perspective view of a display apparatus 400A, and FIG. 23A illustrates a cross-sectional view of the display apparatus 400A.

The display apparatus 400A has a structure in which a substrate 452 and a substrate 454 are bonded to each other. In FIG. 23A, the substrate 452 is denoted by a dashed line.

The display apparatus 400A includes a display portion 462, a circuit 464, a wiring 465, and the like. FIG. 23A illustrates an example in which the display apparatus 400A is provided with an IC (integrated circuit) 173 and an FPC 472. Thus, the structure illustrated in FIG. 23A can be regarded as a display module including the display apparatus 400A, the IC, and the FPC. As the circuit 464, for example, a scan line driver circuit can be used.

The wiring 465 has a function of supplying a signal and power to the display portion 462 and the circuit 464. The signal and power are input to the wiring 465 from the outside through the FPC 472 or from an IC 473.

FIG. 23A illustrates an example in which the IC 473 is provided over the substrate 454 by a COG (Chip On Glass) method, a COF (Chip On Film) method, or the like. An IC including a scan line driver circuit, a signal line driver circuit, or the like can be used as the IC 473, for example. Note that the display apparatus 400A and the display module may have a structure not including an IC. The IC may be mounted on the FPC by a COF method or the like.

FIG. 23A illustrates an example of cross sections of part of a region including the FPC 472, part of a region including the circuit 464, part of a region including the display portion 462, and part of a region including an end portion of the display apparatus 400A illustrated in FIG. 22.

The display apparatus 400A illustrated in FIG. 23A includes a transistor 201, a transistor 205, a transistor 206, a transistor 207, a light-emitting device 430B, a light-emitting device 430G, a light-emitting and light-receiving device 430SR, and the like between the substrate 454 and the substrate 452.

The substrate 452 and an insulating layer 214 are attached to each other with an adhesive layer 442. A solid sealing structure, a hollow sealing structure, or the like can be employed to seal the light-emitting device 430B, the light-emitting device 430G, and the light-emitting and light-receiving device 430SR. In FIG. 23A, a hollow sealing structure is employed in which a space 443 surrounded by the substrate 452, the adhesive layer 442, and the insulating layer 214 is filled with an inert gas (e.g., nitrogen or argon). The adhesive layer 442 may overlap with the light-emitting device 430B, the light-emitting device 430G, and the light-emitting and light-receiving device 430SR. The space 443 surrounded by the substrate 452, the adhesive layer 442, and the insulating layer 214 may be filled with a resin different from that of the adhesive layer 442.

The light-emitting and light-receiving device described in Embodiment 1 can be used as the light-emitting and light-receiving device 430SR. The light-emitting device described in Embodiment 1 can be used as the light-emitting device 430B and the light-emitting device 430G. The light-emitting device 430B is provided over the insulating layer 214. A pixel electrode 411B included in the light-emitting device 430B is electrically connected to a conductive layer 222b included in the transistor 207 through an opening provided in the insulating layer 214. The transistor 207 has a function of controlling the driving of the light-emitting device 430B. An end portion of the pixel electrode 411B is covered with a partition 421. The pixel electrode 411B contains a material that reflects visible light, and a common electrode 413 contains a material that transmits visible light.

The light-emitting device 430G is provided over the insulating layer 214. The pixel electrode 411G included in the light-emitting device 430G is electrically connected to the conductive layer 222b included in the transistor 206 through an opening provided in the insulating layer 214. The transistor 206 has a function of controlling the driving of the light-emitting device 430G.

The light-emitting and light-receiving device 430SR is provided over the insulating layer 214. The pixel electrode 411SR is electrically connected to the conductive layer 222b included in the transistor 205 through an opening provided in the insulating layer 214. The transistor 205 has a function of controlling the driving of the light-emitting and light-receiving device 430SR.

Light emitted from the light-emitting device 430B, the light-emitting device 430G, and the light-emitting and light-receiving device 430SR is emitted toward the substrate 452. Light enters the light-emitting and light-receiving device 190SR through the substrate 452 and the space 443. For the substrate 452, a material that has high visible-light-transmitting property is preferably used.

The pixel electrode 411SR, the pixel electrode 411G, and the pixel electrode 411B can be formed using the same material in the same step. The layer 414 and the common electrode 413 are shared by the light-emitting device 430B, the light-emitting device 430G, and the light-emitting and light-receiving device 430SR. The light-emitting and light-receiving device 430SR has the structure of the red-lightemitting device to which the active layer is added. The light-emitting device 430B, the light-emitting device 430G, and the light-emitting and light-receiving device 430SR can have a common structure except for the active layer and the light-emitting layer of each color. Thus, the display portion 462 of the display apparatus 400A can have a light-receiving function without a significant increase in the number of manufacturing steps. Although FIG. 23A illustrates the example including an optical adjustment layer 426a, an optical adjustment layer 426b, and an optical adjustment layer 426c, one embodiment of the present invention is not limited thereto. A structure not including the optical adjustment layer 426a, the optical adjustment layer 426b, and the optical adjustment layer 426c may also be used.

A light-blocking layer 417 is provided on a surface of the substrate 452 on the substrate 454 side. The light-blocking layer 417 includes openings in the positions overlapping with the light-emitting device 430B, the light-emitting device 430G, and the light-emitting and light-receiving device 430SR. Providing the light-blocking layer 417 can control the range where the light-emitting and light-receiving device 430SR detects light. Furthermore, with the light-blocking layer 417, light can be inhibited from directly entering the light-emitting and light-receiving device 430SR from one or both of the light-emitting device 430G and the light-emitting device 430B without through an object. Hence, a sensor with less noise and high sensitivity can be obtained.

The light-blocking layer 417 preferably absorbs visible light. The light-blocking layer 417 preferably further absorbs infrared light. As the light-blocking layer 417, a black matrix can be formed using a metal material or a resin material containing pigment (e.g., carbon black) or dye, for example. The light-blocking layer 417 may have a stacked-layer structure including two or more of a red color filter, a green color filter, and a blue color filter.

The transistor 201, the transistor 205, the transistor 206, and the transistor 207 are formed over the substrate 454. These transistors can be formed using the same materials in the same steps.

An insulating layer 211, an insulating layer 213, an insulating layer 215, and the insulating layer 214 are provided in this order over the substrate 454. Parts of the insulating layer 211 function as gate insulating layers of the transistors. Parts of the insulating layer 213 function as gate insulating layers of the transistors. The insulating layer 215 is provided to cover the transistors. The insulating layer 214 is provided to cover the transistors and has a function of a planarization layer. Note that there is no limitation on the number of gate insulating layers and the number of insulating layers covering the transistors, and each insulating layer may have either a single layer or two or more layers.

A material into which impurities such as water or hydrogen do not easily diffuse is preferably used for at least one of the insulating layers that cover the transistors. This allows the insulating layer to serve as a barrier layer. Such a structure can effectively inhibit diffusion of impurities into the transistors from the outside and increase the reliability of the display apparatus.

An inorganic insulating film is preferably used as each of the insulating layer 211, the insulating layer 213, and the insulating layer 215. As the inorganic insulating film, an inorganic insulating film such as a silicon nitride film, a silicon oxynitride film, a silicon oxide film, a silicon nitride oxide film, an aluminum oxide film, or an aluminum nitride oxide film can be used, for example. A hafnium oxide film, a hafnium oxynitride film, a hafnium nitride oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. Note that a base film may be provided between the substrate 454 and the transistors. Any of the above-described inorganic insulating films can be used as the base film.

Here, an organic insulating film often has a lower barrier property than an inorganic insulating film. Therefore, the organic insulating film preferably has an opening in the vicinity of an end portion of the display apparatus 400A. This can inhibit entry of impurities from the end portion of the display apparatus 400A through the organic insulating film. Alternatively, the organic insulating film may be formed so that an end portion of the organic insulating film is positioned on the inner side than the end portion of the display apparatus 400A is, to prevent the organic insulating film from being exposed at the end portion of the display apparatus 400A.

An organic insulating film is suitable for the insulating layer 214 functioning as a planarization layer. Examples of materials that can be used for the organic insulating film include an acrylic resin, a polyimide resin, an epoxy resin, a polyamide resin, a polyimide-amide resin, a siloxane resin, a benzocyclobutene-based resin, a phenol resin, and precursors of these resins.

In a region 228 illustrated in FIG. 23A, an opening is formed in the insulating layer 214. This can inhibit entry of impurities into the display portion 462 from the outside through the insulating layer 214 even when an organic insulating film is used as the insulating layer 214. Thus, the reliability of the display apparatus 400A can be increased.

Each of the transistor 201, the transistor 205, the transistor 206, and the transistor 207 includes a conductive layer 221 functioning as a gate, the insulating layer 211 functioning as the gate insulating layer, a conductive layer 222a and the conductive layer 222b functioning as a source and a drain, a semiconductor layer 231, the insulating layer 213 functioning as the gate insulating layer, and a conductive layer 223 functioning as a gate. Here, a plurality of layers obtained by processing the same conductive film are shown with the same hatching pattern. The insulating layer 211 is positioned between the conductive layer 221 and the semiconductor layer 231. The insulating layer 213 is positioned between the conductive layer 223 and the semiconductor layer 231.

There is no particular limitation on the structure of the transistors included in the display apparatus of this embodiment. For example, a planar transistor, a staggered transistor, or an inverted staggered transistor can be used. A top-gate or a bottom-gate transistor structure may be employed. Alternatively, gates may be provided above and below a semiconductor layer in which a channel is formed.

The structure in which the semiconductor layer where a channel is formed is provided between two gates is used for the transistor 201, the transistor 205, the transistor 206, and the transistor 207. The two gates may be connected to each other and supplied with the same signal to drive the transistor. Alternatively, a potential for controlling the threshold voltage may be supplied to one of the two gates and a potential for driving may be supplied to the other to control the threshold voltage of the transistor.

There is no particular limitation on the crystallinity of a semiconductor material used in the transistor, and an amorphous semiconductor or a semiconductor having crystallinity (a microcrystalline semiconductor, a polycrystalline semiconductor, a single crystal semiconductor, or a semiconductor partly including crystal regions) can be used. It is preferable to use a semiconductor having crystallinity, in which case degradation of the transistor characteristics can be inhibited.

A semiconductor layer of a transistor preferably includes a metal oxide (also referred to as an oxide semiconductor). Alternatively, the semiconductor layer of the transistor may include silicon. Examples of silicon include amorphous silicon and crystalline silicon (e.g., low-temperature poly-silicon or single crystal silicon).

The semiconductor layer preferably includes indium, an element M (M is one or more kinds selected from gallium, aluminum, silicon, boron, yttrium, tin, copper, vanadium, beryllium, titanium, iron, nickel, germanium, zirconium, molybdenum, lanthanum, cerium, neodymium, hafnium, tantalum, tungsten, and magnesium), and zinc, for example. In particular, M is preferably one or more kinds selected from aluminum, gallium, yttrium, and tin.

It is particularly preferable to use an oxide containing indium (In), gallium (Ga), and zinc (Zn) (also referred to as IGZO) for the semiconductor layer.

When the semiconductor layer is an In-M-Zn oxide, the atomic ratio of In is preferably greater than or equal to the atomic ratio of M in the In-M-Zn oxide. Examples of the atomic ratio of the metal elements in such an In-M-Zn oxide include In:M:Zn=1:1:1 or a composition in the neighbor-hood thereof, In:M:Zn=1:1:1.2 or a composition in the neighborhood thereof, In:M:Zn=2:1:3 or a composition in the neighborhood thereof, In:M:Zn=3:1:2 or a composition in the neighborhood thereof, In:M:Zn=4:2:3 or a composi-tion in the neighborhood thereof, In:M:Zn=4:2:4.1 or a composition in the neighborhood thereof, In:M:Zn=5:1:3 or a composition in the neighborhood thereof, In:M:Zn=5:1:6 or a composition in the neighborhood thereof, In:M:Zn=5:1:7 or a composition in the neighborhood thereof, In:M:Zn=5:1:8 or a composition in the neighborhood thereof, In:M:Zn=6:1:6 or a composition in the neighborhood thereof, and In:M:Zn=5:2:5 or a composition in the neigh-borhood thereof. Note that a composition in the neighbor-hood includes the range of ±30% of an intended atomic ratio.

For example, when the atomic ratio is described as In:Ga:Zn=4:2:3 or a composition in the neighborhood thereof, the case is included where the atomic ratio of Ga is greater than or equal to 1 and less than or equal to 3 and the atomic ratio of Zn is greater than or equal to 2 and less than or equal to 4 with the atomic ratio of In being 4. When the atomic ratio is described as In:Ga:Zn=5:1:6 or a composition in the neighborhood thereof, the case is included where the atomic ratio of Ga is greater than 0.1 and less than or equal to 2 and the atomic ratio of Zn is greater than or equal to 5 and less than or equal to 7 with the atomic ratio of In being 5. When the atomic ratio is described as In:Ga:Zn=1:1:1 or a composition in the neighborhood thereof, the case is included where the atomic ratio of Ga is greater than 0.1 and less than or equal to 2 and the atomic ratio of Zn is greater than 0.1 and less than or equal to 2 with the atomic ratio of In being 1.

The transistor included in the circuit 464 and the transistor included in the display portion 462 may have the same structure or different structures. A plurality of transistors included in the circuit 464 may have the same structure or two or more kinds of structures. Similarly, a plurality of transistors included in the display portion 462 may have the same structure or two or more kinds of structures.

A connection portion 204 is provided in a region of the substrate 454 that does not overlap with the substrate 452. In the connection portion 204, the wiring 465 is electrically connected to the FPC 472 via a conductive layer 466 and a connection layer 242. On the top surface of the connection portion 204, the conductive layer 466 obtained by process-ing the same conductive film as the pixel electrode 411B and the optical adjustment layer 426c is exposed. Thus, the connection portion 204 and the FPC 472 can be electrically connected to each other through the connection layer 242. Note that the conductive layer 466 may be formed by processing the same conductive film as the pixel electrode 411G and the optical adjustment layer 426b or by processing the same conductive film as the pixel electrode 411SR and the optical adjustment layer 426a. Alternatively, the con-ductive layer 466 may be formed by processing a conductive film different from that for the pixel electrode 411B and the optical adjustment layer 426c, the pixel electrode 411G and the optical adjustment layer 426b, or the pixel electrode 411SR and the optical adjustment layer 426a.

A variety of optical members can be arranged on the outer surface of the substrate 452. Examples of the optical mem-bers include a polarizing plate, a retardation plate, a light diffusion layer (a diffusion film or the like), an anti-reflective layer, and a light-condensing film. Furthermore, an antistatic film inhibiting the attachment of dust, a water repellent film inhibiting the attachment of stain, a hard coat film inhibiting generation of a scratch caused by the use, a shock absorbing layer, or the like may be provided on the outside of the substrate 452.

For each of the substrate 454 and the substrate 452, glass, quartz, ceramic, sapphire, resin, or the like can be used. When a flexible material is used for the substrate 454 and the substrate 452, the flexibility of the display apparatus can be increased.

As the adhesive layer, a variety of curable adhesives, e.g., a photocurable adhesive such as an ultraviolet curable adhesive, a reactive curable adhesive, a thermosetting adhe-sive, and an anaerobic adhesive can be used. Examples of these adhesives include an epoxy resin, an acrylic resin, a silicone resin, a phenol resin, a polyimide resin, an imide resin, a PVC (polyvinyl chloride) resin, a PVB (polyvinyl butyral) resin, and an EVA (ethylene vinyl acetate) resin. In particular, a material with low moisture permeability, such as an epoxy resin, is preferred. Alternatively, a two-compo-nent resin may be used. An adhesive sheet or the like may be used.

As the connection layer, an anisotropic conductive film (ACF), an anisotropic conductive paste (ACP), or the like can be used.

As materials that can be used for a gate, a source, and a drain of a transistor and conductive layers such as a variety of wirings and electrodes included in a display apparatus, metals such as aluminum, titanium, chromium, nickel, cop-per, yttrium, zirconium, molybdenum, silver, tantalum, or tungsten, an alloy containing any of these metals as its main component, and the like can be given. A film containing any of these materials can be used in a single layer or as a stacked-layer structure.

As a light-transmitting conductive material, a conductive oxide such as indium oxide, indium tin oxide, indium zinc oxide, zinc oxide, or zinc oxide containing gallium, or graphene can be used. Alternatively, a metal material such as gold, silver, platinum, magnesium, nickel, tungsten, chro-mium, molybdenum, iron, cobalt, copper, palladium, or titanium, or an alloy material containing the metal material can be used. Further alternatively, a nitride of the metal material (e.g., titanium nitride) or the like may be used. Note that in the case of using the metal material or the alloy material (or the nitride thereof), the thickness is preferably set small enough to be able to transmit light. A stacked-layer film of any of the above materials can be used as a conductive layer. For example, a stacked-layer film of indium tin oxide and an alloy of silver and magnesium, or the like is preferably used for increased conductivity. These materials can also be used for conductive layers such as a variety of wirings and electrodes included in the display apparatus, and conductive layers (conductive layers functioning as pixel electrodes or common electrodes) included in the light-emitting device and the light-emitting and light-receiving device.

As an insulating material that can be used for each insulating layer, for example, a resin such as an acrylic resin or an epoxy resin, and an inorganic insulating material such as silicon oxide, silicon oxynitride, silicon nitride oxide, silicon nitride, or aluminum oxide can be given.

A protective layer 416 and the substrate 452 are bonded to each other with the adhesive layer 442. A solid sealing structure, a hollow sealing structure, or the like can be employed to seal the light-emitting devices. In FIG. 23A, a hollow sealing structure is employed in which the space 443 surrounded by the substrate 452, the adhesive layer 442, and the substrate 451 is filled with an inert gas (e.g., nitrogen or argon). The adhesive layer 442 may be provided to overlap with the light-emitting device. The space 443 surrounded by the substrate 452, the adhesive layer 442, and the substrate 451 may be filled with a resin different from that of the adhesive layer 442.

When the protective layer 416 covering the light-emitting device 430B, the light-emitting device 430G, and the light-emitting and light-receiving device 190SR is provided, impurities such as water can be inhibited from entering the light-emitting device 430B, the light-emitting device 430G, and the light-emitting and light-receiving device 430SR, so that the reliabilities of the light-emitting device 430B, the light-emitting device 430G, and the light-emitting and light-receiving device 430SR can be increased.

In the region 228 in the vicinity of an end portion of the display apparatus 400A, the insulating layer 215 and the protective layer 416 are preferably in contact with each other through an opening in the insulating layer 214. In particular, the inorganic insulating film included in the insulating layer 215 and the inorganic insulating film included in the protective layer 416 are preferably in contact with each other. Thus, entry of impurities from the outside into the display portion 462 through the organic insulating film can be inhibited. Thus, the reliability of the display apparatus 400A can be increased.

The protective layer 416 may have a single-layer structure or a stacked-layer structure; for example, the protective layer 416 may have a three-layer structure that includes an inorganic insulating layer over the common electrode 413, an organic insulating layer over the inorganic insulating layer, and an inorganic insulating layer over the organic insulating layer. In that case, an end portion of the inorganic insulating film preferably extends beyond an end portion of the organic insulating film.

FIG. 23B illustrates an example where the protective layer 416 has a three-layer structure. In FIG. 23B, the protective layer 416 includes an inorganic insulating layer 416a over the light-emitting device 430B, an organic insulating layer 416b over the inorganic insulating layer 416a, and an inorganic insulating layer 416c over the organic insulating layer 416b.

An end portion of the inorganic insulating layer 416a and an end portion of the inorganic insulating layer 416c extend beyond an end portion of the organic insulating layer 416b and are in contact with each other. The inorganic insulating layer 416a is in contact with the insulating layer 215 (inorganic insulating layer) through the opening in the insulating layer 214 (organic insulating layer). Accordingly, the light-emitting device can be surrounded by the insulating layer 215 and the protective layer 416, whereby the reliability of the light-emitting device can be increased.

Furthermore, a lens may be provided in a region overlapping with the light-emitting and light-receiving device 190SR. Thus, the sensitivity and accuracy of the sensor using the light-emitting and light-receiving device 190SR can be increased.

The lens preferably has a refractive index of greater than or equal to 1.3 and less than or equal to 2.5. The lens can be formed using at least one of an inorganic material and an organic material. For example, a material containing a resin can be used for the lens. Moreover, a material containing at least one of an oxide and a sulfide can be used for the lens.

Specifically, a resin containing chlorine, bromine, or iodine, a resin containing a heavy metal atom, a resin having an aromatic ring, a resin containing sulfur, and the like can be used for the lens. Alternatively, a material containing a resin and nanoparticles of a material having a higher refractive index than the resin can be used for the lens. Titanium oxide, zirconium oxide, or the like can be used for the nanoparticles.

Cerium oxide, hafnium oxide, lanthanum oxide, magnesium oxide, niobium oxide, tantalum oxide, titanium oxide, yttrium oxide, zinc oxide, an oxide containing indium and tin, an oxide containing indium, gallium, and zinc, and the like can be used for the lens. Alternatively, zinc sulfide and the like can be used for the lens.

[Display apparatus 400B]

Figures 24A, 24B:
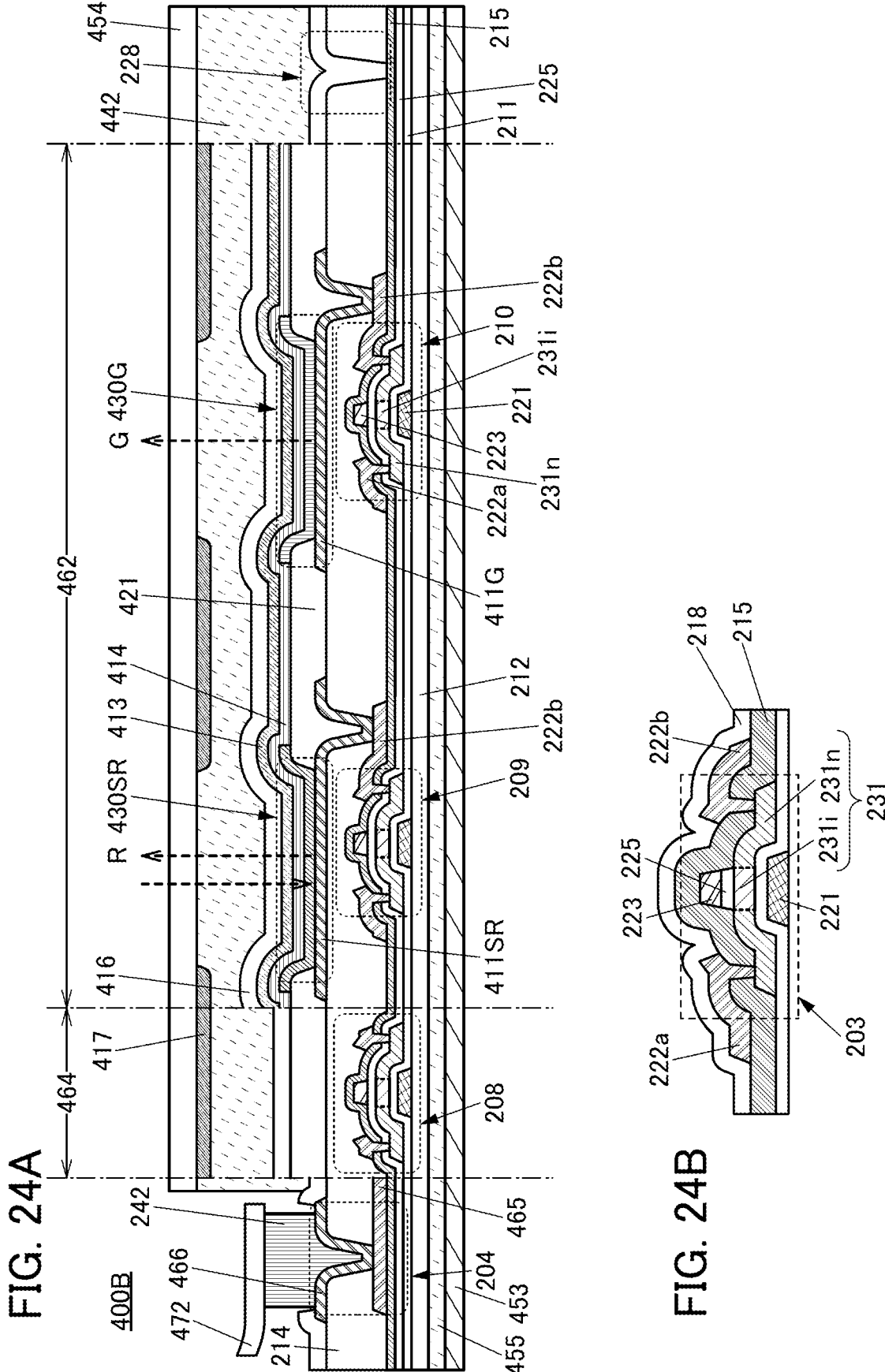
FIG. 24A is a cross-sectional view illustrating an example of a display apparatus.
FIG. 24B is a cross-sectional view illustrating an example of a transistor.

FIG. 24A illustrates a cross-sectional view of a display apparatus 400B. For the perspective view of the display apparatus 400B, FIG. 22 can be referred to. FIG. 24A illustrates an example of cross sections of part of a region including the FPC 472, part of the circuit 464, and part of the display portion 462 in the display apparatus 400B. FIG. 24A illustrates an example of cross sections of the light-emitting and light-receiving device 430SR and the light-emitting device 430G in the display portion 462. Note that portions similar to those in the display apparatus 400A are not described in some cases.

The display apparatus 400B includes a transistor 208, a transistor 209, a transistor 210, the light-emitting and light-receiving device 430SR, the light-emitting device 430G, and the like between a substrate 453 and the substrate 454.

The substrate 454 and the protective layer 416 are bonded to each other with the adhesive layer 442. The adhesive layer 442 is provided to overlap with each of the light-emitting and light-receiving device 430SR and the light-emitting device 430G, and the display apparatus 400B employs a solid sealing structure.

The substrate 453 and an insulating layer 212 are bonded to each other with an adhesive layer 455.

As a method of manufacturing the display apparatus 400B, first, a formation substrate provided with the insulating layer 212, the transistors, the light-emitting devices, and the like and the substrate 454 provided with the light-blocking layer 417 are bonded to each other with the adhesive layer 442. Then, the substrate 453 is attached to a surface exposed by separation of the formation substrate, whereby the components formed over the formation substrate are transferred to the substrate 453. The substrate 453 and the substrate 454 are preferably flexible. Accordingly, the display apparatus 400B can be highly flexible.

The inorganic insulating film that can be used as the insulating layer 211, the insulating layer 213, and the insulating layer 215 can be used as the insulating layer 212.

The display apparatus 400B includes the transistor 208, the transistor 209, and the transistor 210 over the substrate 454.

Each of the transistor 208, the transistor 209, and the transistor 210 includes the conductive layer 221 functioning as a gate, the insulating layer 211 functioning as a gate insulating layer, a semiconductor layer including a channel formation region 231$i$ and a pair of low-resistance regions 231$n$, the conductive layer 222$a$ connected to one of the pair of low-resistance regions 231$n$, the conductive layer 222$b$ connected to the other of the pair of low-resistance regions 231$n$, an insulating layer 225 functioning as a gate insulating layer, the conductive layer 223 functioning as a gate, and the insulating layer 215 covering the conductive layer 223. The insulating layer 211 is positioned between the conductive layer 221 and the channel formation region 231$i$. The insulating layer 225 is positioned between the conductive layer 223 and the channel formation region 231$i$.

The conductive layer 222$a$ and the conductive layer 222$b$ are connected to the corresponding low-resistance regions 231$n$ through openings provided in the insulating layer 225 and the insulating layer 215. One of the conductive layer 222$a$ and the conductive layer 222$b$ serves as a source, and the other serves as a drain.

The pixel electrode 411G of the light-emitting device 430G is electrically connected to one of the pair of low-resistance regions 231$n$ of the transistor 210 through the conductive layer 222$b$.

The pixel electrode 411SR of the light-emitting and light-receiving device 430SR is electrically connected to the other of the pair of low-resistance regions 231$n$ of the transistor 209 through the conductive layer 222$b$.

FIG. 24A illustrates an example in which the insulating layer 225 covers top surfaces and side surfaces of the semiconductor layers of the transistor 208, the transistor 209, and the transistor 210. Meanwhile, in FIG. 24B, the insulating layer 225 overlaps with the channel formation region 231$i$ of the semiconductor layer 231 of the transistor 203 and does not overlap with the low-resistance regions 231$n$. The structure illustrated in FIG. 24B can be manufactured by processing the insulating layer 225 using the conductive layer 223 as a mask, for example. In FIG. 24B, the insulating layer 215 is provided to cover the insulating layer 225 and the conductive layer 223, and the conductive layer 222$a$ and the conductive layer 222$b$ are connected to the corresponding low-resistance regions 231$n$ through the openings in the insulating layer 215. Furthermore, an insulating layer 218 that covers the transistor may be provided.

The display apparatus 400B is different from the display apparatus 400A in that neither the substrate 454 nor the substrate 452 is included and the substrate 453, the substrate 454, the adhesive layer 455, and the insulating layer 212 are included.

The substrate 453 and the insulating layer 212 are bonded to each other with the adhesive layer 455. The substrate 454 and the protective layer 416 are bonded to each other with the adhesive layer 442.

The display apparatus 400B is formed in such a manner that the insulating layer 212, the transistor 208, the transistor 209, the transistor 210, the light-emitting and light-receiving device 190SR, the light-emitting device 190G, and the like which are formed over a formation substrate are transferred onto the substrate 453. The substrate 453 and the substrate 454 preferably have flexibility. Accordingly, the flexibility of the display apparatus 400B can be increased.

The inorganic insulating film that can be used as the insulating layer 211, the insulating layer 213, and the insulating layer 215 can be used as the insulating layer 212.

In the display apparatus of this embodiment, a subpixel emitting light of any color includes a light-emitting and light-receiving device instead of a light-emitting device as described above. The light-emitting and light-receiving device functions as both a light-emitting device and a light-receiving device, whereby the pixel can have a light-receiving function without an increase in the number of subpixels included in the pixel. Furthermore, the pixel can be provided with a light-receiving function without a reduction in the resolution of the display apparatus or a reduction in the aperture ratio of each subpixel.

This embodiment can be combined with the other embodiments as appropriate.

Embodiment 3

In this embodiment, a structure example of a display apparatus different from those described above will be described.

The display apparatus in this embodiment can be a high-resolution display apparatus. Accordingly, the display apparatus in this embodiment can be used for display portions of information terminals (wearable devices) such as watch-type and bracelet-type information terminals and display portions of wearable devices capable of being worn on the head, such as a VR device like a head-mounted display and a glasses-type AR device.

[Display Module]

Figure 25A:
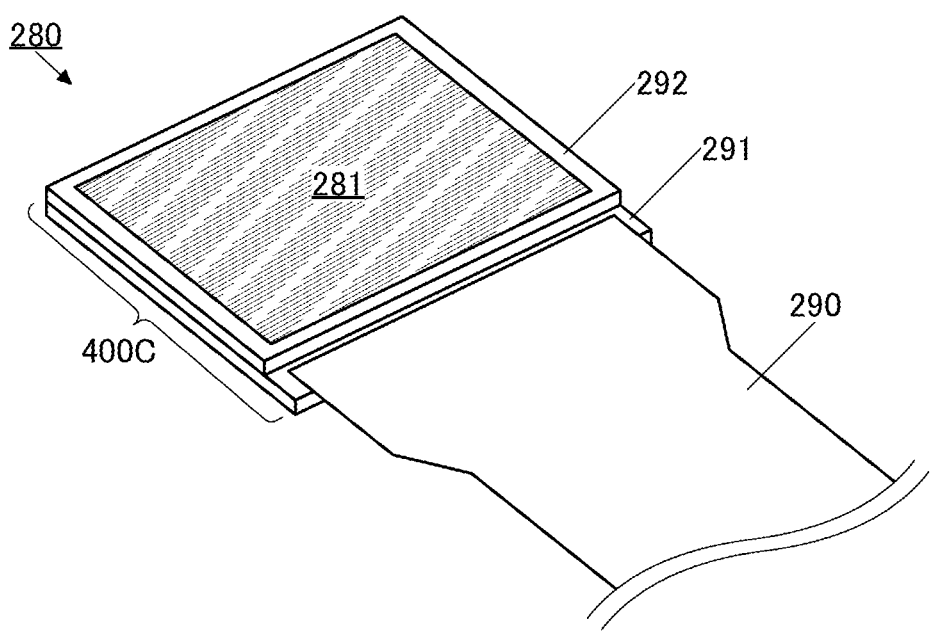
FIG. 25A and FIG. 25B are perspective views illustrating an example of a display module.

FIG. 25A is a perspective view of a display module 280. The display module 280 includes a display apparatus 400C and an FPC 290. Note that the display apparatus included in the display module 280 is not limited to the display apparatus 400C and may be a display apparatus 400D or a display apparatus 400E described later.

The display module 280 includes a substrate 291 and a substrate 292. The display module 280 includes a display portion 281. The display portion 281 is a region of the display module 280 where an image is displayed, and is a region where light emitted from pixels provided in a pixel portion 284 described later can be seen.

Figure 25B:
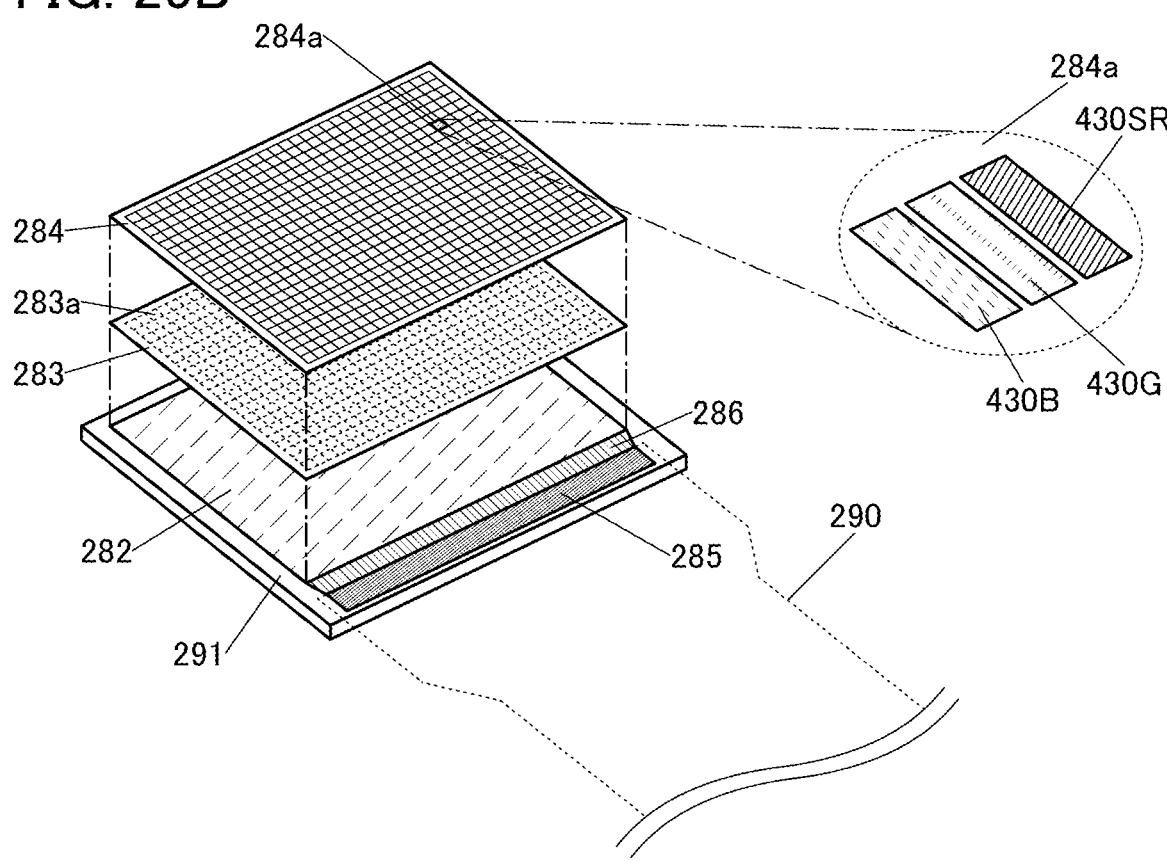

FIG. 25B is a perspective view schematically illustrating a structure on the substrate 291 side. Over the substrate 291, a circuit portion 282, a pixel circuit portion 283 over the circuit portion 282, and the pixel portion 284 over the pixel circuit portion 283 are stacked. A terminal portion 285 to be connected to the FPC 290 is provided in a portion that is over the substrate 291 and does not overlap with the pixel portion 284. The terminal portion 285 and the circuit portion 282 are electrically connected to each other through a wiring portion 286 formed of a plurality of wirings.

The pixel portion 284 includes a plurality of pixels 284$a$ arranged periodically. An enlarged view of one pixel 284$a$ is illustrated on the right side of FIG. 25B. The pixel 284$a$ includes the light-emitting and light-receiving device 430SR, the light-emitting device 430G, and the light-emitting device 430B. The plurality of light-emitting and light-receiving devices and light-emitting devices may be arranged in a stripe pattern as illustrated in FIG. 25B. With the stripe pattern that enables high-density arrangement of pixel circuits, a high-resolution display apparatus can be provided. Alternatively, a variety of arrangement methods, such as a delta arrangement and a PenTile arrangement, can be employed.

The pixel circuit portion 283 includes a plurality of pixel circuits 283a arranged periodically.

One pixel circuit 283a is a circuit that controls light reception and light emission of the light-emitting and light-receiving device included in one pixel 284a and light emission of the light-emitting devices included in the pixel 284a. One pixel circuit 283a may be provided with three circuits each of which controls different one of the light-emitting and light-receiving device and the light-emitting devices. For example, the pixel circuit 283a can include at least one selection transistor, one current control transistor (driving transistor), and a capacitor for one light-emitting and light-receiving device or one light-emitting device. In this case, a gate signal is input to a gate of the selection transistor, and a source signal is input to one of a source and a drain of the selection transistor. Thus, an active-matrix display apparatus is achieved.

The circuit portion 282 includes a circuit for driving the pixel circuits 283a in the pixel circuit portion 283. For example, one or both of a gate line driver circuit and a source line driver circuit are preferably included. In addition, at least one of an arithmetic circuit, a memory circuit, a power supply circuit, and the like may be included.

The FPC 290 functions as a wiring for supplying a video signal, a power supply potential, or the like to the circuit portion 282 from the outside. An IC may be mounted on the FPC 290.

The display module 280 can have a structure in which one or both of the pixel circuit portion 283 and the circuit portion 282 are stacked below the pixel portion 284; hence, the aperture ratio (effective display area ratio) of the display portion 281 can be significantly high. For example, the aperture ratio of the display portion 281 can be greater than or equal to 40% and less than 100%, preferably greater than or equal to 50% and less than or equal to 95%, further preferably greater than or equal to 60% and less than or equal to 95%. Furthermore, the pixels 284a can be arranged extremely densely and thus the display portion 281 can have extremely high resolution. For example, the pixels 284a are preferably arranged in the display portion 281 with a resolution higher than or equal to 2000 ppi, preferably higher than or equal to 3000 ppi, further preferably higher than or equal to 5000 ppi, still further preferably higher than or equal to 6000 ppi, and lower than or equal to 20000 ppi or lower than or equal to 30000 ppi.

Such a display module 280 has extremely high resolution, and thus can be suitably used for a VR device such as a head-mounted display or a glasses-type AR device. For example, even with a structure in which the display portion of the display module 280 is seen through a lens, pixels of the extremely-high-resolution display portion 281 included in the display module 280 are prevented from being perceived when the display portion is enlarged by the lens, so that display providing a high sense of immersion can be performed. Without being limited thereto, the display module 280 can be suitably used for electronic devices including a relatively small display portion. For example, the display module 280 can be suitably used in a display portion of a wearable electronic device such as a watch-type device.

[Display Apparatus 400C]

Figure 26:
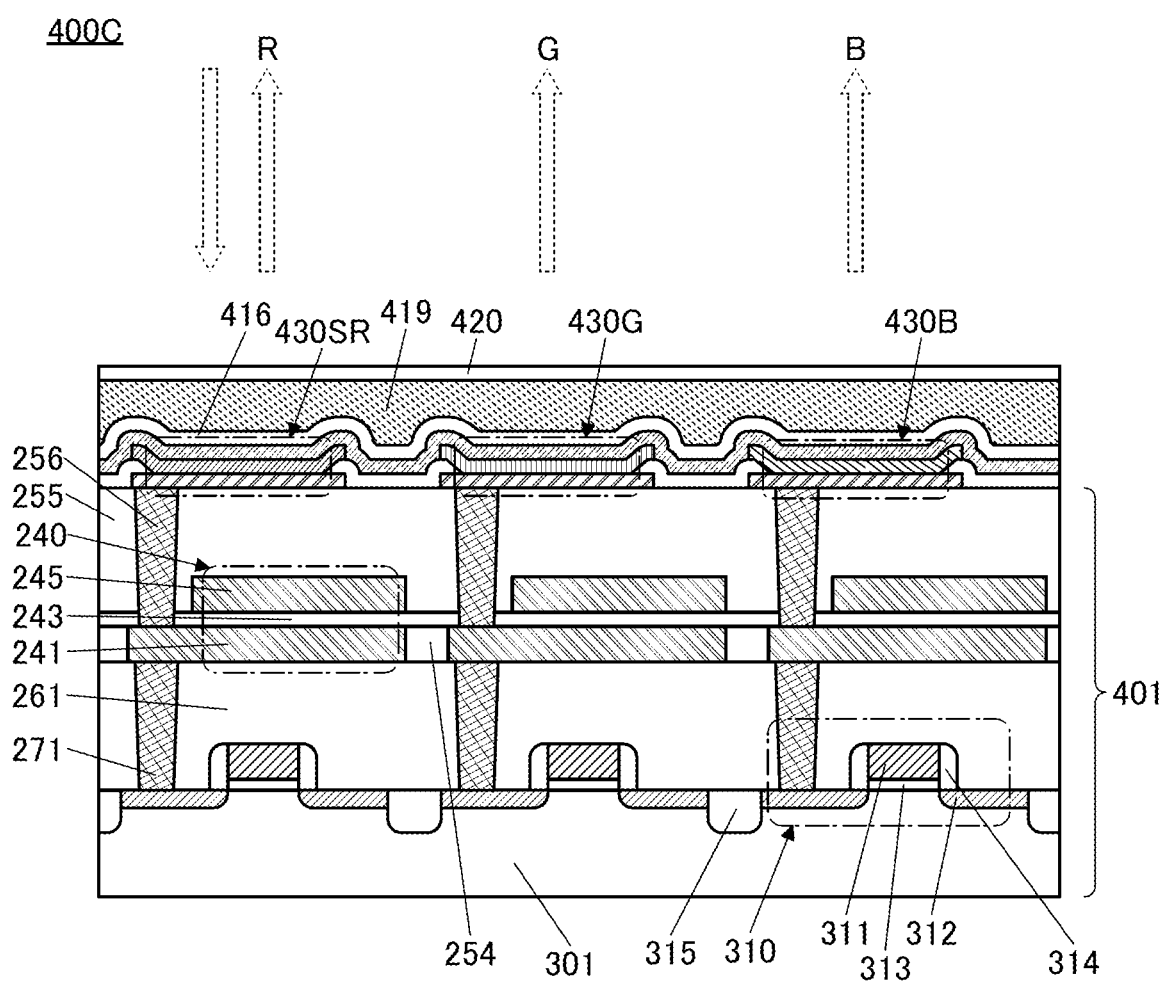
FIG. 26 is a cross-sectional view illustrating an example of a display apparatus.

The display apparatus 400C illustrated in FIG. 26 includes a substrate 301, the light-emitting and light-receiv-ing device 430SR, the light-emitting device 430G, the light-emitting device 430B, a capacitor 240, and a transistor 310.

The substrate 301 corresponds to the substrate 291 illustrated in FIG. 25A and FIG. 25B. A stacked-layer structure including the substrate 301 and the components thereover up to an insulating layer 255 corresponds to the substrate in Embodiment 1.

The transistor 310 is a transistor including a channel formation region in the substrate 301. As the substrate 301, a semiconductor substrate such as a single crystal silicon substrate can be used, for example. The transistor 310 includes part of the substrate 301, a conductive layer 311, low-resistance regions 312, an insulating layer 313, and an insulating layer 314. The conductive layer 311 functions as a gate electrode. The insulating layer 313 is positioned between the substrate 301 and the conductive layer 311 and functions as a gate insulating layer. The low-resistance regions 312 are regions where the substrate 301 is doped with an impurity, and function as a source and a drain. The insulating layer 314 is provided to cover the side surface of the conductive layer 311 and functions as an insulating layer.

An element isolation layer 315 is provided between two adjacent transistors 310 to be embedded in the substrate 301.

An insulating layer 261 is provided to cover the transistor 310, and the capacitor 240 is provided over the insulating layer 261.

The capacitor 240 includes a conductive layer 241, a conductive layer 245, and an insulating layer 243 positioned therebetween. The conductive layer 241 functions as one electrode of the capacitor 240, the conductive layer 245 functions as the other electrode of the capacitor 240, and the insulating layer 243 functions as a dielectric of the capacitor 240.

The conductive layer 241 is provided over the insulating layer 261 and is embedded in an insulating layer 254. The conductive layer 241 is electrically connected to one of the source and the drain of the transistor 310 through a plug 271 embedded in the insulating layer 261. The insulating layer 243 is provided to cover the conductive layer 241. The conductive layer 245 is provided in a region overlapping with the conductive layer 241 with the insulating layer 243 therebetween.

The insulating layer 255 is provided to cover the capacitor 240, and the light-emitting and light-receiving device 430SR, the light-emitting device 430G, the light-emitting device 430B, and the like are provided over the insulating layer 255. The protective layer 416 is provided over the light-emitting and light-receiving device 430SR, the light-emitting device 430G, and the light-emitting device 430B, and a substrate 420 is bonded to the top surface of the protective layer 416 with a resin layer 419. The substrate 420 corresponds to the substrate 292 illustrated in FIG. 25A.

The pixel electrode of the light-emitting device is elec-trically connected to one of the source and the drain of the transistor 310 through a plug 256 embedded in the insulating layer 255, the conductive layer 241 embedded in the insu-lating layer 254, and the plug 271 embedded in the insulat-ing layer 261.

[Display Apparatus 400D]

Figure 27:
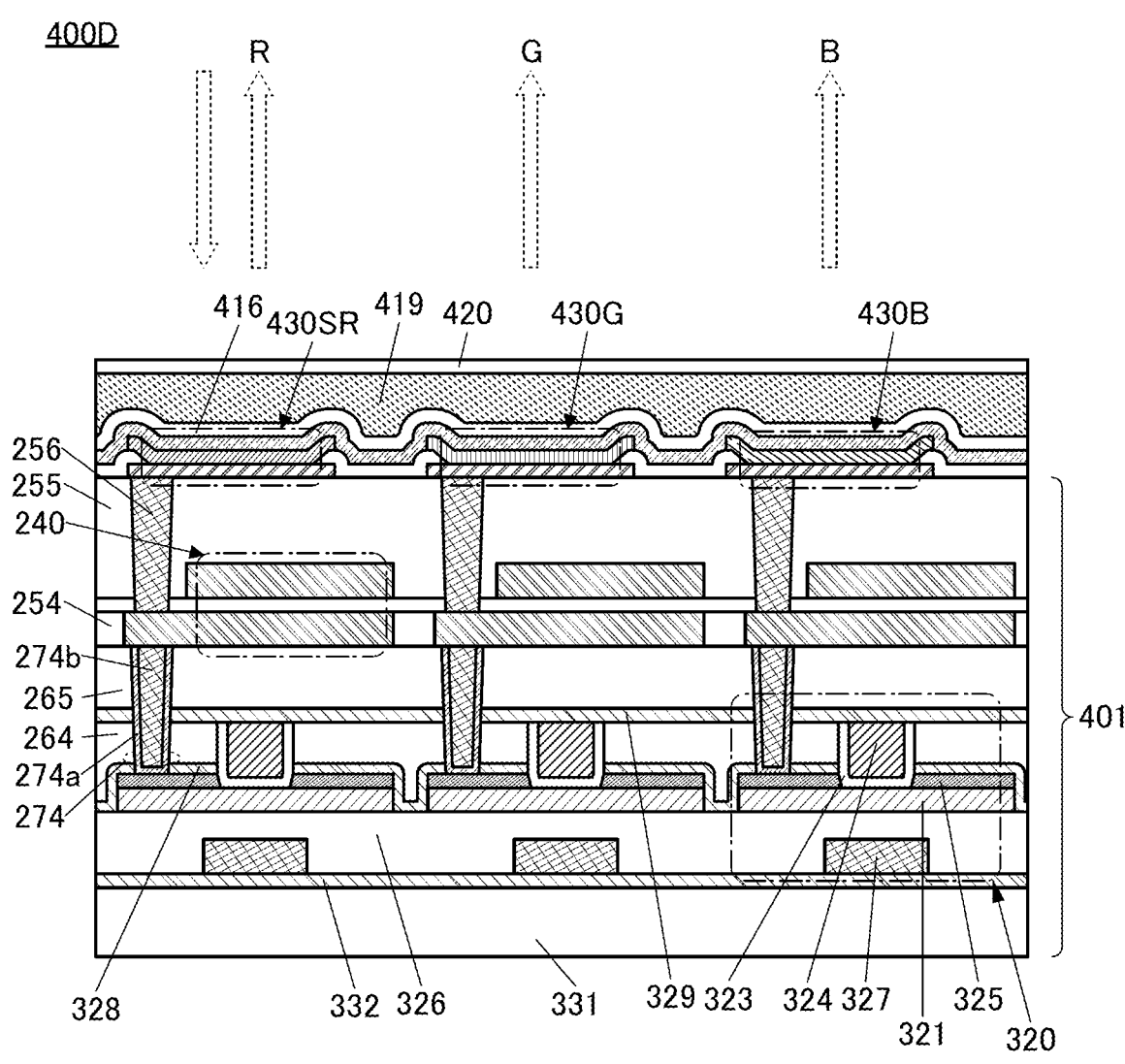
FIG. 27 is a cross-sectional view illustrating an example of a display apparatus.

The display apparatus 400D illustrated in FIG. 27 differs from the display apparatus 400C mainly in a structure of a transistor. Note that portions similar to those in the display apparatus 400C are not described in some cases.

A transistor 320 is a transistor that contains a metal oxide (also referred to as an oxide semiconductor) in a semicon-ductor layer where a channel is formed.

The transistor 320 includes a semiconductor layer 321, an insulating layer 323, a conductive layer 324, a pair of conductive layers 325, an insulating layer 326, and a conductive layer 327.

A substrate 331 corresponds to the substrate 291 in FIG. 25A and FIG. 25B. The stacked-layer structure including the substrate 331 and the components thereover up to the insulating layer 255 corresponds to the layer 401 including a transistor in Embodiment 1. As the substrate 331, an insulating substrate or a semiconductor substrate can be used.

An insulating layer 332 is provided over the substrate 331. The insulating layer 332 functions as a barrier layer that prevents diffusion of impurities such as water and hydrogen from the substrate 331 into the transistor 320 and release of oxygen from the semiconductor layer 321 to the insulating layer 332 side. As the insulating layer 332, for example, a film through which hydrogen or oxygen is less likely to diffuse than in a silicon oxide film, such as an aluminum oxide film, a hafnium oxide film, or a silicon nitride film, can be used.

The conductive layer 327 is provided over the insulating layer 332, and the insulating layer 326 is provided to cover the conductive layer 327. The conductive layer 327 functions as a first gate electrode of the transistor 320, and part of the insulating layer 326 functions as a first gate insulating layer. An oxide insulating film such as a silicon oxide film is preferably used as at least part of the insulating layer 326 that is in contact with the semiconductor layer 321. The top surface of the insulating layer 326 is preferably planarized.

The semiconductor layer 321 is provided over the insulating layer 326. The semiconductor layer 321 preferably includes a metal oxide (also referred to as an oxide semiconductor) film having semiconductor characteristics. A material that can be suitably used for the semiconductor layer 321 will be described in detail later.

The pair of conductive layers 325 are provided over and in contact with the semiconductor layer 321 and function as a source electrode and a drain electrode.

An insulating layer 328 is provided to cover the top and side surfaces of the pair of conductive layers 325, the side surface of the semiconductor layer 321, and the like, and an insulating layer 264 is provided over the insulating layer 328. The insulating layer 328 functions as a barrier layer that prevents diffusion of impurities such as water and hydrogen from the insulating layer 264 and the like into the semiconductor layer 321 and release of oxygen from the semiconductor layer 321. As the insulating layer 328, an insulating film similar to the insulating layer 332 can be used.

An opening reaching the semiconductor layer 321 is provided in the insulating layer 328 and the insulating layer 264. The insulating layer 323 that is in contact with the side surfaces of the insulating layer 264, the insulating layer 328, and the conductive layer 325 and the top surface of the semiconductor layer 321, and the conductive layer 324 are embedded in the opening. The conductive layer 324 functions as a second gate electrode, and the insulating layer 323 functions as a second gate insulating layer.

The top surface of the conductive layer 324, the top surface of the insulating layer 323, and the top surface of the insulating layer 264 are planarized so that they are substantially level with each other, and an insulating layer 329 and an insulating layer 265 are provided to cover these layers.

The insulating layer 264 and the insulating layer 265 each function as an interlayer insulating layer. The insulating layer 329 functions as a barrier layer that prevents diffusion of impurities such as water and hydrogen from the insulating layer 265 and the like into the transistor 320. As the insulating layer 329, an insulating film similar to the insulating layer 328 and the insulating layer 332 can be used.

A plug 274 electrically connected to one of the pair of conductive layers 325 is provided to be embedded in the insulating layer 265, the insulating layer 329, and the insulating layer 264. Here, the plug 274 preferably includes a conductive layer 274a that covers the side surface of an opening in the insulating layer 265, the insulating layer 329, the insulating layer 264, and the insulating layer 328 and part of the top surface of the conductive layer 325, and a conductive layer 274b in contact with the top surface of the conductive layer 274a. In this case, a conductive material through which hydrogen and oxygen are less likely to diffuse is preferably used for the conductive layer 274a.

The structures of the insulating layer 254 and the components thereover up to the substrate 420 in the display apparatus 400D are similar to those in the display apparatus 400C.

Figure 28:
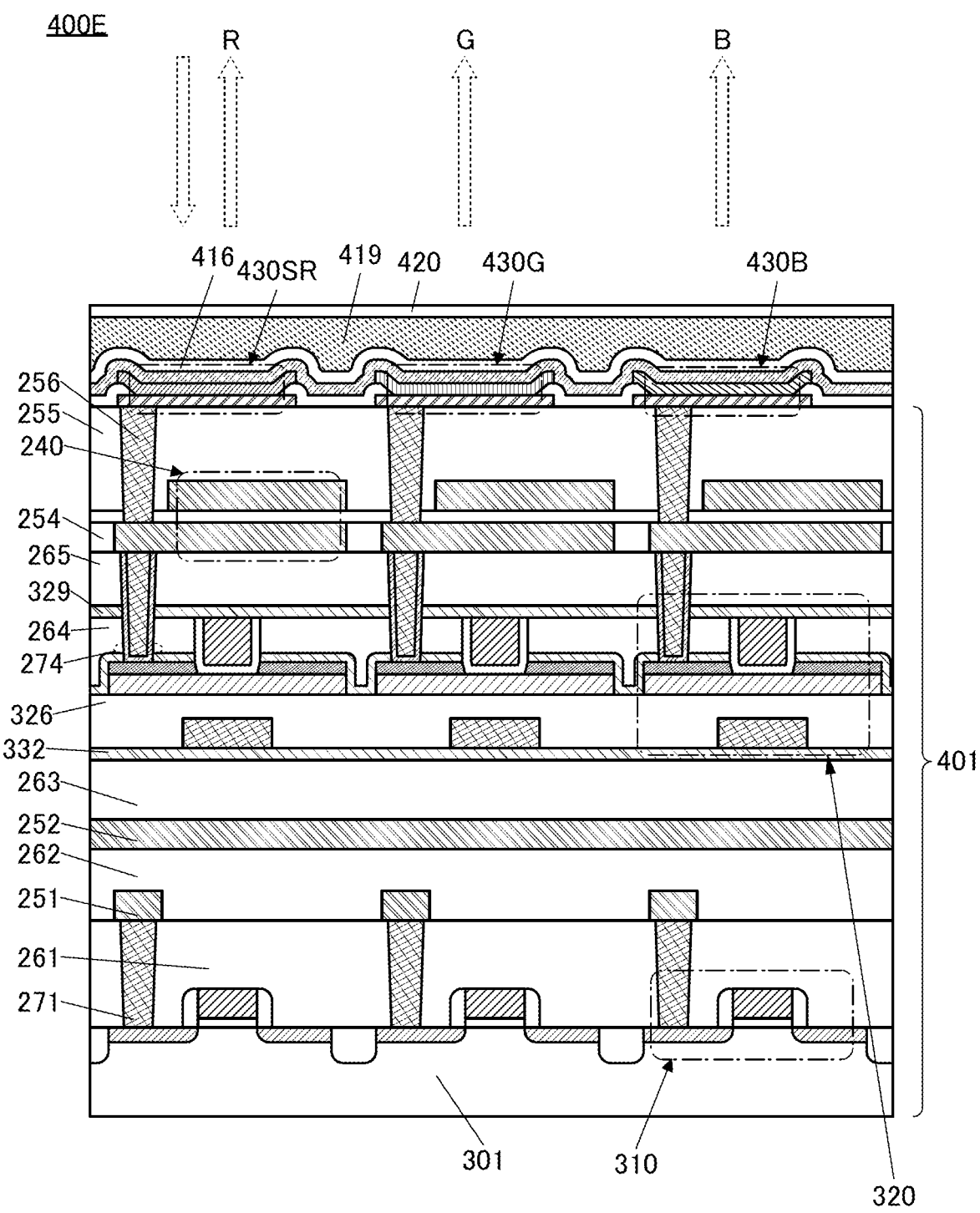
FIG. 28 is a cross-sectional view illustrating an example of a display apparatus.

[Display apparatus 400E] The display apparatus 400E illustrated in FIG. 28 has a structure in which the transistor 310 whose channel is formed in the substrate 301 and the transistor 320 including a metal oxide in the semiconductor layer where the channel is formed are stacked. Note that portions similar to those in the display apparatuses 400C and 400D are not described in some cases.

The insulating layer 261 is provided to cover the transistor 310, and a conductive layer 251 is provided over the insulating layer 261. An insulating layer 262 is provided to cover the conductive layer 251, and a conductive layer 252 is provided over the insulating layer 262. The conductive layer 251 and the conductive layer 252 each function as a wiring. An insulating layer 263 and the insulating layer 332 are provided to cover the conductive layer 252, and the transistor 320 is provided over the insulating layer 332. The insulating layer 265 is provided to cover the transistor 320, and the capacitor 240 is provided over the insulating layer 265. The capacitor 240 and the transistor 320 are electrically connected to each other through the plug 274.

The transistor 320 can be used as a transistor included in the pixel circuit. The transistor 310 can be used as a transistor included in the pixel circuit or a transistor included in a driver circuit (a gate line driver circuit or a source line driver circuit) for driving the pixel circuit. The transistor 310 and the transistor 320 can also be used as transistors included in a variety of circuits such as an arithmetic circuit and a memory circuit.

With such a structure, not only the pixel circuit but also the driver circuit and the like can be formed directly under the light-emitting devices; thus, the display apparatus can be downsized as compared with the case where a driver circuit is provided around a display region.

At least part of the structure examples, the drawings corresponding thereto, and the like described in this embodiment as an example can be combined with the other structure examples, the other drawings, and the like as appropriate.

At least part of this embodiment can be implemented in combination with the other embodiments described in this specification as appropriate.

Embodiment 4

In this embodiment, a method for driving a display apparatus of one embodiment of the present invention will be described with reference to FIG. 29 to FIG. 34.

Figure 29:
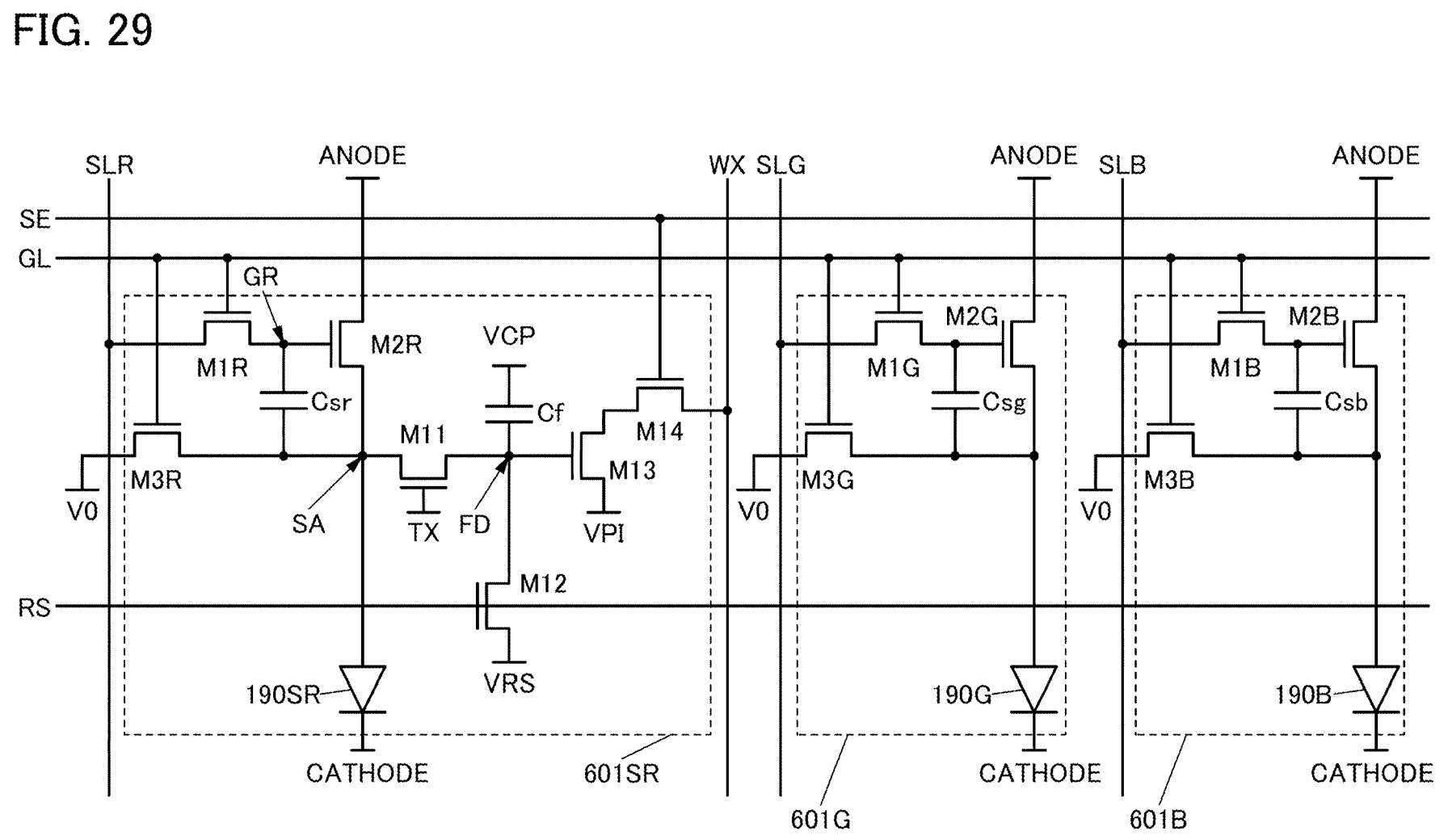

FIG. 29 shows a circuit diagram of a pixel of a display apparatus.

The pixel shown in FIG. 29 includes a subpixel 601SR that emits red light and has a light-receiving function, a subpixel 601G that emits green light, and a subpixel 601B that emits blue light.

The subpixel 601SR includes a transistor M1R, a transistor M2R, a transistor M3R, a transistor M11, a transistor M12, a transistor M13, a transistor M14, a capacitor Csr, a capacitor Cf, and the light-emitting and light-receiving device 190SR. The transistor M1R, the transistor M3R, the transistor M11, the transistor M12, and the transistor M14 each function as a switch.

A gate of the transistor M1R is electrically connected to a wiring GL, one of a source and a drain of the transistor M1R is electrically connected to a wiring SLR, and the other thereof is electrically connected to a gate of the transistor M2R and one electrode of the capacitor Csr. One of a source and a drain of the transistor M2R is electrically connected to one of a source and a drain of the transistor M3R, one of a source and a drain of the transistor M11, the other electrode of the capacitor Csr, and an anode of the light-emitting and light-receiving device 190SR, and the other thereof is electrically connected to a wiring ANODE. A gate of the transistor M3R is electrically connected to the wiring GL, and the other of the source and the drain of the transistor M3R is electrically connected to a wiring V0. A gate of the transistor M11 is electrically connected to a wiring TX, and the other of the source and the drain of the transistor M11 is electrically connected to one of a source and a drain of the transistor M12, a gate of the transistor M13, and one electrode of the capacitor Cf. A gate of the transistor M12 is electrically connected to a wiring RS, and the other of the source and the drain of the transistor M12 is electrically connected to a wiring VRS. One of a source and a drain of the transistor M13 is electrically connected to one of a source and a drain of the transistor M14, and the other thereof is electrically connected to a wiring VPI. A gate of the transistor M14 is electrically connected to a wiring SE, and the other of the source and the drain of the transistor M14 is electrically connected to a wiring WX. The other electrode of the capacitor Cf is electrically connected to a wiring VCP. A cathode of the light-emitting and light-receiving device 190SR is electrically connected to a wiring CATHODE.

The subpixel 601G includes a transistor M1G, a transistor M2G, a transistor M3G, a capacitor Csg, and the light-emitting device 190G. The transistor M1G and the transistor M3G each function as a switch.

A gate of the transistor M1G is electrically connected to the wiring GL, one of a source and a drain of the transistor M1G is electrically connected to a wiring SLG, and the other thereof is electrically connected to a gate of the transistor M2G and one electrode of the capacitor Csg. One of a source and a drain of the transistor M2G is electrically connected to one of a source and a drain of the transistor M3G, the other electrode of the capacitor Csg, and an anode of the light-emitting device 190G, and the other thereof is electrically connected to the wiring ANODE. A gate of the transistor M3G is electrically connected to the wiring GL, and the other of the source and the drain of the transistor M3G is electrically connected to the wiring V0. A cathode of the light-emitting device 190G is electrically connected to the wiring CATHODE.

The subpixel 601B includes a transistor M1B, a transistor M2B, a transistor M3B, a capacitor Csb, and the light-emitting device 190B. The transistor M1B and the transistor M3B each function as a switch.

A gate of the transistor M1B is electrically connected to the wiring GL, one of a source and a drain of the transistor M1B is electrically connected to a wiring SLB, and the other thereof is electrically connected to a gate of the transistor M2B and one electrode of the capacitor Csb. One of a source and a drain of the transistor M2B is electrically connected to one of a source and a drain of the transistor M3B, the other electrode of the capacitor Csb, and an anode of the light-emitting device 190B, and the other thereof is electrically connected to the wiring ANODE. A gate of the transistor M3B is electrically connected to the wiring GL, and the other of the source and the drain of the transistor M3B is electrically connected to the wiring V0. A cathode of the light-emitting device 190B is electrically connected to the wiring CATHODE.

Signals for controlling operations of the transistors are supplied to the wiring GL, the wiring SE, the wiring TX, and the wiring RS.

In the case of displaying an image, image signals VdataR, VdataG, and VdataB are supplied to the wirings SLR, SLG, and SLB, respectively.

Predetermined potentials are supplied to the wiring V0, the wiring VPI, the wiring VCP, the wiring VRS, the wiring ANODE, and the wiring CATHODE. A potential Vo corresponding to black display of the image signals VdataR, VdataG, and VdataB (e.g., 0 V) is supplied to the wiring V0. A potential higher than a maximum potential applied to the gate of the transistor M13 is supplied to the wiring VPI. An arbitrary potential (e.g., 0 V) can be supplied to the wiring VCP. A potential lower than that of the wiring CATHODE is supplied to the wiring VRS. A potential higher than that of the wiring CATHODE is supplied to the wiring ANODE.

The transistor M1R, the transistor M1G, the transistor M1B, the transistor M3R, the transistor M3G, and the transistor M3B are controlled by a signal supplied to the wiring GL and function as selection transistors for controlling the selection states of the pixels.

The transistor M2R functions as a driving transistor that controls a current flowing to the light-emitting and light-receiving device 190SR in accordance with a potential supplied to the gate. Similarly, the transistor M2G and the transistor M2B each function as a driving transistor that controls a current flowing to the light-emitting device 190G or the light-emitting device 190B in accordance with a potential supplied to the gate.

When the transistor M1R is in a conducting state, the transistor M3R is also in a conducting state at the same time, so that a potential supplied to the wiring SLR (e.g., the image signal VdataR) is supplied to the gate of the transistor M2R and the potential Vo supplied to the wiring V0 is supplied to the source of the transistor M3R. A charge corresponding to the voltage VdataR–Vo is accumulated in the capacitor Csr. The light-emitting and light-receiving device 190SR can emit light with a luminance corresponding to the potential of a node GR (the gate potential of the transistor M2R).

Similarly, when the transistor M1G is in a conducting state, the transistor M3G is also in a conducting state at the same time, so that a potential supplied to the wiring SLG (e.g., the image signal VdataG) is supplied to the gate of the transistor M2G and the potential Vo supplied to the wiring V0 is supplied to the source or the drain of the transistor M3G. A charge corresponding to the voltage VdataG–Vo is accumulated. The light-emitting device 190G can emit light with a luminance corresponding to the gate potential of the transistor M2G. When the transistor M1B is in a conducting state, the transistor M3B is also in a conducting state at the same time, so that a potential supplied to the wiring SLB (e.g., the image signal VdataB) is supplied to the gate of the transistor M2B and the potential Vo supplied to the wiring V0 is supplied to the source or the drain of the transistor M3B. A charge corresponding to the voltage VdataB−Vo is accumulated in the capacitor Csb. The light-emitting device 190B can emit light with a luminance corresponding to the gate potential of the transistor M2B.

The transistor M11 is controlled by a signal supplied to the wiring TX and has a function of controlling the timing at which the potential of a node FD changes, in accordance with a current flowing through the light-emitting and light-receiving device 190SR. The transistor M12 is controlled by a signal supplied to the wiring RS and has a function of resetting the potential of the node FD connected to the gate of the transistor M13 by changing the potential of the node FD to a potential supplied to the wiring VRS. The transistor M13 functions as an amplifier transistor that performs output corresponding to the potential of the node FD. The transistor M14 is controlled by a signal supplied to the wiring SE and functions as a selection transistor for reading an output corresponding to the potential of the node FD by an external circuit connected to the wiring WX.

In the display apparatus of one embodiment of the present invention, it is preferable to use transistors including a metal oxide (also referred to as an oxide semiconductor) in their semiconductor layers where channels are formed (such transistors are also referred to as OS transistors below) as all the transistors included in the pixel shown in FIG. 29. An OS transistor has an extremely low off-state current and enables charge stored in a capacitor that is series-connected to the transistor to be retained for a long time. Furthermore, power consumption of the display apparatus can be reduced with an OS transistor.

Alternatively, in the display apparatus of one embodiment of the present invention, it is preferable to use transistors including silicon in their semiconductor layers where channels are formed (such transistors are also referred to as Si transistors below) as all the transistors included in the pixel shown in FIG. 29. As silicon, single crystal silicon, polycrystalline silicon, amorphous silicon, and the like can be given. It is particularly preferable to use transistors including low-temperature polysilicon (LTPS) (hereinafter also referred to as LTPS transistors) in their semiconductor layers. An LTPS transistor has high field-effect mobility and can operate at high speed.

With the use of Si transistors such as LTPS transistors, a variety of circuits formed using a CMOS circuit and a display portion can be easily formed on the same substrate. Thus, external circuits mounted on the display apparatus can be simplified, and costs of parts and mounting costs can be reduced.

Alternatively, in the display apparatus of one embodiment of the present invention, two kinds of transistors are preferably used in the subpixel (SR) including the light-emitting and light-receiving device. Specifically, the subpixel preferably includes an OS transistor and an LTPS transistor. Changing the material of the semiconductor layer depending on the desired function of the transistor can increase the quality of the pixel circuit of the subpixel (SR) including the light-emitting and light-receiving device and increase the accuracy of sensing or image capturing. In that case, in the subpixels (G) and (B) that include the light-emitting devices, OS transistors and/or LTPS transistors can be used.

Furthermore, even when two kinds of transistors (e.g., OS transistors and LTPS transistors) are used in the pixel, using the LTPS transistors facilitates formation of a variety of circuits formed using a CMOS circuit and a display portion on the same substrate. Thus, external circuits mounted on the display apparatus can be simplified, and costs of parts and mounting costs can be reduced.

A transistor using a metal oxide having a wider band gap and a lower carrier density than silicon can achieve an extremely low off-state current. Thus, such a low off-state current enables long-term retention of charge accumulated in a capacitor that is connected in series with the transistor. Therefore, it is preferable to use OS transistors especially as the transistor M1R, the transistor M1G, the transistor M1B, the transistor M3R, the transistor M3G, the transistor M3B, the transistor M11, and the transistor M12 that are series-connected to the capacitor Csr, the capacitor Csg, the capacitor Csb, or the capacitor Cf.

A Si transistor is preferably used as the transistor M13. This enables high-speed reading operation of imaging data.

Although n-channel transistors are shown as the transistors in FIG. 29, p-channel transistors can be used. The transistors are not limited to single-gate transistors and may further include a back gate.

One or more layers including one or both of the transistor and the capacitor are preferably provided at a position overlapping with the light-emitting and light-receiving device 190SR, the light-emitting device 190G, or the light-emitting device 190B. Thus, the effective area of each pixel circuit can be reduced, and a high-definition display portion can be achieved.

Figures 30A, 30B:
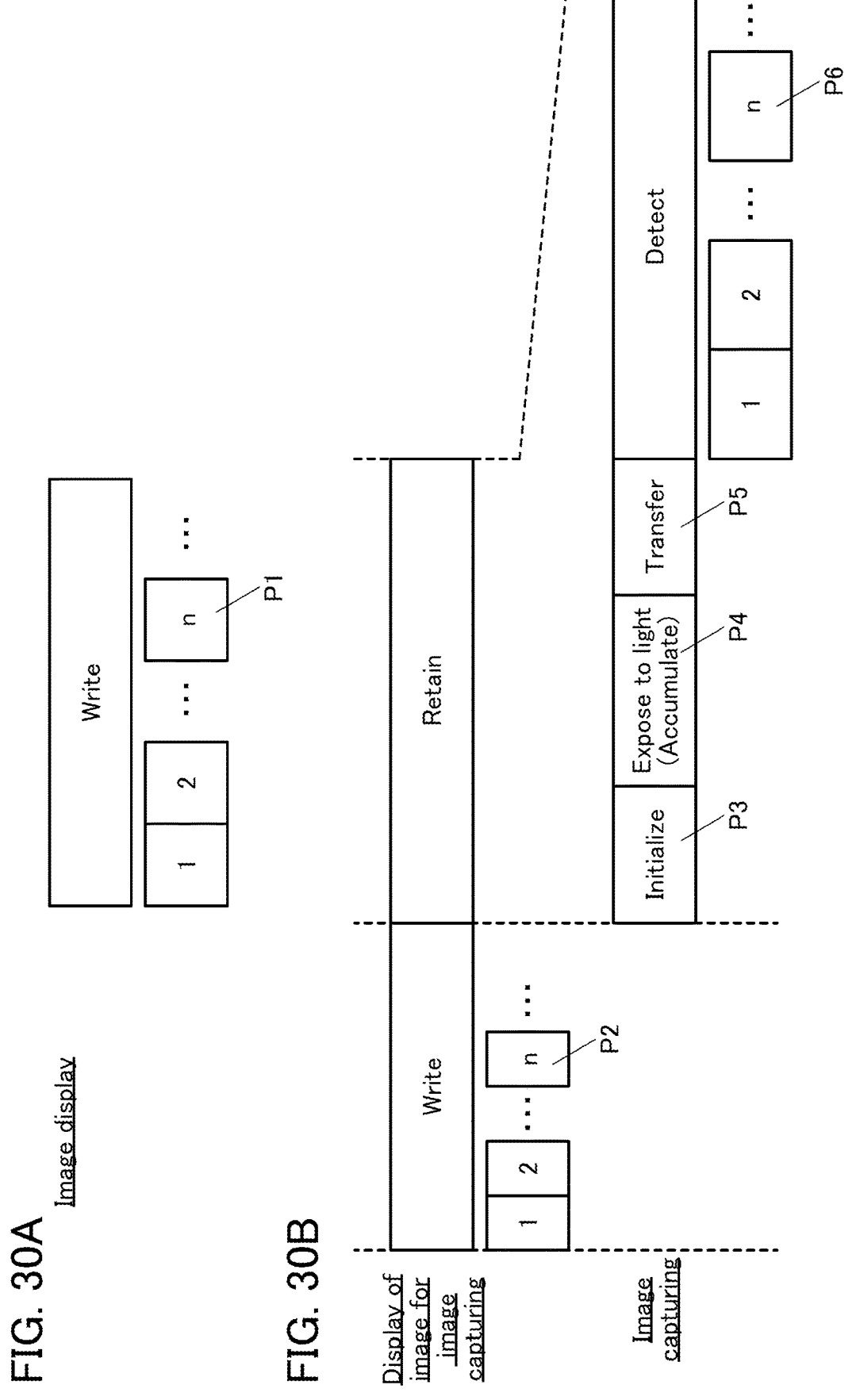
FIG. 30A and FIG. 30B are diagrams illustrating an example of a method for driving a display apparatus.

FIG. 30A and FIG. 30B show an example of a method for driving a display apparatus. FIG. 31A to FIG. 32B show timing charts of operations.

As shown in FIG. 30A, in the case of performing image display, an operation of writing an image signal is performed row by row.

FIG. 31A shows a timing chart of an operation P1 of writing an image signal in a pixel of the n-th row.

First, before Time Ti, the potential of the wiring GL[n] is set to a high potential and the potentials of the wiring TX, the wiring RS [n], and the wiring SE[n] are each set to a low potential. Accordingly, the transistor M1R and the transistor M3R are turned on, so that a charge corresponding to a potential difference (a voltage DataR[n]−Vo) between a potential DataR[n] of the wiring SLR and the potential Vo of the wiring V0 is accumulated in the capacitor Csr. Furthermore, the transistor M1G and the transistor M3G are turned on, so that a charge corresponding to a potential difference (a voltage DataG[n]−Vo) between a potential DataG[n] of the wiring SLG and the potential Vo of the wiring V0 is accumulated in the capacitor Csg. Moreover, the transistor M1B and the transistor M3B are turned on, so that a charge corresponding to a potential difference (a voltage DataB[n]−Vo) between a potential DataB[n] of the wiring SLB and the potential Vo of the wiring V0 is accumulated in the capacitor Csb. At this time, the potential of the wiring WX[m] is a low potential.

Next, in a period between Time T1 to Time T2, the potential of the wiring GL[n] is set to a low potential, so that the transistors M1R, M1G, M1B, M3R, M3G, and M3B are turned off, the charges accumulated in the capacitors Csr, Csg, and Csb are retained, and the operation of writing the image signal is terminated. The light-emitting and light-receiving device 190SR, the light-emitting device 190G, and the light-emitting device 190B are each emit light on the basis of the gate potential of the transistor M2R, M2G, or M2B.

FIG. 30B shows a sequence in the case of performing image capturing by a global shutter method with the use of the light-emitting and light-receiving device 190SR. As shown in FIG. 30B, in the case where image capturing is performed using the light-emitting and light-receiving device 190SR, first, an operation of writing an image signal for image capturing is performed row by row; an initialization (reset) operation, a light-exposure (accumulation) operation, and a transfer operation are performed in this order in the subpixel having a light-receiving function while the written data is retained; and then, detection is performed by reading imaging data row by row.

FIG. 31B shows a timing chart of an operation P2 of writing an image signal for image capturing in the pixel of the n-th row. In the example described here, image capturing is performed with the light-emitting and light-receiving device 190SR using the light-emitting device 190G as a light source.

First, before Time T3, the potential of the wiring GL[n] is set to a high potential and the potentials of the wiring TX, the wiring RS [n], and the wiring SE[n] are each set to a low potential.

Accordingly, the transistor M1R and the transistor M3R are turned on, so that a charge corresponding to a potential difference (a voltage Vb–Vo) between a potential Vb of the wiring SLR and the potential Vo of the wiring V0 is accumulated in the capacitor Csr. Furthermore, the transistor M1G and the transistor M3G are turned on, so that a charge corresponding to a potential difference (a voltage Vem–Vo) between a potential Vem of the wiring SLG and the potential Vo of the wiring V0 is accumulated in the capacitor Csg. Moreover, the transistor M1B and the transistor M3B are turned on, so that a charge corresponding to a potential difference (the voltage Vb–Vo) between the potential Vb of the wiring SLB and the potential Vo of the wiring V0 is accumulated in the capacitor Csg. At this time, the potential of the wiring WX[m] is a low potential.

Here, the potential Vb of the wiring SLR is a potential such that the gate-source voltage (Vgs) and the threshold voltage (Vth) of the transistor M2R satisfy Vgs=Vb–Vo<Vth. Consequently, the transistor M2R can be turned off completely.

The potential Vem of the wiring SLG is set to a potential for making the light-emitting device 190G emit light. A potential that makes light emission of the light-emitting device 190G have a sufficient luminance for image capturing is preferably supplied as the potential Vem. A potential that makes the light-emitting device 190B not emit light is supplied to the wiring SLB. Although the potential Vb is supplied to the wiring SLB in the example shown in FIG. 31B, one embodiment of the present invention is not limited to the example. The potential supplied to the wiring SLB may be the same as or different from the potential supplied to the wiring SLR. Note that in the case where the light-emitting device 190B is also used as a light source at the time of image capturing, a potential for making the light-emitting device 190B emit light is supplied to the wiring SLB.

Next, in a period between Time T3 and Time T4, the potential of the wiring GL[n] is set to a low potential, so that the transistors M1R, M1G, M1B, M3R, M3G, and M3B are turned off, the charges accumulated in the capacitor Csr, Csg, and Csb are retained, and the operation of writing the image signal for image capturing is terminated. The light-emitting device 190G emits light on the basis of the gate potential of the transistor M2G.

FIG. 31C shows a timing chart of an initialization (reset) operation P3.

At Time T5, the potentials of the wiring TX and the wiring RS [n] are set to high potentials, so that the transistor M11 and the transistor M12 are turned on. Thus, the potential of the anode of the light-emitting and light-receiving device 190SR and the potential of the node FD can be set to the potential supplied to the wiring VRS, and the potential of the node FD can be reset. Since the node GR is floating, Vgs is stored and the transistor M2R remains off regardless of the potential of a node SA. When a potential lower than that of the wiring CATHODE is supplied to the wiring VRS, a reverse bias can be applied to the light-emitting and light-receiving device 190SR.

At Time T6, the potentials of the wiring TX and the wiring RS [n] are set to low potentials, so that the transistor M11 and the transistor M12 are turned off and the initialization operation is terminated.

FIG. 31D shows a timing chart of a light-exposure (accumulation) operation P4.

In a period from Time T7 to Time T8, the light-emitting and light-receiving device 190SR generates charge by receiving light emitted by the light-emitting device 190G. Thus, charge is accumulated in the capacitor of the light-emitting and light-receiving device 190SR, and the potential of the node SA becomes a potential corresponding to the charge generated in the light-emitting and light-receiving device 190SR.

Note that during the period from Time T7 to Time T8, the wiring SLR, the wiring SLG, the wiring SLB, the wiring GL[n], the wiring TX, the wiring RS [n], the wiring SE[n], and the wiring WX[m] can remain at low potentials.

Figures 32A, 32B:
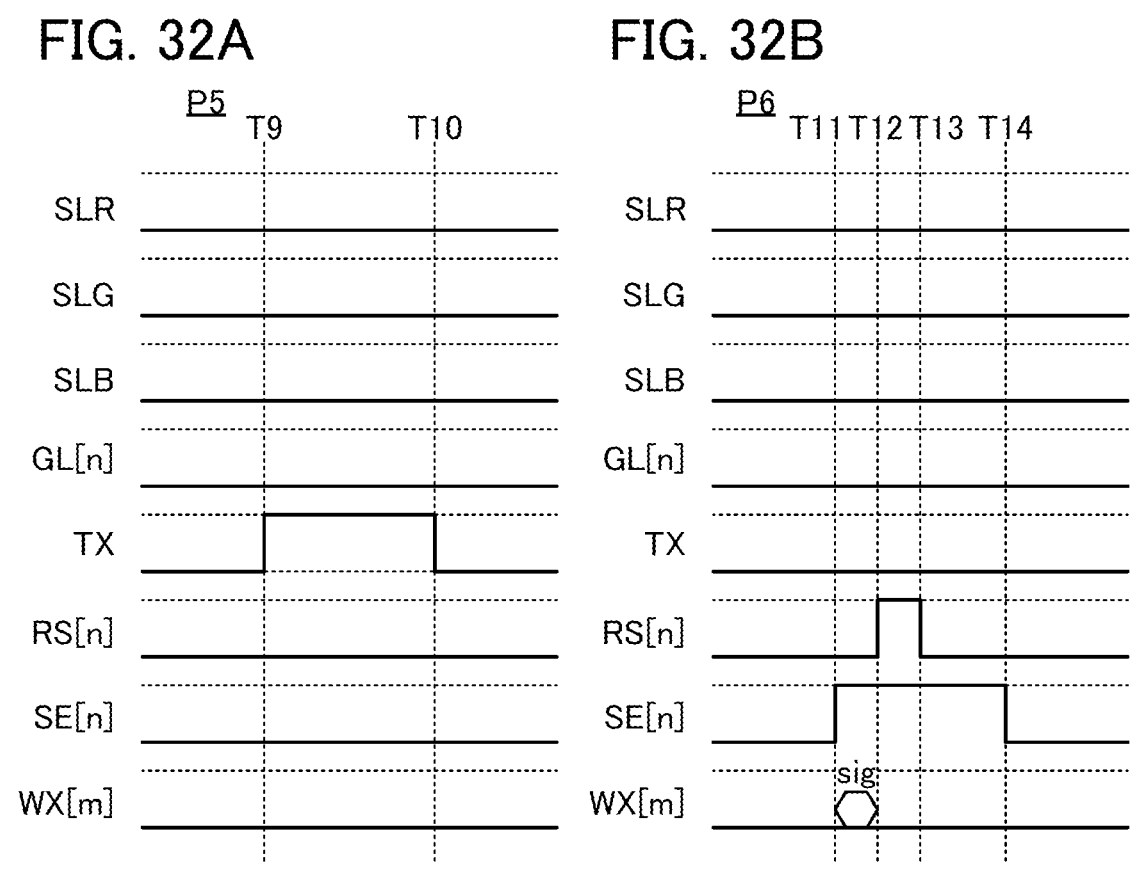

FIG. 32A shows a timing chart of a transfer operation P5.

At the time T9, the potential of the wiring TX is set to a high potential, so that the transistor M11 is turned on. Accordingly, charge is transferred from the node SA to the node FD. In other words, the potential of the node FD becomes a potential corresponding to the charge generated in the light-emitting and light-receiving device 190SR.

At Time T10, the potential of the wiring TX is set to a low potential, so that the transistor M11 is turned off and the transfer operation is terminated.

FIG. 32B shows a timing chart of a detection operation P6.

At Time T11, the potential of the wiring SE[n] is set to a high potential, so that the transistor M14 is turned on and the potential of the wiring WX[m] can be set to a potential corresponding to the charge generated in the light-emitting and light-receiving device 190SR. Accordingly, an output sig corresponding to the charge generated in the light-emitting and light-receiving device 190SR can be read out with an external circuit connected to the wiring WX[m]. Note that the transistor M13 can also be referred to as a transistor included in a source follower circuit.

At Time T12, the potential of the wiring RS [n] is set to a high potential while the wiring SE[n] remains at a high potential, so that the transistor M12 is turned on and the potential of the wiring WX[m] is reset to a potential corresponding to the potential of the wiring VRS. This enables the potential of a background to be read out. Accordingly, fixed pattern noise caused by the transistor M13 can be removed from the output signal that has been read out in the external circuit at Time T11. This can reduce influence of variations in the characteristics of the transistors M13 among the pixels.

At Time T13, the potential of the wiring RS [n] is set to a low potential, so that the transistor M12 is turned off At Time T14, the potential of the wiring SE[n] is set to t a low potential, so that the transistor M14 is turned off and the detection operation is terminated.

When the operations of Time T3 to Time T14 are performed repeatedly, image capturing can be performed repeatedly. In the case where OS transistors are used as the transistors M1R, M2R, M1G, M2G, M1B, and M2B, the image signal for image capturing can be retained for a long term; therefore, the frequency of performing the operation P2 of writing the image signal for image capturing can be low. Therefore, after the operations of Time T3 to Time T14 are performed once, the operations of Time T5 to Time T14 may be repeated predetermined times, and then the operation may return to Time T3.

Note that the display apparatus of this embodiment can be driven in any of an image display mode, an image capturing mode, and a mode of simultaneously performing image display and image capturing. In the image display mode, a full-color image can be displayed, for example. In the image capture mode, an image for image capturing (e.g., a green monochromatic image or a blue monochromatic image) can be displayed and image capturing can be performed with the light-emitting and light-receiving device, for example. Fingerprint identification can be performed in the image capture mode, for example. In the mode of simultaneously performing image display and image capturing, an image for image capturing can be displayed with the light-emitting device (the light-emitting devices 190G or the light-emitting device 190B) and image capturing can be performed with the light-emitting and light-receiving device 190SR in some pixels, and a full-color image can be displayed with the light-emitting and light-receiving device and the light-emitting device in the other pixels, for example.

An example of an operation method in the mode of simultaneously performing image display and image capturing is described with reference to FIG. 33.

Figure 33:
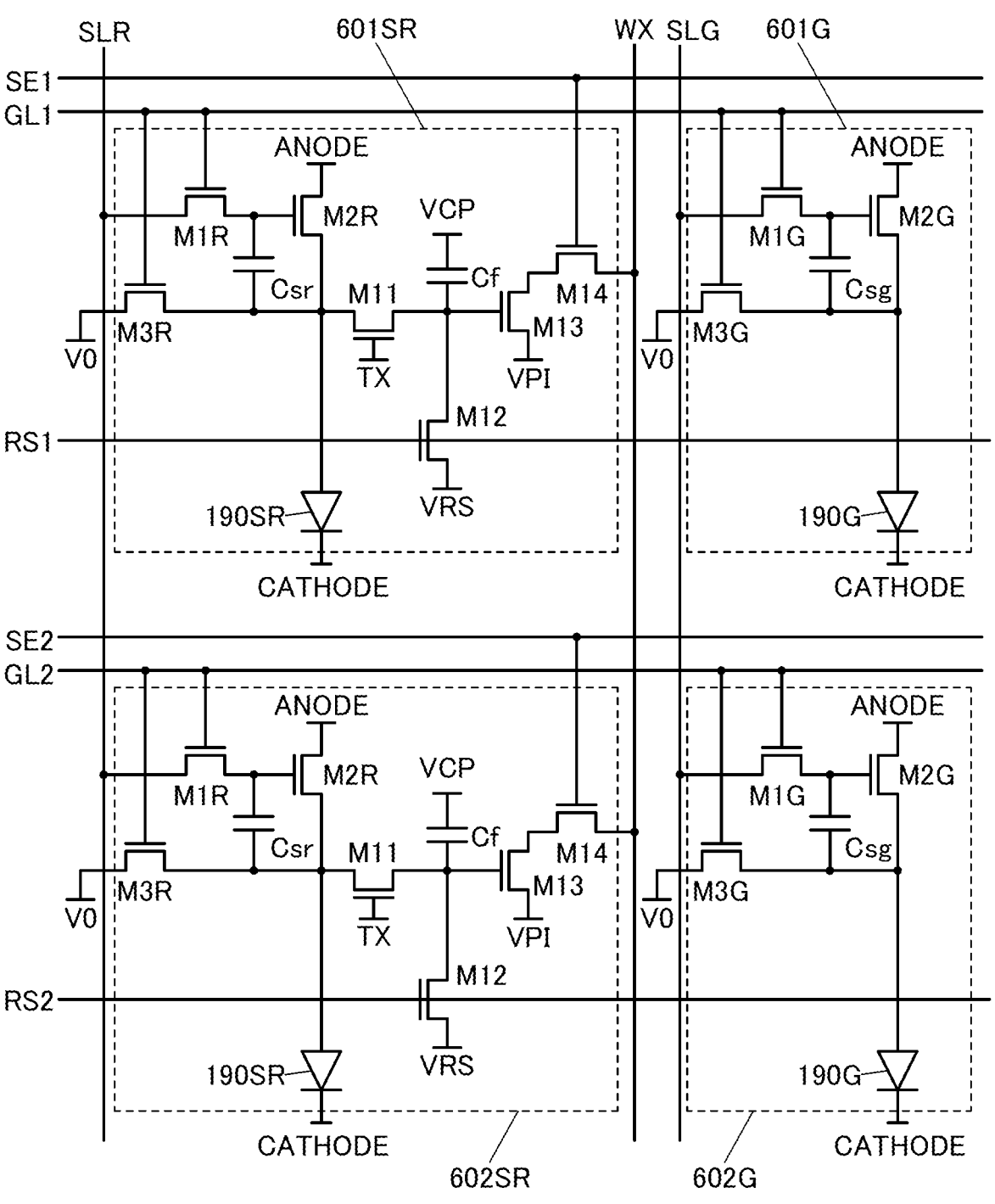
FIG. 33 is a circuit diagram illustrating an example of a pixel circuit.

FIG. 33 shows a pixel circuit of a subpixel 601SR and a subpixel 601G of the first row and a subpixel 602SR and a subpixel 602G of the second row. The circuit structure of each subpixel is similar to that in FIG. 29.

An example in which an image is displayed using the subpixel 601SR and the subpixel 601G of the first row and image capturing is performed using the subpixel 602SR and the subpixel 602G of the second row will be described below.

First, the potential of the wiring GL1 of the first row is set to a high potential and the potentials of the wiring TX, the wiring RS1, and the wiring SE1 are set to low potentials. Accordingly, the transistors M1R and M3R of the subpixel 601SR and the transistors M1G and M3G of the subpixel 601G are turned on, so that image signals are supplied from the wiring SLR and the wiring SLG. At this time, the potential of the wiring WX1 is a low potential. Then, the potential of the wiring GL1 is set low to a low potential, so that the transistors M1R, M1G, M3R, and M3G are turned off and the operation of writing an image signal is terminated. The light-emitting and light-receiving device 190SR and the light-emitting device 190G each emit light on the basis of the gate potential of the transistor M2R or M2G.

Next, the potential of the wiring GL2 of the second row is set to a high potential and the potentials of the wiring TX, the wiring RS2, and the wiring SE2 are set to low potentials.

Accordingly, the transistors M1R and M3R of the subpixel 602SR and the transistors M1G and M3G of the subpixel 602G are turned on, so that a potential making the transistor M2R turned off completely is supplied from the wiring SLR and an image signal for image capturing is supplied from the wiring SLG. At this time, the potential of the wiring WX2 is a low potential. Then, the potential of the wiring GL2 is set low to a low potential, so that the transistors M1R, M1G, M3R, and M3G are turned off and the operation of writing a signal is terminated. The light-emitting device 190G emits light on the basis of the gate potential of the transistor M2G. In addition, when the above-described initialization operation, light-exposure operation, transfer operation, and detection operation are performed, imaging capturing can be performed in the subpixel 602SR.

The function of an electronic device 6000 in which the display apparatus of one embodiment of the present invention is used as a display portion 6001 will be described with reference to FIG. 34A to FIG. 34C.

Figure 34A:
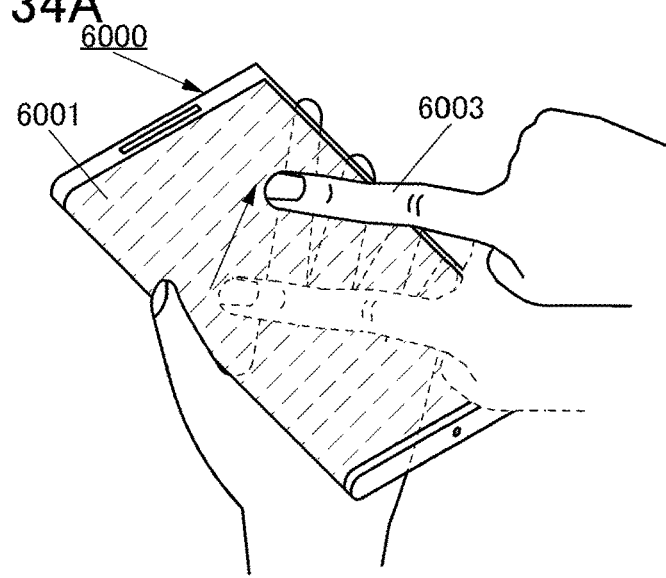
FIG. 34A to FIG. 34C are diagrams illustrating function examples of an electronic device.

The display portion 6001 can function as a touch panel as illustrated in FIG. 34A. The display portion 6001 can detect a touch by a finger 6003 while displaying a full-color image.

Figure 34B:
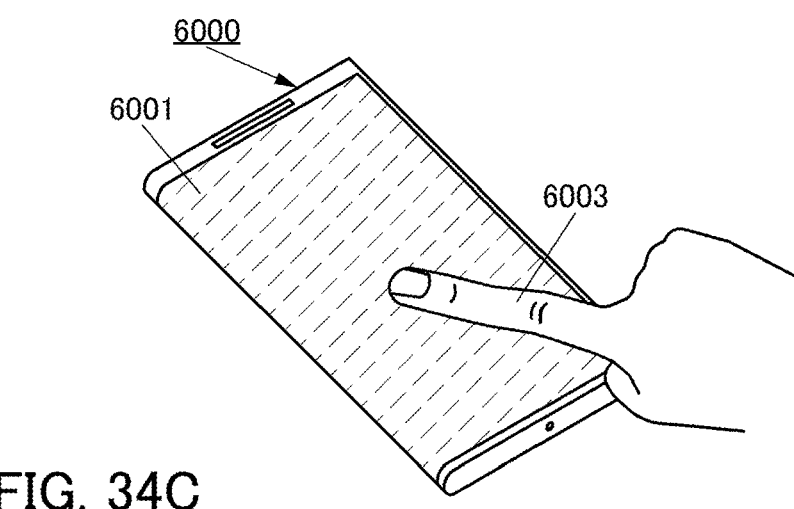
Figure 34C:
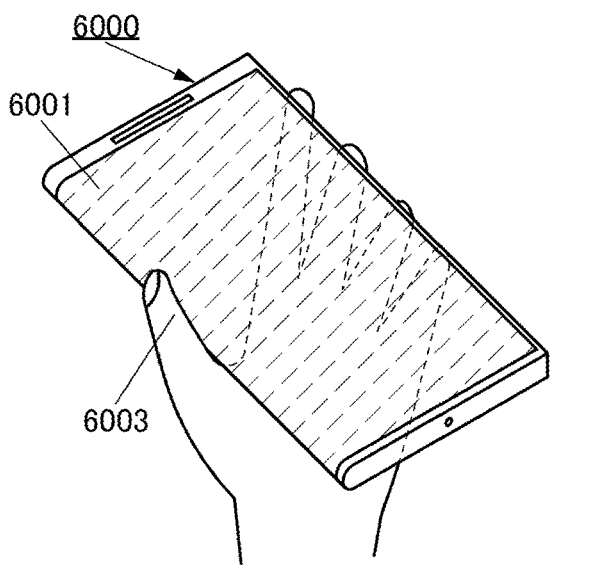

FIG. 34B illustrates an example of performing fingerprint identification of the finger 6003 touching the top surface of the display portion 6001, and FIG. 34C illustrates an example of performing fingerprint identification of the finger 6003 touching the side surface of the display portion 6001. Since the whole display portion of the display apparatus has a light-receiving function, the degree of freedom of a region used in fingerprint identification can be higher than that in the case where a fingerprint sensor is mounted in the electronic device in addition to the display apparatus. Furthermore, since the display apparatus of one embodiment of the present invention serves as all of a display panel, a fingerprint sensor, and a touch sensor, these need not be provided additionally, and therefore it is possible to reduce the size, thickness, and weight of the electronic device.

As described above, in the display apparatus of this embodiment, the subpixels (SR) that emit red light and have a light-receiving function can be used for both image display and light detection. Alternatively, some of the plurality of subpixels (SR) can be used for image display, and the others can be used for light detection. Accordingly, the display apparatus of this embodiment can be driven in any of an image display mode, an image capturing mode, and a mode of simultaneously performing image display and image capturing.

This embodiment can be combined with the other embodiments as appropriate.

Embodiment 5

In this embodiment, a driving method of a display apparatus of one embodiment of the present invention will be described with reference to FIG. 35A to FIG. 36B.

In this embodiment, the case where the display apparatus of one embodiment of the present invention functions as a touch panel is described.

High resolution is required in capturing an image of a fingerprint and thus, it is preferable that imaging data obtained with a light-emitting and light-receiving device be individually read out one (pixel) by one (pixel) from all the pixels. In contrast, in the case where the display apparatus functions as a touch panel, a resolution as high as that required for fingerprint authentication is not required but a high-speed reading operation is required.

For example, when touch detection is performed all at once in a plurality of pixels, the driving frequency can be increased. The pixels in which simultaneous reading is performed can be determined as appropriate to be 4 pixels (2×2 pixels), 9 pixels (3×3 pixels), or 16 pixels (4×4 pixels), for example.

Figure 35A:
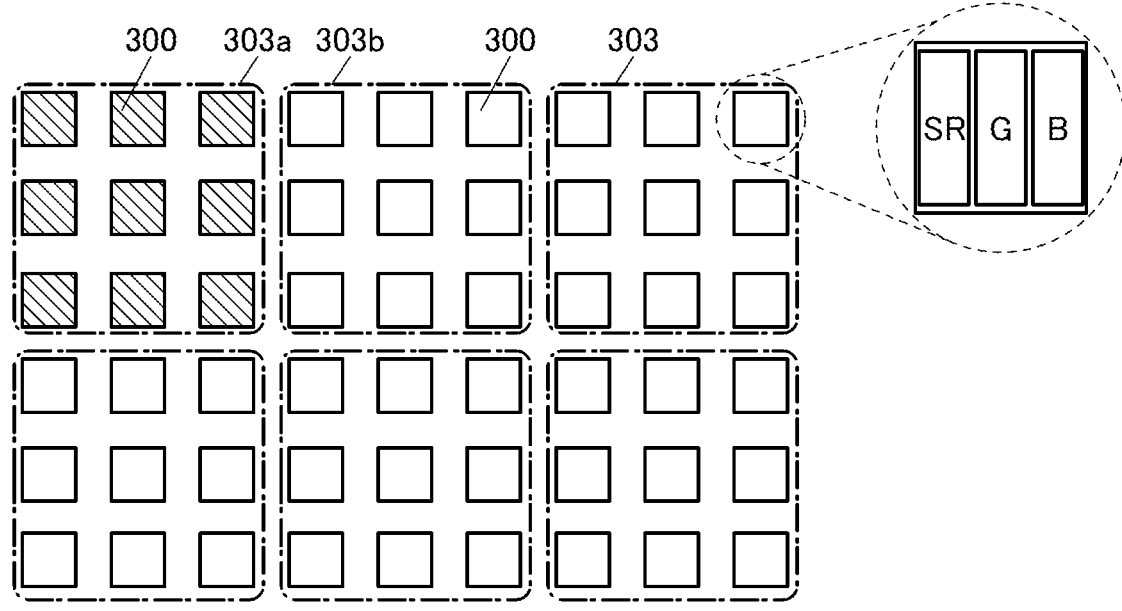
FIG. 35A and FIG. 35B are diagrams illustrating examples of a method for driving a display apparatus.

FIG. 35A illustrates an example in which imaging data of the light-emitting and light-receiving devices (SR) included in a plurality of pixels are collectively read out.

One pixel 300 includes a subpixel (SR) having a light-receiving function, a subpixel (G) that emits green light, and a subpixel (B) that emits blue light. Although FIG. 35A illustrates an example in which a unit 303 includes nine pixels 300 (3×3 pixels), the number of pixels included in the unit 303 is not particularly limited. The pixels 300 included in the same unit 303 are subjected to reading of imaging data at the same time. For example, the imaging data in a unit 303a is read first; then, the imaging data in a unit 303b is read out. Thus, the number of times of reading can be smaller than that in the case where imaging data is individually read pixel by pixel, and the driving frequency can be increased. The imaging data in the unit 303a is data in which the imaging data in the plurality of pixels 300 (here, the nine pixels 300) are added together; thus, the sensitivity can be higher than that in the case where image capturing is performed pixel by pixel.

Alternatively, touch detection may be performed using only some pixels. For example, pixels used for touch detection can be determined as appropriate to be one pixel out of four pixels (2×2 pixels), one pixel out of 100 pixels (10×10 pixels), or 900 pixels (30×30 pixels), for example.

Figure 35B:
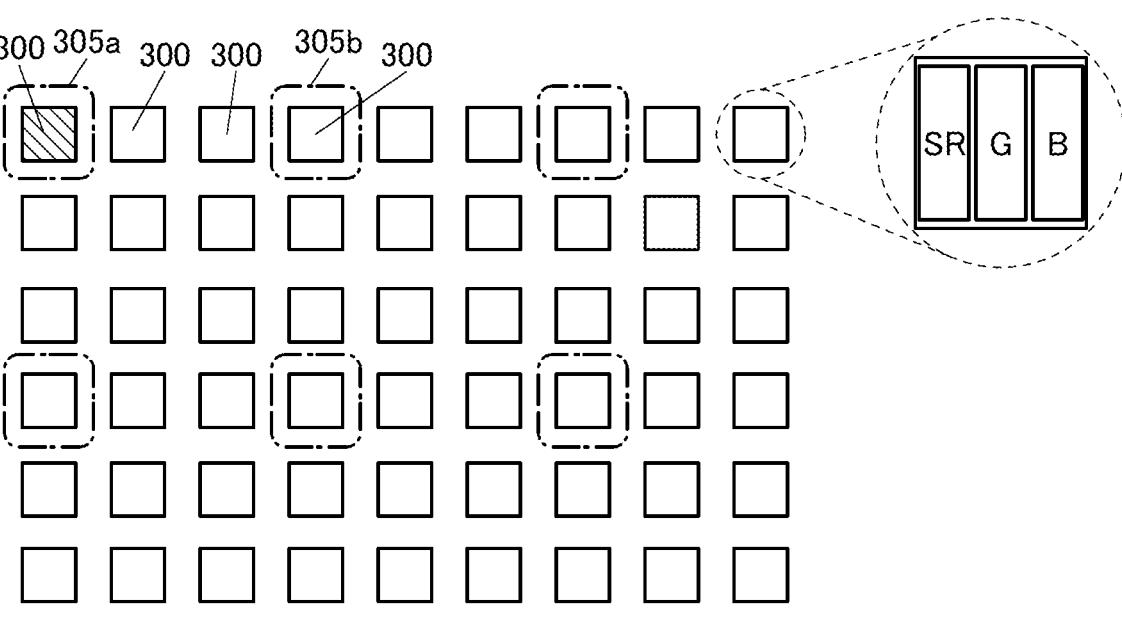

FIG. 35B illustrates examples of touch detection using only some pixels.

One pixel 300 includes a subpixel (SR) having a light-receiving function, a subpixel (G) that emits green light, and a subpixel (B) that emits blue light. Reading-target pixels are only the pixels 300 surrounded by dashed-dotted lines. FIG. 35B illustrates an example in which the number of target pixels used for touch detection is one pixel out of nine pixels (3×3 pixels); however, the number of target pixels is not particularly limited. First, imaging data of a target pixel 305a is read out, and imaging data of a target pixel 305b is then read out. Imaging data is not read from the pixels 300 positioned between the target pixel 305a and the target pixel 305b. Thus, the number of times of reading can be smaller than that in the case where imaging data is read pixel by pixel from all the pixels, and the driving frequency can be increased.

Note that when only a particular pixel 300 is used as the target pixel, the degradation degree of the light-emitting and light-receiving device may vary between the pixels 300. Therefore, it is preferable the plurality of pixels 300 be serve as the target pixel in turn. For example, in the case where one pixel out of nine pixels is used as the target pixel, the target pixel may shift one row by one row or one column by one column so that three pixels can serve as the target pixel in turn. All the nine pixels may serve as the target pixel in turn.

The display apparatus of one embodiment of the present invention preferably has two or more kinds of operation modes of the light-emitting and light-receiving device so that switching therebetween is possible. For example, switching between a mode of performing reading pixel by pixel individually from all the pixels and a mode of performing reading collectively from a plurality of pixels is preferably possible. Alternatively, switching between a mode of performing reading from all the pixels and a mode of performing reading from some of the pixels is preferably possible. Thus, image capturing at a high resolution can be performed in fingerprint image capturing, and touch detection at a high driving frequency can be performed in displaying an image.

The influence of ambient light which is noise in touch detection is preferably removed.

For example, lighting and non-lighting of the light-emitting device are made to repeat periodically in some pixels, and a difference in detection intensity of the light-emitting and light-receiving device between a lighting period and a non-lighting period is obtained, so that the influence of ambient light can be removed. Note that it is preferable that the number of pixels where lighting and non-lighting repeat be two or more within the range not affecting images displayed on the display apparatus. Furthermore, lighting and non-lighting of the light-emitting device are preferably made to repeat at intervals of one frame; for example, a lighting pixel and a non-lighting pixel may be exchanged between an odd-numbered frame and an even-numbered frame. Note that the emission color in the lighting period is not particularly limited.

Figure 36A:
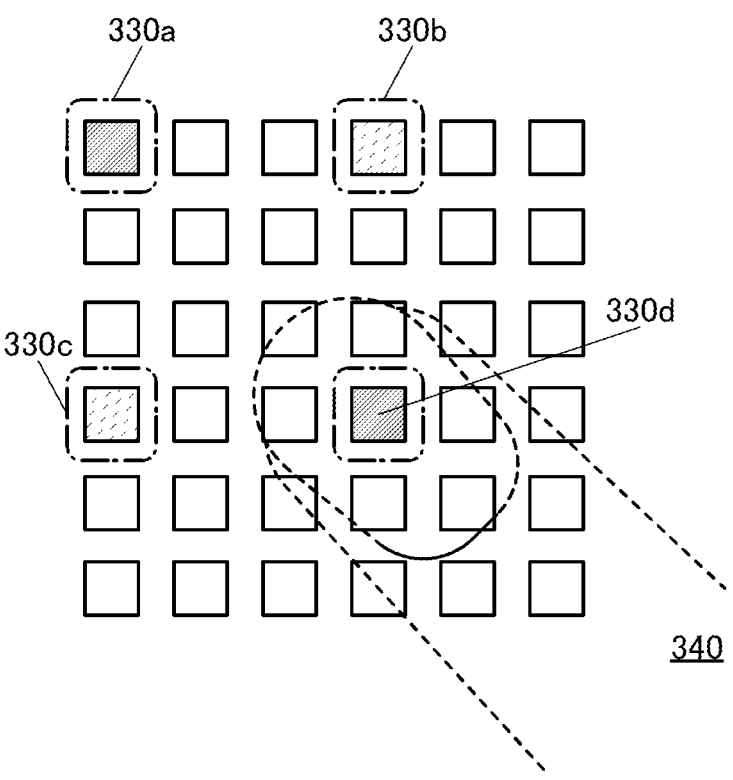
FIG. 36A and FIG. 36B are diagrams illustrating an example of a method for driving a display apparatus.
Figure 36B:
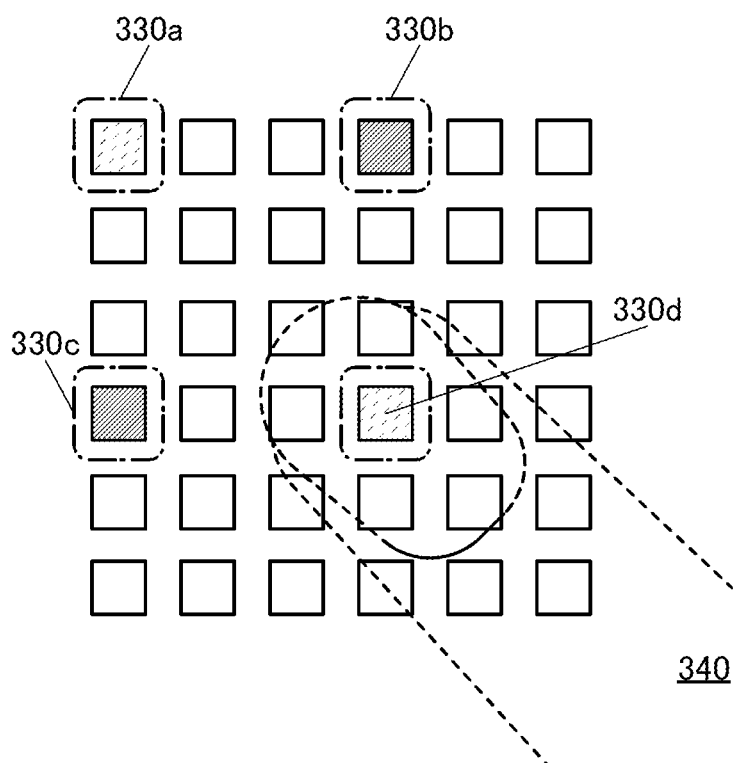

A pixel 330a and a pixel 330d are in a non-lighting state and a pixel 330b and a pixel 330c are in a lighting state in FIG. 36A, whereas the pixel 330a and the pixel 330d are in a lighting state and the pixel 330b and the pixel 330c are in a non-lighting state in FIG. 36B.

The pixel 330b detects ambient light and thus, the detection intensity of the light-emitting and light-receiving device does not change between the lighting period and the non-lighting period of the light source. In contrast, the pixel 330d detects the light reflected by a finger 340 and thus, the detection intensity of the light-emitting and light-receiving device changes between the lighting period and the non-lighting period of the light-emitting device. Utilizing this difference in detection intensity between the lighting period and the non-lighting period, the influence of ambient light can be removed.

As described above, the display apparatus of this embodiment can be driven in either of a mode of performing image capturing for each unit and a mode of performing image capturing for each light-emitting and light-receiving device. For example, a mode of performing image capturing for each unit can be employed when high-speed operation is needed. Furthermore, a mode of performing image capturing pixel (light-emitting and light-receiving device) by pixel (light-emitting and light-receiving element) can be employed when high-resolution image capturing is needed. By changing the driving mode in accordance with the usage, the functionality of the display apparatus can be increased.

This embodiment can be combined with the other embodiments as appropriate.

Embodiment 6

In this embodiment, a metal oxide (also referred to as an oxide semiconductor) that can be used in the OS transistor described in the above embodiment is described.

The metal oxide preferably contains at least indium or zinc. In particular, indium and zinc are preferably contained. In addition, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

The metal oxide can be formed by a sputtering method, a chemical vapor deposition (CVD) method such as a metal organic chemical vapor deposition (MOCVD) method, an atomic layer deposition (ALD) method, or the like.

<Classification of Crystal Structure>

Amorphous (including a completely amorphous structure), CAAC (c-axis-aligned crystalline), nc (nanocrystalline), CAC (cloud-aligned composite), single-crystal, and polycrystalline (poly crystal) structures can be given as examples of a crystal structure of an oxide semiconductor.

Note that a crystal structure of a film or a substrate can be evaluated with an X-ray diffraction (XRD) spectrum. For example, evaluation is possible using an XRD spectrum which is obtained by GIXD (Grazing-Incidence XRD) measurement. Note that a GIXD method is also referred to as a thin film method or a Seemann-Bohlin method.

For example, the XRD spectrum of the quartz glass substrate shows a peak with a substantially bilaterally symmetrical shape. On the other hand, the peak of the XRD spectrum of the IGZO film having a crystal structure has a bilaterally asymmetrical shape. The asymmetrical peak of the XRD spectrum clearly shows the existence of crystal in the film or the substrate. In other words, the crystal structure of the film or the substrate cannot be regarded as "amorphous" unless it has a bilaterally symmetrical peak in the XRD spectrum.

A crystal structure of a film or a substrate can also be evaluated with a diffraction pattern obtained by a nanobeam electron diffraction (NBED) method (such a pattern is also referred to as a nanobeam electron diffraction pattern). For example, a halo pattern is observed in the diffraction pattern of the quartz glass substrate, which indicates that the quartz glass substrate is in an amorphous state. Furthermore, not a halo pattern but a spot-like pattern is observed in the diffraction pattern of the IGZO film deposited at room temperature. Thus, it is suggested that the IGZO film deposited at room temperature is in an intermediate state, which is neither a crystal state nor an amorphous state, and it cannot be concluded that the IGZO film is in an amorphous state.

<<Structure of Oxide Semiconductor>>

Oxide semiconductors might be classified in a manner different from the above-described one when classified in terms of the structure. Oxide semiconductors are classified into a single crystal oxide semiconductor and a non-single-crystal oxide semiconductor, for example. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the above-described CAAC-OS, nc-OS, and a-like OS are described in detail.

[CAAC-OS]

The CAAC-OS is an oxide semiconductor that has a plurality of crystal regions each of which has c-axis alignment in a particular direction. Note that the particular direction refers to the film thickness direction of a CAAC-OS film, the normal direction of the surface where the CAAC-OS film is formed, or the normal direction of the surface of the CAAC-OS film. The crystal region refers to a region having a periodic atomic arrangement. When an atomic arrangement is regarded as a lattice arrangement, the crystal region also refers to a region with a uniform lattice arrangement. The CAAC-OS has a region where a plurality of crystal regions are connected in the a-b plane direction, and the region has distortion in some cases. Note that distortion refers to a portion where the direction of a lattice arrangement changes between a region with a uniform lattice arrangement and another region with a uniform lattice arrangement in a region where a plurality of crystal regions are connected. That is, the CAAC-OS is an oxide semiconductor having c-axis alignment and having no clear alignment in the a-b plane direction. Note that each of the plurality of crystal regions is formed of one or more fine crystals (crystals each of which has a maximum diameter of less than 10 nm). In the case where the crystal region is formed of one fine crystal, the maximum diameter of the crystal region is less than 10 nm. In the case where the crystal region is formed of a large number of fine crystals, the size of the crystal region may be approximately several tens of nanometers.

In the case of an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Therefore, indium may be contained in the (M,Zn) layer. In addition, the element M may be contained in the In layer. Note that Zn may be contained in the In layer. Such a layered structure is observed as a lattice image in a high-resolution TEM (Transmission Electron Microscope) image, for example.

When the CAAC-OS film is subjected to structural analysis by Out-of-plane XRD measurement with an XRD apparatus using $\theta$-2$\theta$ scanning, for example, a peak indicating c-axis alignment is detected at 2$\theta$ of 31° or around 31°. Note that the position of the peak indicating c-axis alignment (the value of 2$\theta$ may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of lattice arrangement. This is probably because the CAAC-OS can tolerate distortion owing to a low density of arrangement of oxygen atoms in the a-b plane direction, an interatomic bond distance changed by substitution of a metal atom, and the like.

Note that a crystal structure in which a clear crystal grain boundary is observed is what is called polycrystal. It is highly probable that the crystal grain boundary becomes a recombination center and captures carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In—Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Moreover, since the crystallinity of an oxide semiconductor might be decreased by entry of impurities, formation of defects, or the like, the CAAC-OS can be regarded as an oxide semiconductor that has small amounts of impurities and defects (e.g., oxygen vacancies). Thus, an oxide semiconductor including the CAAC-OS is physically stable. Therefore, the oxide semiconductor including the CAAC-OS is resistant to heat and has high reliability. In addition, the CAAC-OS is stable with respect to high temperature in the manufacturing process (what is called thermal budget). Accordingly, the use of the CAAC-OS for the OS transistor can extend the degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a fine crystal. Note that the size of the fine crystal is, for example, greater than or equal to 1 nm and less than or equal to 10 nm, particularly greater than or equal to 1 nm and less than or equal to 3 nm; thus, the fine crystal is also referred to as a nanocrystal. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods. For example, when an nc-OS film is subjected to structural analysis by Out-of-plane XRD measurement with an XRD apparatus using 0120 scanning, a peak indicating crystallinity is not detected. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in a nanobeam electron diffraction pattern of the nc-OS film obtained using an electron beam with a probe diameter nearly equal to or smaller than the diameter of a nanocrystal (e.g., 1 nm or larger and 30 nm or smaller).

[a-Like OS]

The a-like OS is an oxide semiconductor having a structure between those of the nc-OS and the amorphous oxide semiconductor. The a-like OS contains a void or a low-density region. That is, the a-like OS has lower crystallinity than the nc-OS and the CAAC-OS. Moreover, the a-like OS has higher hydrogen concentration in the film than the nc-OS and the CAAC-OS.

<<Structure of Oxide Semiconductor>>

Next, the above-described CAC-OS is described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In—Ga—Zn oxide are denoted by [In], [Ga], and [Zn], respectively. For example, the first region in the CAC-OS in the In—Ga—Zn oxide has [In] higher than that in the composition of the CAC-OS film. Moreover, the second region has [Ga] higher than that in the composition of the CAC-OS film. For example, the first region has higher [In] and lower [Ga] than the second region. Moreover, the second region has higher [Ga] and lower [In] than the first region.

Specifically, the first region contains indium oxide, indium zinc oxide, or the like as its main component. The second region contains gallium oxide, gallium zinc oxide, or the like as its main component. That is, the first region can be referred to as a region containing In as its main component. The second region can be referred to as a region containing Ga as its main component.

Note that a clear boundary between the first region and the second region cannot be observed in some cases.

In a material composition of a CAC-OS in an In—Ga—Zn oxide that contains In, Ga, Zn, and O, regions containing Ga as a main component are observed in part of the CAC-OS and regions containing In as a main component are observed in part thereof. These regions are randomly present to form a mosaic pattern. Thus, it is suggested that the CAC-OS has a structure in which metal elements are unevenly distributed.

The CAC-OS can be formed by a sputtering method under a condition where a substrate is not heated, for example. Moreover, in the case of forming the CAC-OS by a sputtering method, any one or more selected from an inert gas (typically, argon), an oxygen gas, and a nitrogen gas are used as a deposition gas. The ratio of the flow rate of an oxygen gas to the total flow rate of the deposition gas at the time of deposition is preferably as low as possible, and for example, the ratio of the flow rate of an oxygen gas to the total flow rate of the deposition gas at the time of deposition is preferably higher than or equal to 0% and less than 30%, further preferably higher than or equal to 0% and less than or equal to 10%.

For example, energy dispersive X-ray spectroscopy (EDX) is used to obtain EDX mapping, and according to the EDX mapping, the CAC-OS in the In—Ga—Zn oxide has a structure in which the region containing In as its main component (the first region) and the region containing Ga as its main component (the second region) are unevenly distributed and mixed.

Here, the first region has a higher conductivity than the second region. In other words, when carriers flow through the first region, the conductivity of a metal oxide is exhibited. Accordingly, when the first regions are distributed in a metal oxide like a cloud, high field-effect mobility ($\mu$) can be achieved.

The second region has a higher insulating property than the first region. In other words, when the second regions are distributed in a metal oxide, leakage current can be inhibited.

Thus, in the case where a CAC-OS is used for a transistor, by the complementary action of the conductivity due to the first region and the insulating property due to the second region, the CAC-OS can have a switching function (On/Off function). That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility (4 and excellent switching operation can be achieved.

A transistor using the CAC-OS has high reliability. Thus, the CAC-OS is most suitable for a variety of semiconductor devices such as display apparatuses.

An oxide semiconductor has various structures with different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, the case where the above oxide semiconductor is used for a transistor is described.

When the above oxide semiconductor is used for a transistor, a transistor with high field-effect mobility can be achieved. In addition, a transistor having high reliability can be achieved.

An oxide semiconductor having a low carrier concentration is preferably used in a transistor. For example, the carrier concentration of an oxide semiconductor is lower than or equal to $1\times10^{17}$ cm$^{-3}$, preferably lower than or equal to $1\times10^{15}$ cm$^{-3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration in an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor having a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Electric charge trapped by the trap states in the oxide semiconductor takes a long time to disappear and might behave like fixed charge. Thus, a transistor whose channel formation region is formed in an oxide semiconductor with a high density of trap states has unstable electrical characteristics in some cases.

Accordingly, in order to obtain stable electrical characteristics of a transistor, reducing the impurity concentration in an oxide semiconductor is effective. In order to reduce the impurity concentration in the oxide semiconductor, it is preferable that the impurity concentration in an adjacent film be also reduced. Examples of impurities include hydrogen, nitrogen, an alkali metal, an alkaline earth metal, iron, nickel, and silicon.

<Impurity>

Here, the influence of each impurity in the oxide semiconductor is described.

When silicon or carbon, which is one of Group 14 elements, is contained in the oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration obtained by secondary ion mass spectrometry (SIMS)) are each set lower than or equal to $2\times10^{18}$ atoms/cm$^3$, preferably lower than or equal to $2\times10^{17}$ atoms/cm$^3$.

When the oxide semiconductor contains an alkali metal or an alkaline earth metal, defect states are formed and carriers are generated in some cases. Thus, a transistor using an oxide semiconductor that contains an alkali metal or an alkaline earth metal is likely to have normally-on characteristics. Thus, the concentration of an alkali metal or an alkaline earth metal in the oxide semiconductor, which is obtained by SIMS, is set lower than or equal to $1\times10^{18}$ atoms/cm$^3$, preferably lower than or equal to $2\times10^{16}$ atoms/cm$^3$.

Furthermore, when the oxide semiconductor contains nitrogen, the oxide semiconductor easily becomes n-type by generation of electrons serving as carriers and an increase in carrier concentration. As a result, a transistor using an oxide semiconductor containing nitrogen as a semiconductor is likely to have normally-on characteristics. When nitrogen is contained in the oxide semiconductor, trap states are sometimes formed. This might make the electrical characteristics of the transistor unstable. Therefore, the concentration of nitrogen in the oxide semiconductor, which is obtained by SIMS, is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in the oxide semiconductor reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor using an oxide semiconductor containing hydrogen is likely to have normally-on characteristics. Accordingly, hydrogen in the oxide semiconductor is preferably reduced as much as possible. Specifically, the hydrogen concentration in the oxide semiconductor, which is obtained by SIMS, is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurities is used for the channel formation region of the transistor, stable electrical characteristics can be given.

This embodiment can be combined with the other embodiments as appropriate.

Embodiment 7

In this embodiment, electronic devices of embodiments of the present invention will be described with reference to FIG. 37A to FIG. 39F.

An electronic device in this embodiment includes a display apparatus of one embodiment of the present invention. For example, the display apparatus of one embodiment of the present invention can be used in a display portion of the electronic device. The display apparatus of one embodiment of the present invention has a function of detecting light, and is thus capable of performing biological authentication or detecting a touch operation (contact or approach) with the display portion. Thus, the electronic device can have improved functionality and convenience, for example.

Examples of the electronic devices include a digital camera, a digital video camera, a digital photo frame, a mobile phone, a portable game console, a portable information terminal, and an audio reproducing device, in addition to electronic devices with a relatively large screen, such as a television device, a desktop or laptop personal computer, a monitor of a computer or the like, digital signage, and a large game machine such as a pachinko machine.

The electronic device in this embodiment may include a sensor (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays).

The electronic device in this embodiment can have a variety of functions. For example, the electronic device can have a function of displaying a variety of data (a still image, a moving image, a text image, and the like) on the display portion, a touch panel function, a function of displaying a calendar, date, time, and the like, a function of executing a variety of software (programs), a wireless communication function, and a function of reading out a program or data stored in a recording medium.

Figure 37A:
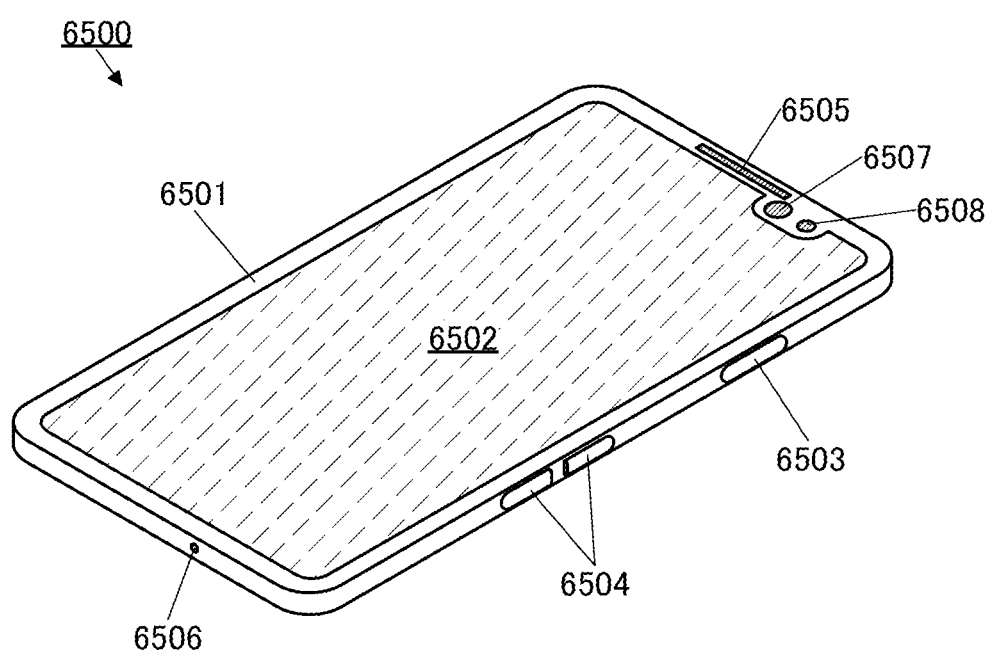
FIG. 37A and FIG. 37B are diagrams illustrating an example of an electronic device.

An electronic device 6500 illustrated in FIG. 37A is a portable information terminal that can be used as a smartphone.

The electronic device 6500 includes a housing 6501, a display portion 6502, a power button 6503, buttons 6504, a speaker 6505, a microphone 6506, a camera 6507, a light source 6508, and the like. The display portion 6502 has a touch panel function.

The display apparatus of one embodiment of the present invention can be used in the display portion 6502.

Figure 37B:
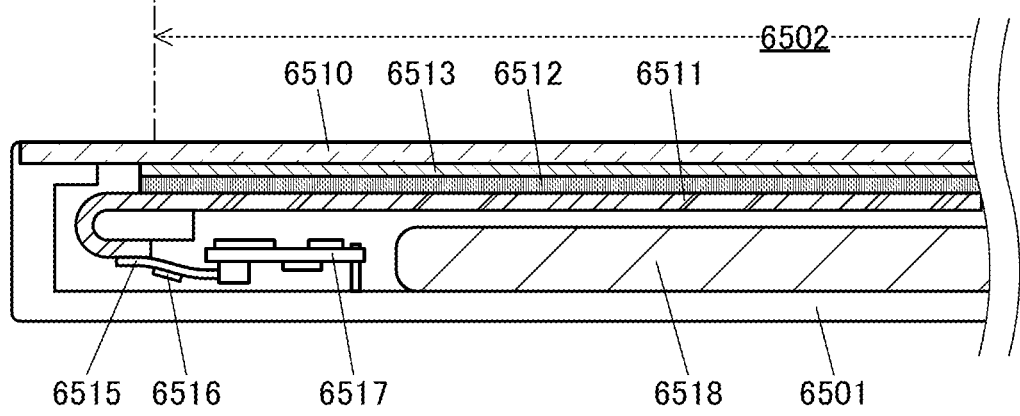

FIG. 37B is a schematic cross-sectional view including an end portion of the housing 6501 on the microphone 6506 side.

A protection member 6510 having a light-transmitting property is provided on the display surface side of the housing 6501, and a display panel 6511, an optical member 6512, a touch sensor panel 6513, a printed circuit board 6517, a battery 6518, and the like are provided in a space surrounded by the housing 6501 and the protection member 6510.

The display panel 6511, the optical member 6512, and the touch sensor panel 6513 are fixed to the protection member 6510 with an adhesive layer (not illustrated).

Part of the display panel 6511 is folded back in a region outside the display portion 6502, and an FPC 6515 is connected to the part that is folded back. An IC 6516 is mounted on the FPC 6515. The FPC 6515 is connected to a terminal provided on the printed circuit board 6517.

A flexible display of one embodiment of the present invention can be used as the display panel 6511. Thus, an extremely lightweight electronic device can be achieved. Since the display panel 6511 is extremely thin, the battery

6518 with high capacity can be mounted with the thickness of the electronic device controlled. An electronic device with a narrow frame can be achieved when part of the display panel 6511 is folded back so that the portion connected to the FPC 6515 is provided on the rear side of a pixel portion.

Using the display apparatus of one embodiment of the present invention as the display panel 6511 allows image capturing on the display portion 6502. For example, an image of a fingerprint is captured by the display panel 6511; thus, fingerprint identification can be performed. By further including the touch sensor panel 6513, the display portion 6502 can have a touch panel function. A variety of types such as a capacitive type, a resistive type, a surface acoustic wave type, an infrared type, an optical type, and a pressure-sensitive type can be used for the touch sensor panel 6513. Alternatively, the display panel 6511 may function as a touch sensor; in such a case, the touch sensor panel 6513 is not necessarily provided.

FIG. 38A illustrates an example of a television device. In a television device 7100, a display portion 7000 is incorporated in a housing 7101. Here, a structure in which the housing 7101 is supported by a stand 7103 is illustrated.

A display apparatus of one embodiment of the present invention can be used in the display portion 7000.

The television device 7100 illustrated in FIG. 38A can be operated with an operation switch provided in the housing 7101 or a separate remote controller 7111. Alternatively, the display portion 7000 may include a touch sensor, and the television device 7100 may be operated by a touch on the display portion 7000 with a finger or the like. The remote controller 7111 may be provided with a display portion for displaying data output from the remote controller 7111. With operation keys or a touch panel provided in the remote controller 7111, channels and volume can be operated and videos displayed on the display portion 7000 can be operated.

Note that the television device 7100 has a structure in which a receiver, a modem, and the like are provided. A general television broadcast can be received with the receiver. When the television device is connected to a communication network with or without wires via the modem, one-way (from a transmitter to a receiver) or two-way (between a transmitter and a receiver or between receivers, for example) data communication can be performed.

FIG. 38B illustrates an example of a laptop personal computer. A laptop personal computer 7200 includes a housing 7211, a keyboard 7212, a pointing device 7213, an external connection port 7214, and the like. In the housing 7211, the display portion 7000 is incorporated.

A display apparatus of one embodiment of the present invention can be used in the display portion 7000.

FIG. 38C and FIG. 38D illustrate examples of digital signage.

Digital signage 7300 illustrated in FIG. 38C includes a housing 7301, the display portion 7000, a speaker 7303, and the like. Furthermore, the digital signage can include an LED lamp, operation keys (including a power switch or an operation switch), a connection terminal, a variety of sensors, a microphone, and the like.

FIG. 38D illustrates digital signage 7400 mounted on a cylindrical pillar 7401. The digital signage 7400 includes the display portion 7000 provided along a curved surface of the pillar 7401.

The display apparatus of one embodiment of the present invention can be used for the display portion 7000 in FIG. 38C and FIG. 38D.

A larger area of the display portion 7000 can increase the amount of data that can be provided at a time. The larger display portion 7000 attracts more attention, so that the advertising effectiveness can be enhanced, for example.

The use of a touch panel in the display portion 7000 is preferable because in addition to display of a still image or a moving image on the display portion 7000, intuitive operation by a user is possible. Moreover, for an application for providing information such as route information or traffic information, usability can be enhanced by intuitive operation.

As illustrated in FIG. 38C and FIG. 38D, the digital signage 7300 or the digital signage 7400 is preferably capable of working with an information terminal 7311 or an information terminal 7411 such as a user's smartphone through wireless communication. For example, information of an advertisement displayed on the display portion 7000 can be displayed on a screen of the information terminal 7311 or the information terminal 7411. By operation of the information terminal 7311 or the information terminal 7411, display on the display portion 7000 can be switched.

It is possible to make the digital signage 7300 or the digital signage 7400 execute a game with use of the screen of the information terminal 7311 or the information terminal 7411 as an operation means (controller). Thus, an unspecified number of users can join in and enjoy the game concurrently.

Electronic devices illustrated in FIG. 39A to FIG. 39F include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, a chemical substance, sound, time, hardness, electric field, current, voltage, electric power, radiation, flow rate, humidity, gradient, oscillation, a smell, or infrared rays), a microphone 9008, and the like.

The electronic devices illustrated in FIG. 39A to FIG. 39F have a variety of functions. For example, the electronic devices can have a function of displaying a variety of data (a still image, a moving image, a text image, and the like) on the display portion, a touch panel function, a function of displaying a calendar, date, time, and the like, a function of controlling processing with use of a variety of software (programs), a wireless communication function, and a function of reading out and processing a program or data stored in a recording medium. Note that the functions of the electronic devices are not limited thereto, and the electronic devices can have a variety of functions. The electronic devices may include a plurality of display portions. The electronic devices may each include a camera or the like and have a function of taking a still image or a moving image and storing the taken image in a recording medium (an external recording medium or a recording medium incorporated in the camera), a function of displaying the taken image on the display portion, or the like.

The details of the electronic devices illustrated in FIG. 39A to FIG. 39F are described below.

FIG. 39A is a perspective view illustrating a portable information terminal 9101. For example, the portable information terminal 9101 can be used as a smartphone. Note that the portable information terminal 9101 may be provided with the speaker 9003, the connection terminal 9006, the sensor 9007, and the like. The portable information terminal 9101 can display at least one of characters and image information on its plurality of surfaces. FIG. 39A shows an example where three icons 9050 are displayed. Information 9051 indicated by dashed rectangles can be displayed on another surface of the display portion 9001. Examples of the information 9051 include notification of reception of an e-mail, SNS, or an incoming call, the title and sender of an e-mail, SNS, or the like, the date, the time, remaining battery, and the reception strength of an antenna. Alternatively, the icon 9050 or the like may be displayed in the position where the information 9051 is displayed.

FIG. 39B is a perspective view illustrating a portable information terminal 9102. The portable information terminal 9102 has a function of displaying information on three or more surfaces of the display portion 9001. Here, an example in which information 9052, information 9053, and information 9054 are displayed on different surfaces is shown. For example, a user can check the information 9053 displayed in a position that can be observed from above the portable information terminal 9102, with the portable information terminal 9102 put in a breast pocket of his/her clothes. The user can see the display without taking out the portable information terminal 9102 from the pocket and decide whether to answer the call, for example.

FIG. 39C is a perspective view illustrating a watch-type portable information terminal 9200. For example, the portable information terminal 9200 can be used as a smartwatch. The display surface of the display portion 9001 is curved and provided, and display can be performed along the curved display surface. Mutual communication between the portable information terminal 9200 and, for example, a headset capable of wireless communication enables hands-free calling. With the connection terminal 9006, the portable information terminal 9200 can perform at least one of mutual data transmission with another information terminal and charging. Note that the charging operation may be performed by wireless power feeding.

FIG. 39D to FIG. 39F are perspective views illustrating a foldable portable information terminal 9201. FIG. 39D is a perspective view of an opened state of the portable information terminal 9201, FIG. 39F is a perspective view of a folded state thereof, and FIG. 39E is a perspective view of a state in the middle of change from one of FIG. 39D and FIG. 39F to the other. The portable information terminal 9201 is highly portable in the folded state and is highly browsable in the opened state because of a seamless large display region. The display portion 9001 of the portable information terminal 9201 is supported by three housings 9000 joined by hinges 9055. For example, the display portion 9001 can be curved with a radius of curvature greater than or equal to 0.1 mm and less than or equal to 150 mm.

This embodiment can be combined with the other embodiments as appropriate.

REFERENCE NUMERALS

ANODE: wiring, CATHODE: wiring, Cf: capacitor, Csb: capacitor, Csg: capacitor, Csr: capacitor, FD: node, GL[n]: wiring, GL: wiring, GR: node, M11: transistor, M12: transistor, M13: transistor, M14: transistor, RS[n]: wiring, RS: wiring, SA: node, SE[n]: wiring, SE: wiring, SLB: wiring, SLG: wiring, SLR: wiring, T10: time, T11: time, T12: time, T13: time, T14: time, TX: wiring, VCP: wiring, VdataB: image signal, VdataG: image signal, VdataR: image signal, VPI: wiring, VRS: wiring, WX[m]: wiring, WX: wiring, 10B: region, 10G: region, 10IR: region, 10R: region, 10SB: region, 10SR: region, 12: light, 14: light, 50A: display apparatus, 50B: display apparatus, 50C: display apparatus, 50D: display apparatus, 51: substrate, 52: finger, 53: layer, 55: layer, 57: layer, 59: substrate, 61: blood vessel, 63: biological tissue, 100A: display apparatus, 100B: display apparatus, 100C: display apparatus, 100D: display apparatus, 100E: display apparatus, 100F: display apparatus, 100G: display apparatus, 100: display apparatus, 101: substrate, 102: display apparatus, 104: display apparatus, 110B: light-emitting device, 110G: light-emitting device, 110IR: light-emitting device, 110R: light-emitting device, 110SB: light-emitting and light-receiving device, 110SR: light-emitting and light-receiving device, 110: light-emitting device, 111B: pixel electrode, 111C: connection electrode, 111G: pixel electrode, 111IR: pixel electrode, 111R: pixel electrode, 111SB: pixel electrode, 111SR: pixel electrode, 111: pixel electrode, 112B: EL layer, 112G: EL layer, 112Gf: EL film, 112IR: EL layer, 112R: EL layer, 112SB: light-emitting and light-receiving layer, 112SR: light-emitting and light-receiving layer, 112SRf: light-emitting and light-receiving film, 113: common electrode, 114: layer, 115B: optical adjustment layer, 115G: optical adjustment layer, 115R: optical adjustment layer, 121: protective layer, 122: void, 130: connection portion, 131: insulating layer, 143a: resist mask, 143b: resist mask, 143d: resist mask, 144a: sacrificial film, 144b: sacrificial film, 145a: sacrificial layer, 145b: sacrificial layer, 145c: sacrificial layer, 146a: protective film, 146b: protective film, 147a: protective layer, 147b: protective layer, 190B: light-emitting device, 190G: light-emitting device, 190SR: light-emitting and light-receiving device, 201: transistor, 203: transistor, 204: connection portion, 205: transistor, 206: transistor, 207: transistor, 208: transistor, 209: transistor, 210: transistor, 211: insulating layer, 212: insulating layer, 213: insulating layer, 214: insulating layer, 215: insulating layer, 218: insulating layer, 221: conductive layer, 222a: conductive layer, 222b: conductive layer, 223: conductive layer, 225: insulating layer, 228: region, 231i: channel formation region, 231n: low-resistance region, 231: semiconductor layer, 240: capacitor, 241: conductive layer, 242: connection layer, 243: insulating layer, 245: conductive layer, 251: conductive layer, 252: conductive layer, 254: insulating layer, 255: insulating layer, 256: plug, 261: insulating layer, 262: insulating layer, 263: insulating layer, 264: insulating layer, 265: insulating layer, 271: plug, 274a: conductive layer, 274b: conductive layer, 274: plug, 280: display module, 281: display portion, 282: circuit portion, 283a: pixel circuit, 283: pixel circuit portion, 284a: pixel, 284: pixel portion, 285: terminal portion, 286: wiring portion, 290: FPC, 291: substrate, 292: substrate, 300: pixel, 301: substrate, 303a: unit, 303b: unit, 303: unit, 305a: target pixel, 305b: target pixel, 310: transistor, 311: conductive layer, 312: low-resistance region, 313: insulating layer, 314: insulating layer, 315: element isolation layer, 320: transistor, 321: semiconductor layer, 323: insulating layer, 324: conductive layer, 325: conductive layer, 326: insulating layer, 327: conductive layer, 328: insulating layer, 329: insulating layer, 330a: pixel, 330b: pixel, 330c: pixel, 330d: pixel, 331: substrate, 332: insulating layer, 340: finger, 400A: display apparatus, 400B: display apparatus, 400C: display apparatus, 400D: display apparatus, 400E: display apparatus, 401: layer, 411B: pixel electrode, 411G: pixel electrode, 411SR: pixel electrode, 413: common electrode, 414: layer, 416a: inorganic insulating layer, 416b: organic insulating layer, 416c:

inorganic insulating layer, 416: protective layer, 417: light-blocking layer, 419: resin layer, 420: substrate, 421: partition, 426a: optical adjustment layer, 426b: optical adjustment layer, 426c: optical adjustment layer, 430B: light-emitting device, 430G: light-emitting device, 430SR: light-emitting and light-receiving device, 442: adhesive layer, 443: space, 451: substrate, 452: substrate, 453: substrate, 454: substrate, 455: adhesive layer, 462: display portion, 464: circuit, 465: wiring, 466: conductive layer, 472: FPC, 473: IC, 573: active layer, 581: hole-injection layer, 582a: hole-transport layer, 582b: hole-transport layer, 582: hole-transport layer, 583B: light-emitting layer, 583G: light-emitting layer, 583IR: light-emitting layer, 583R: light-emitting layer, 583: light-emitting layer, 584: electron-transport layer, 589: layer, 601B: subpixel, 601G: subpixel, 601SR: subpixel, 602G: subpixel, 602SR: subpixel, 6000: electronic device, 6001: display portion, 6003: finger, 6500: electronic device, 6501: housing, 6502: display portion, 6503: power button, 6504: button, 6505: speaker, 6506: microphone, 6507: camera, 6508: light source, 6510: protection member, 6511: display panel, 6512: optical member, 6513: touch sensor panel, 6515: FPC, 6516: IC, 6517: printed circuit board, 6518: battery, 7000: display portion, 7100: television device, 7101: housing, 7103: stand, 7111: remote controller, 7200: laptop personal computer, 7211: housing, 7212: keyboard, 7213: pointing device, 7214: external connection port, 7300: digital signage, 7301: housing, 7303: speaker, 7311: information terminal, 7400: digital signage, 7401: pillar, 7411: information terminal, 9000: housing, 9001: display portion, 9003: speaker, 9005: operation key, 9006: connection terminal, 9007: sensor, 9008: microphone, 9050: icon, 9051: information, 9052: information, 9053: information, 9054: information, 9055: hinge, 9101: portable information terminal, 9102: portable information terminal, 9200: portable information terminal, 9201: portable information terminal

The invention claimed is:

1. A method for manufacturing a display apparatus comprising:

a first step of forming a first pixel electrode and a second pixel electrode;

a second step of depositing a light-emitting and light-receiving film over the first pixel electrode and the second pixel electrode;

a third step of depositing a first sacrificial film covering the light-emitting and light-receiving film;

a fourth step of etching the first sacrificial film and the light-emitting and light-receiving film to form a light-emitting and light-receiving layer over the first pixel electrode and a first sacrificial layer over the light-emitting and light-receiving layer and to expose the second pixel electrode;

a fifth step of depositing an EL film over the first sacrificial layer and over the second pixel electrode;

a sixth step of depositing a second sacrificial film covering the EL film;

a seventh step of etching the second sacrificial film and the EL film to form an EL layer over the second pixel electrode and a second sacrificial layer over the EL layer;

an eighth step of removing the first sacrificial layer and the second sacrificial layer so that the light-emitting and light-receiving layer and the EL layer are exposed; and a ninth step of forming a common electrode covering the light-emitting and light-receiving layer and the EL layer, wherein the light-emitting and light-receiving layer comprises an active layer and a first light-emitting layer, wherein the active layer comprises a combination of an n-type semiconductor material and a p-type semiconductor material, wherein the first light-emitting layer comprises a first light-emitting material, wherein the EL layer comprises a second light-emitting layer, wherein the second light-emitting layer comprises a second light-emitting material, wherein the first pixel electrode, the light-emitting and light-receiving layer and the common electrode form a light-emitting and light-receiving device configured to emit light of a first wavelength range and to receive light of a second wavelength range, wherein the second pixel electrode, the EL layer and the common electrode form a light-emitting device configured to emit light of the second wavelength range, and wherein the first wavelength range is different from the second wavelength range.

2. The method for manufacturing a display apparatus according to claim 1, wherein the active layer comprises a first organic compound, and wherein the first organic compound, the first light-emitting material and the second light-emitting material are different from each other.

3. The method for manufacturing a display apparatus according to claim 1, wherein the second wavelength range is included in a visible wavelength range.

4. The method for manufacturing a display apparatus according to claim 1, wherein the second wavelength range is included in an infrared wavelength range.

5. The method for manufacturing a display apparatus according to claim 1, further comprising:

a step of forming a layer covering a top surface and a side surface of the light-emitting and light-receiving layer and a top surface and a side surface of the EL layer between the eighth step and the ninth step, wherein the layer comprises a substance with an electron-injection property.

6. The method for manufacturing a display apparatus according to claim 1, comprising:

a step of forming a layer covering a top surface and a side surface of the light-emitting and light-receiving layer and a top surface and a side surface of the EL layer between the eighth step and the ninth step, wherein the layer has a stacked-layer structure of a first layer and a second layer over the first layer, wherein the first layer comprises a substance with an electron-transport property, and wherein the second layer comprises a substance with an electron-injection property.

7. The method for manufacturing a display apparatus according to claim 1, comprising:

a step of forming a layer covering a top surface and a side surface of the light-emitting and light-receiving layer and a top surface and a side surface of the EL layer between the eighth step and the ninth step, wherein the layer comprises a substance with a hole-injection property.

8. The method for manufacturing a display apparatus according to claim 1, further comprising:

a step of forming a layer covering a top surface and a side surface of the light-emitting and light-receiving layer and a top surface and a side surface of the EL layer between the eighth step and the ninth step, wherein the layer has a stacked-layer structure of a first layer and a second layer over the first layer, wherein the first layer comprises a substance with a hole-transport property, and wherein the second layer comprises a substance with a hole-injection property.

9. The method for manufacturing a display apparatus according to claim 1, wherein the first sacrificial film comprises one or more of a metal film, an alloy film, a metal oxide film, a semiconductor film and an inorganic insulating film, and wherein in the fourth step, dry etching using an etching gas containing no oxygen gas is used for etching the light-emitting and light-receiving film.

10. The method for manufacturing a display apparatus according to claim 9, wherein the etching gas containing no oxygen gas is one or more selected from $CF_4$, $C_4F_8$, $SF_6$, $CHF_3$, $Cl_2$, $H_2O$, $BCl_3$, $H_2$ and a noble gas.

* * * * *